(12) United States Patent
Iijima et al.

(10) Patent No.: US 12,247,044 B2
(45) Date of Patent: Mar. 11, 2025

(54) COMPOSITION, PHOTOELECTRIC CONVERSION ELEMENT, AND IMAGING DEVICE

(71) Applicant: Panasonic Intellectual Property Management Co., Ltd., Osaka (JP)

(72) Inventors: Hiroaki Iijima, Nara (JP); Masaya Hirade, Osaka (JP); Yuko Kishimoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 617 days.

(21) Appl. No.: 17/216,763

(22) Filed: Mar. 30, 2021

(65) Prior Publication Data

US 2021/0238203 A1    Aug. 5, 2021

Related U.S. Application Data

(63) Continuation of application No. PCT/JP2019/039467, filed on Oct. 7, 2019.

(30) Foreign Application Priority Data

Nov. 16, 2018 (JP) ................ 2018-215957
Sep. 11, 2019 (JP) ................ 2019-165589

(51) Int. Cl.
     *H10K 30/30*      (2023.01)
     *C07F 7/02*      (2006.01)
     *H10K 85/30*      (2023.01)

(52) U.S. Cl.
     CPC ............ *C07F 7/025* (2013.01); *H10K 30/30* (2023.02); *H10K 85/311* (2023.02)

(58) Field of Classification Search
     USPC .................................. 136/243–265
     See application file for complete search history.

(56) References Cited

U.S. PATENT DOCUMENTS

2007/0228340 A1* 10/2007 Hayes ............... B32B 17/10651
                                                         430/596
2009/0054641 A1    2/2009   Kitamura et al.
(Continued)

FOREIGN PATENT DOCUMENTS

JP      2003-234460      8/2003
JP      2004-231832      8/2004
(Continued)

OTHER PUBLICATIONS

JP2016160270 English translation (Year: 2016).*
(Continued)

*Primary Examiner* — Bach T Dinh
(74) *Attorney, Agent, or Firm* — Rimon P.C.

(57) ABSTRACT

A composition contains a naphthalocyanine derivative represented by the following formula:

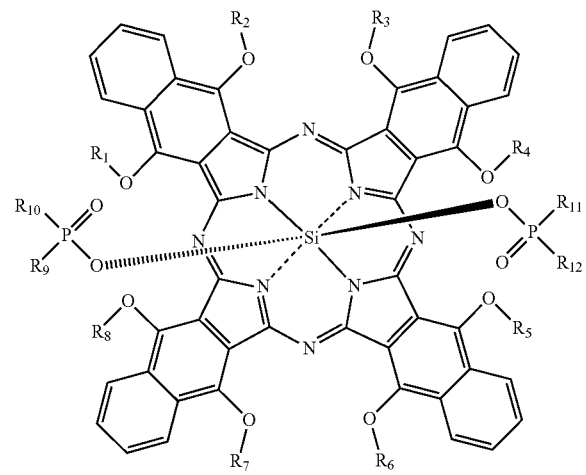

(1)

where $R_1$ to $R_8$ are independently an alkyl group and $R_9$ to $R_{12}$ are independently an aryl group, and at least one (Continued)

hydrogen atom in at least one selected from the group consisting of $R_9$, $R_{10}$, $R_{11}$, and $R_{12}$ is substituted by an electron-withdrawing group.

16 Claims, 16 Drawing Sheets

(56) References Cited

U.S. PATENT DOCUMENTS

| | | | | |
|---|---|---|---|---|
| 2009/0188547 | A1* | 7/2009 | Hayashi | B82Y 10/00 |
| | | | | 977/735 |
| 2012/0204960 | A1 | 8/2012 | Kato et al. | |
| 2017/0214875 | A1* | 7/2017 | Miyake | H04N 25/76 |
| 2018/0294316 | A1* | 10/2018 | Tokuhara | H10K 85/311 |

FOREIGN PATENT DOCUMENTS

| | | |
|---|---|---|
| JP | 2009-054606 | 3/2009 |
| JP | 2010-232410 | 10/2010 |
| JP | 2011-119694 | 6/2011 |
| JP | 2016-160270 | 9/2016 |
| JP | 2016-225456 | 12/2016 |

OTHER PUBLICATIONS

International Search Report of PCT application No. PCT/JP2019/039467 dated Nov. 26, 2019.

Jana Zaumseil et al., "Electron and Ambipolar Transport in Organic Field-Effect Transistors", Chemical Reviews, American Chemical Society, vol. 107, No. 4 (2007), Mar. 23, 2007, pp. 1296-1323.

Serap Gunes et al., "Conjugated Polymer-Based Organic Solar Cells", Chemical Reviews, American Chemical Society, vol. 107, No. 4 (2007), Apr. 11, 2007, pp. 1324-1338.

Mohamed Aoudia et al., "Synthesis of a Series of Octabutoxy- and Octabutoxybenzophthalocyanines and Photophysical Properties of Two Members of the Series", J. Am. Chem. Soc., vol. 119, No. 26, Jul. 2, 1997, pp. 6029-6039.

Sung-Lin Wu et al., "Design and characterization of porphyrin sensitizers with a push-pull framework for highly efficient dye-sensitized solar cells", Energy & Environmental Science, vol. 3, No. 7, Jun. 14, 2010, pp. 949-955.

Tirohusa Shirai et al., "Phthalocyanines—Chemistry and Function—", IPC (1997), Feb. 28, 1997, pp. 1-62 (Partial Translation).

* cited by examiner

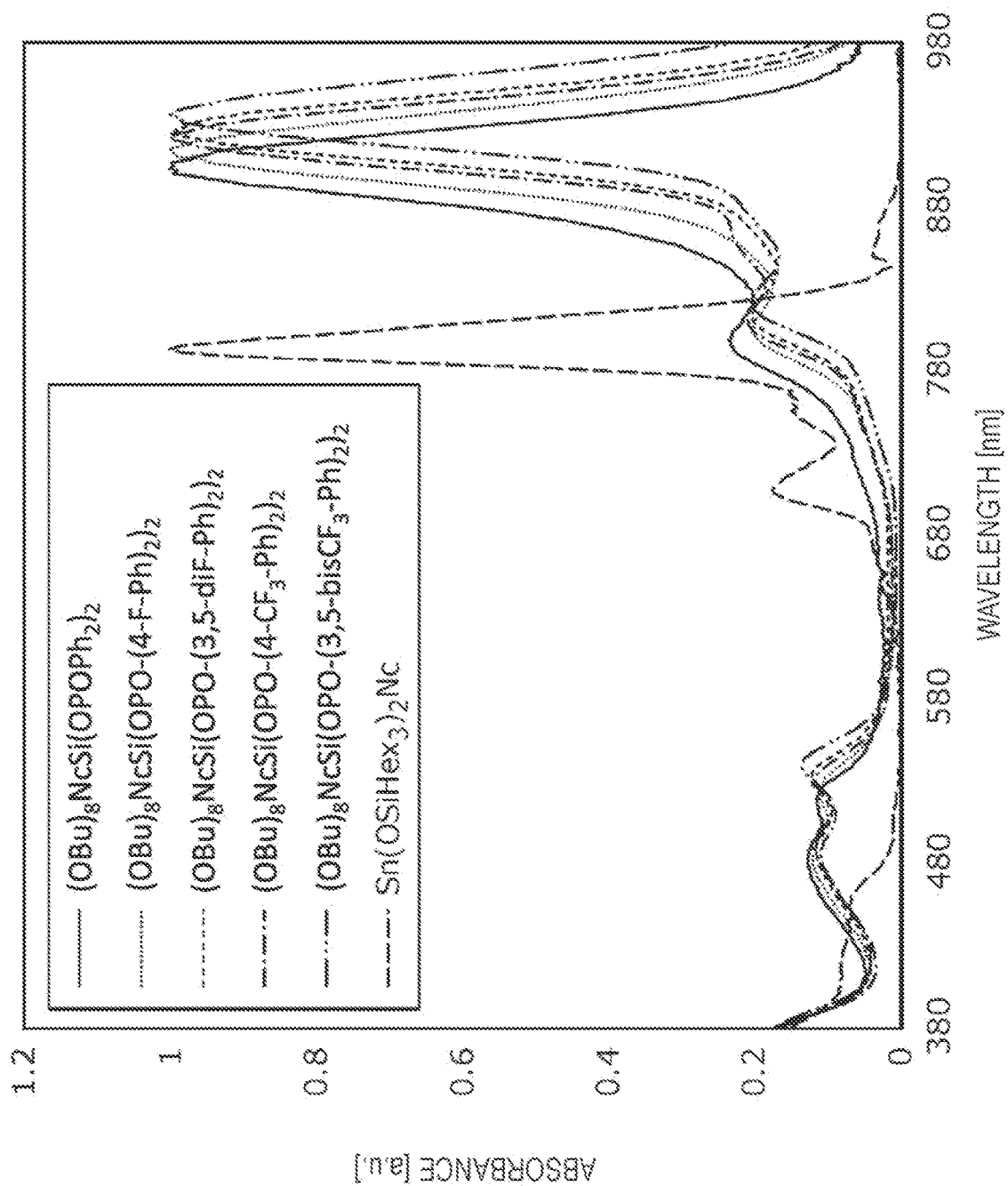

COMPOSITION, PHOTOELECTRIC CONVERSION ELEMENT, AND IMAGING DEVICE

BACKGROUND

1. Technical Field

The present disclosure relates to a composition containing a naphthalocyanine derivative, a photoelectric conversion element, and an imaging device.

2. Description of the Related Art

Organic semiconductor materials have properties, functions, and the like not shared by any inorganic semiconductor materials in the related art such as silicon. Therefore, in recent years, the organic semiconductor materials have been actively investigated as semiconductor materials capable of yielding novel semiconductor devices and electronic devices as described in Jana Zaumseil et al., "Electron and Ambipolar Transport in Organic Field-Effect Transistors", Chemical Reviews, American Chemical Society, 2007, vol. 107, no. 4, pp. 1296-1323 (Non-Patent Document 1) and Japanese Unexamined Patent Application Publication No. 2010-232410.

It has been investigated that, for example, a photoelectric conversion element is achieved in such a manner that an organic semiconductor material is formed into a thin film and is used as a photoelectric conversion material. A photoelectric conversion element including an organic thin film extracts charges which are carriers generated by light in the form of energy and therefore can be used as an organic thin film solar cell as described in Serap Gunes, et al., "Conjugated Polymer-Based Organic Solar Cells", Chemical Reviews, American Chemical Society, 2007, vol. 107, no. 4, pp. 1324-1338 (Non-Patent Document 2). Alternatively, the photoelectric conversion element extracts charges generated by light in the form of electrical signals and therefore can be used as a photosensor such as a solid-state imaging device as described in Japanese Unexamined Patent Application Publication No. 2003-234460.

Phthalocyanine and naphthalocyanine derivatives are known as organic semiconductor materials having sensitivity in the near-infrared region. For example, Japanese Patent No. 5216279 discloses a naphthalocyanine derivative with an absorption maximum wavelength of 808 nm to 825 nm. Furthermore, Japanese Unexamined Patent Application Publication No. 2016-160270 discloses a near-infrared absorbing composition containing a naphthalocyanine derivative and further containing a polymerizable monomer and/or a polymerizable binder resin.

SUMMARY

In one general aspect, the techniques disclosed here feature a composition containing a naphthalocyanine derivative represented by the following formula;

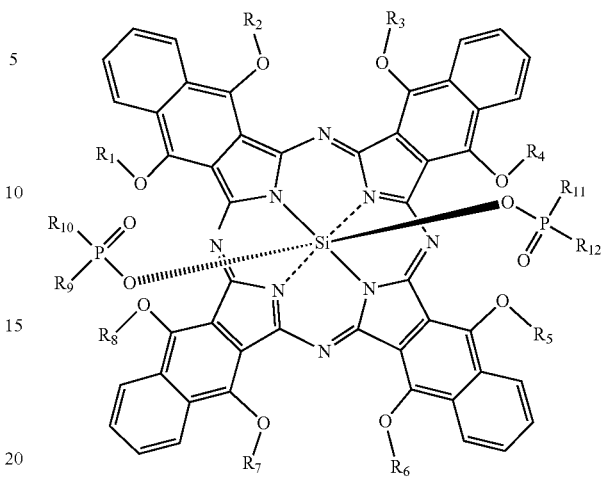

(1)

where $R_1$ to $R_8$ are independently an alkyl group and $R_9$ to $R_{12}$ are independently an aryl group, and at least one hydrogen atom in at least one selected from the group consisting of $R_9$, $R_{10}$, $R_{11}$, and $R_{12}$ is substituted by an electron-withdrawing group.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 6 is a graph illustrating the absorption spectrum of a naphthalocyanine derivative obtained in each of Examples 1 to 5 and Comparative Example 1;

DETAILED DESCRIPTION

Figure 1:
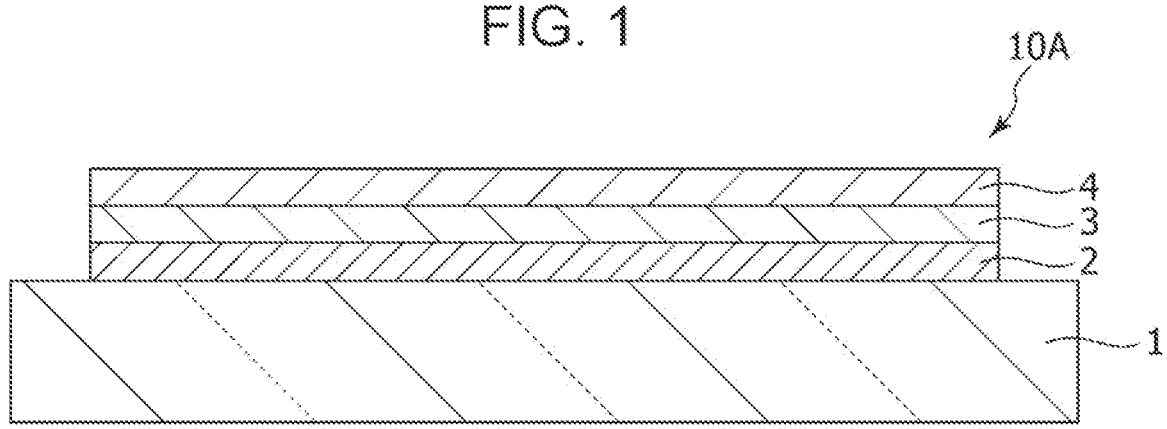
FIG. 1 is a schematic sectional view of an example of a near-infrared photoelectric conversion element according to an embodiment of the present disclosure.

Underlying Knowledge Forming Basis of the Present Disclosure

In organic semiconductor materials, changing the molecular structure of an organic compound used enables the energy level thereof to be changed. Therefore, in a case where, for example, an organic semiconductor material is used as a photoelectric conversion material, the absorption wavelength can be controlled and sensitivity can be held in the near-infrared region, in which Si has no sensitivity. That is, using organic semiconductor materials enables light in a wavelength region hitherto unused for photoelectric conversion to be utilized, thereby enabling the efficiency of solar cells to be increased and photosensors with sensitivity in the near-infrared region to be achieved. Therefore, in recent years, photoelectric conversion elements and imaging elements containing an organic semiconductor material with sensitivity in the near-infrared region have been actively investigated.

In recent years, imaging elements with sensitivity in the near-infrared region have been investigated. Phthalocyanine and naphthalocyanine derivatives have a large π-conjugated system and an absorption maximum wavelength that is strong absorption, due to π-π* absorption, in the near-infrared region and are therefore promising candidates for materials for use in the imaging elements. However, phthalocyanine derivatives and naphthalocyanine derivatives in the related art have an absorption maximum wavelength of at most about 850 nm. Therefore, in order to obtain near-infrared photoelectric conversion elements and the like exhibiting high photoelectric conversion efficiency, molecular structures ensuring both a further increase in absorption maximum wavelength and imaging element characteristics are required.

The inventors have found that the response wavelength of an organic material photoelectric conversion film can be controlled by controlling the electronic state of a naphthalocyanine ring.

The present disclosure provides a composition which has high light absorption characteristics in the near-infrared region and which exhibits high photoelectric conversion efficiency when the composition is contained in photoelectric conversion elements, a photoelectric conversion element, and an imaging device.

The outline of an aspect of the present disclosure is as described below.

A composition according to an aspect of the present disclosure contains a naphthalocyanine derivative represented by the following formula:

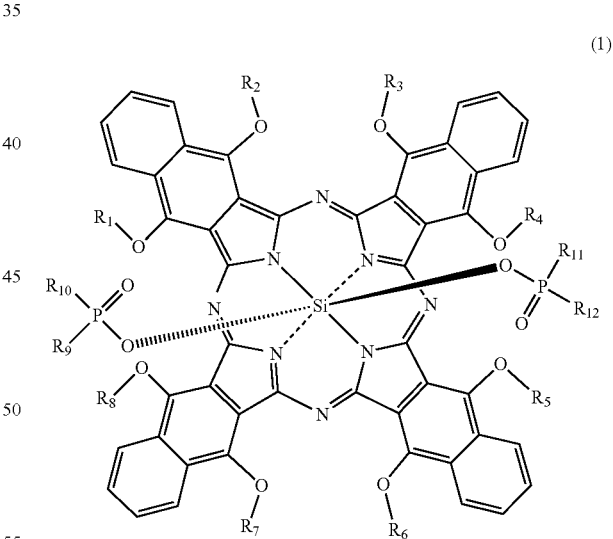

(1)

where $R_1$ to $R_8$ are independently an alkyl group and $R_9$ to $R_{12}$ are independently an aryl group.

As described above, the composition is such that the naphthalocyanine derivative, which is represented by Formula (1), has alkoxy groups that are electron-donating α-side chains and also has axial ligands containing phosphinate derivatives independently having aryl groups as $R_9$ to $R_{12}$. Therefore, the naphthalocyanine derivative has an absorption peak at greater than or equal to 900 nm because the energy gap (Eg) that is the difference between the energy level of the highest occupied molecular orbital (HOMO) and the energy level of the lowest unoccupied molecular orbital (LUMO) is narrow and the absorption wavelength in the near-infrared region is long.

This allows the composition to have high light absorption characteristics in the near-infrared region because the composition contains the naphthalocyanine derivative, which is represented by Formula (1). Therefore, using the composition enables photoelectric conversion elements and imaging devices exhibiting high light absorption efficiency in a wide range of the near-infrared region to be obtained. Furthermore, the composition is such that a central metal in the naphthalocyanine derivative is silicon (Si). Therefore, a material containing Si, which has lower toxicity as compared to tin (Sn) and the like, which are likely to increase the absorption wavelength, can be used in photoelectric conversion elements and the like.

In the composition, $R_1$ to $R_8$ in Formula (1) may be independently, for example, an alkyl group containing four or less carbon atoms.

This allows, in the composition, the naphthalocyanine derivative to be readily purified and therefore to be readily synthesized.

In the composition, for example, at least one hydrogen atom in at least one selected from the group consisting of $R_9$, $R_{10}$, $R_{11}$, and $R_{12}$ in Formula (1) may be substituted by an electron-withdrawing group.

This increases, in the composition, the electron-withdrawing ability of an axial ligand that the naphthalocyanine derivative, which is represented by Formula (1), has; reduces the electron density of a naphthalocyanine ring; and allows both the HOMO energy level and the LUMO energy level to be deeper. The LUMO energy level is deeper than the HOMO energy level and therefore the energy gap (Eg) is narrower. Thus, the composition has high light absorption characteristics in the near-infrared region because the energy gap (Eg) is narrower and an absorption peak in the near-infrared region shifts to a longer wavelength. Furthermore, in the composition, the HOMO energy level is deep and the ionization potential is low, that is, the value of the ionization potential that is the difference between the vacuum level and the HOMO energy level is large. This enables the composition to suppress the dark current when the composition is contained in photoelectric conversion elements and the like. Therefore, using the composition enables photoelectric conversion elements and imaging devices exhibiting high photoelectric conversion efficiency to be obtained.

In the composition, for example, at least one hydrogen atom in at least one selected from the group consisting of $R_9$, $R_{10}$, $R_{11}$, and $R_{12}$ in Formula (1) may be substituted by a fluorine atom, a fluorine-containing group, or a cyano group.

This allows, in the composition, an axial ligand that the naphthalocyanine derivative, which is represented by Formula (1), has to be substituted by a fluorine atom, fluorine-containing group, or cyano group which is highly electron-withdrawing. Therefore, the electron-withdrawing ability of the axial ligand is increased. Thus, the composition can suppress the dark current when the composition is contained in photoelectric conversion elements and the like.

In the composition, $R_9$ to $R_{12}$ in Formula (1) may be independently, for example, a phenyl group and at least one hydrogen atom in at least one selected from the group consisting of $R_9$, $R_{10}$, $R_{11}$, and $R_{12}$ in Formula (1) may be substituted by a fluorine atom, a trifluoromethyl group, or a cyano group.

This allows, in the composition, the introduction of an axial ligand to be easy and enables the naphthalocyanine derivative, which is represented by Formula (1), to be readily synthesized.

In the composition, $R_9$ to $R_{12}$ in Formula (1) may be independently, for example, a phenyl group or a phenyl group in which at least one hydrogen atom is substituted by a fluorine atom, a fluorine-containing group, or a cyano group.

This allows, in the composition, the introduction of an axial ligand to be easy and enables the naphthalocyanine derivative, which is represented by Formula (1), to be readily synthesized.

In the composition, the naphthalocyanine derivative may be, for example, any one of compounds represented by the following formulas:

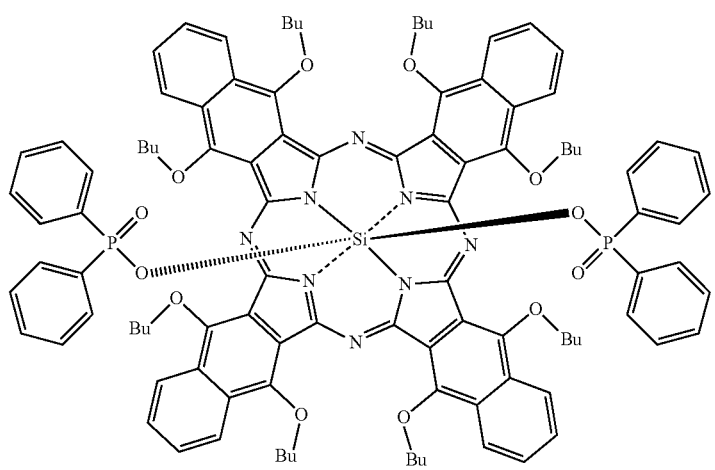

(2)

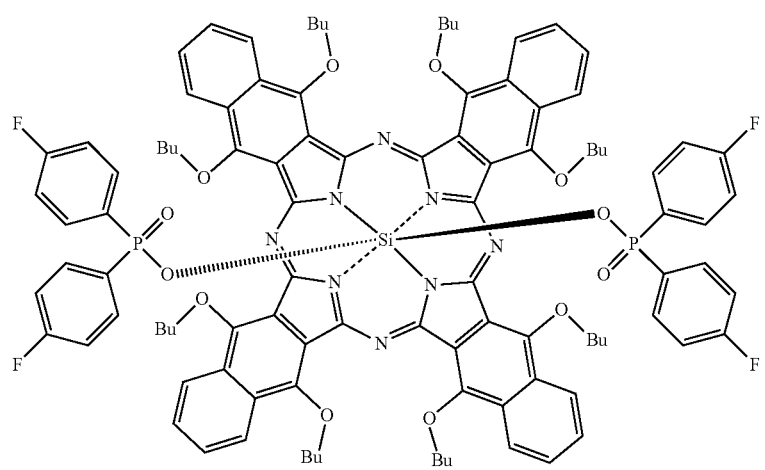
(3)
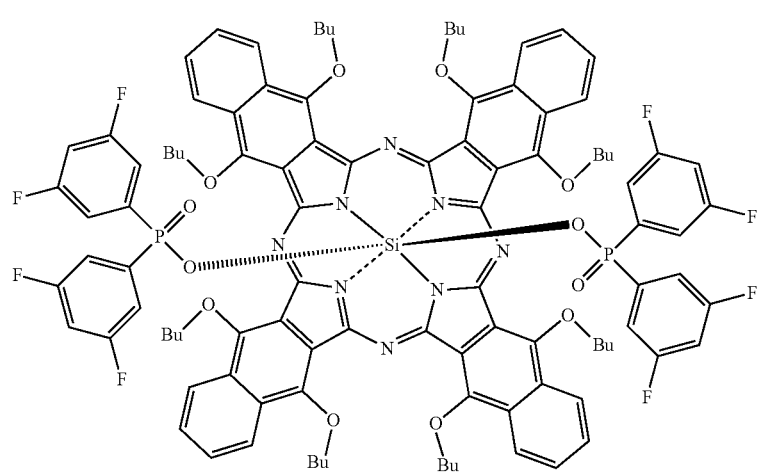
(4)
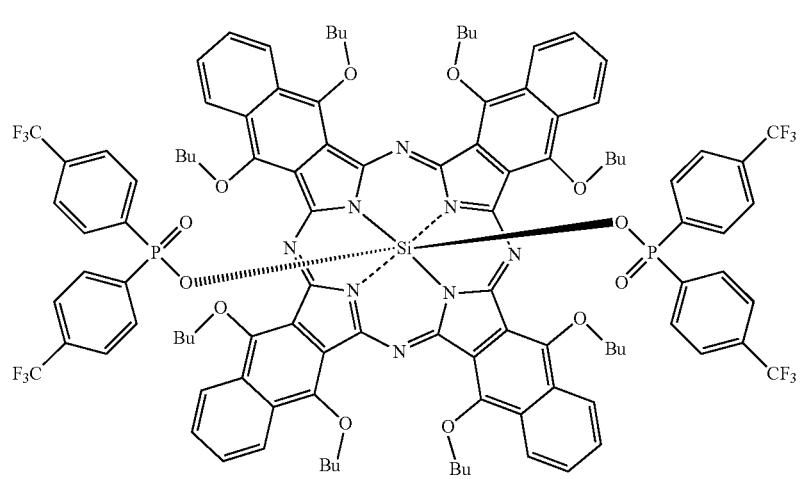
(5)

-continued (6)

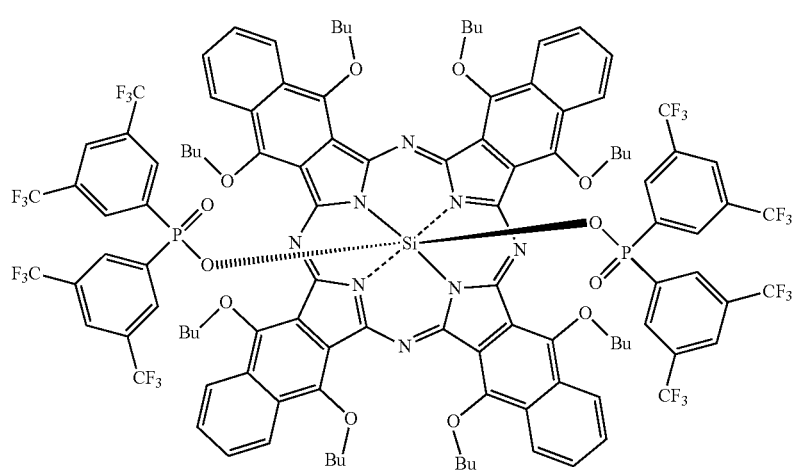

(7)

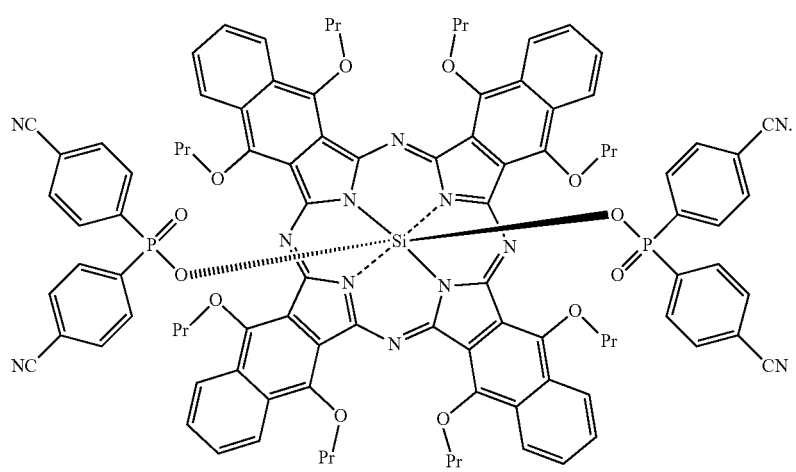

This enables, in the composition, an axial ligand that can be readily prepared to be used and allows synthesis to be relatively easy.

A photoelectric conversion element according to an aspect of the present disclosure includes a first electrode, a second electrode, and a photoelectric conversion film which is placed between the first electrode and the second electrode and which contains the composition.

This allows the photoelectric conversion film to have high light absorption characteristics in the near-infrared region because the photoelectric conversion element contains the composition. Therefore, the photoelectric conversion element can exhibit high photoelectric conversion efficiency in a wide range of the near-infrared region.

In the photoelectric conversion element, the concentration of the composition in the photoelectric conversion film may be, for example, greater than or equal to 5% by weight and less than or equal to 50% by weight.

This allows the photoelectric conversion element to have high sensitivity in the near-infrared region.

In the photoelectric conversion element, the absorption maximum wavelength in the absorption spectrum of the photoelectric conversion film may be, for example, longer than or equal to 908 nm.

This allows the photoelectric conversion element to have high light absorption characteristics over a wide range of the near-infrared region.

An imaging device according to an aspect of the present disclosure includes a substrate and a pixel including a charge detection circuit attached to the substrate, a photoelectric converter placed above the substrate, and a charge storage node electrically connected to the charge detection circuit and the photoelectric converter. The photoelectric converter includes the photoelectric conversion element.

This allows the imaging device to have high light absorption characteristics in the near-infrared region and enables the imaging device to exhibit high photoelectric conversion efficiency in a wide range of the near-infrared region because the photoelectric converter in the pixel includes the photoelectric conversion element.

Embodiments of the present disclosure are described below in detail with reference to the accompanying drawings.

Each of the embodiments below illustrates a general or specific example. Numerical values, shapes, materials, components, the positions of the components, modes to connect the components, steps, the order of the steps, and the like described in the embodiments below are examples and are not intended to limit the present disclosure. Among components in the embodiments below, components not described in independent claims indicating the highest concepts are described as arbitrary components. The drawings are not necessarily strict illustrations. In the drawings, substantially the same components are given the same reference numerals and will not be redundantly described or will be briefly described.

EMBODIMENTS

A composition according to an embodiment of the present disclosure, a near-infrared photoelectric conversion element according to an embodiment of the present disclosure, and an imaging device according to an embodiment of the present disclosure are described below. In the specification, the near-infrared photoelectric conversion element is an example of a photoelectric conversion element.

Composition

First, the composition is described below. The composition contains a naphthalocyanine derivative represented by the following formula:

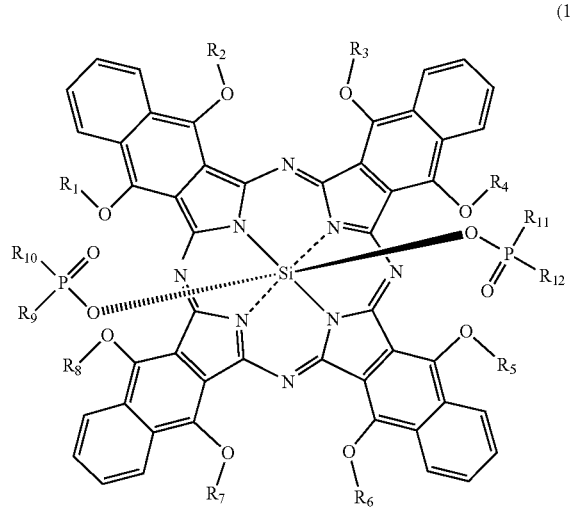

(1)

In the naphthalocyanine derivative, which is represented by Formula (1), $R_1$ to $R_8$ are independently an alkyl group and $R_9$ to $R_{12}$ are independently an aryl group.

Since the composition contains the naphthalocyanine derivative, which is represented by Formula (1), the composition can have high light absorption characteristics in the near-infrared region.

The naphthalocyanine derivative, which is represented by Formula (1), has an axial ligand-type structure having silicon (Si) as a central metal and two axial ligands above and below the molecular plane. This reduces the interaction between molecules; hence, film formation by vapor deposition is easy. Furthermore, a material containing Si, which has lower toxicity as compared to metals such as Sn can be used in photoelectric conversion elements and the like.

The naphthalocyanine derivative, which is represented by Formula (1), has alkoxy groups that are electron-donating α-side chains and also has axial ligands containing phosphinate derivatives independently having aryl groups as $R_9$ to $R_{12}$. Therefore, the absorption wavelength in the near-infrared region is long and the naphthalocyanine derivative has an absorption peak at greater than or equal to 900 nm.

This allows the composition to have high light absorption characteristics in the near-infrared region because the composition contains the naphthalocyanine derivative, which is represented by Formula (1). Therefore, using the composition enables photoelectric conversion elements and imaging devices which exhibit high light absorption efficiency in a wide range of the near-infrared region to be obtained.

In Formula (1), $R_1$ to $R_8$ are independently an alkyl group from the viewpoint of photoelectric conversion efficiency and may be the same alkyl groups or different alkyl groups. The alkyl groups include linear or branched alkyl groups. In particular, in Formula (1), $R_1$ to $R_8$ may be independently an alkyl group containing four or less carbon atoms. Examples of the alkyl group containing four or less carbon atoms include a methyl group, an ethyl group, a propyl group, and a butyl group.

Since the naphthalocyanine derivative, which is represented by Formula (1), has the alkoxy groups, which are electron-donating α-side chains, the composition has an absorption wavelength peak at greater than or equal to 908 nm in the near-infrared region. That is, the naphthalocyanine derivative has an absorption wavelength peak at a longer wavelength as compared to naphthalocyanine derivatives having no alkoxy groups that are electron-donating α-side chains and can have high light absorption characteristics over a wide range of the near-infrared region.

Furthermore, in the composition, when the naphthalocyanine derivative, which is represented by Formula (1), has alkyl groups containing four or less carbon atoms at $R_1$ to $R_8$, the naphthalocyanine derivative is readily purified and therefore is readily synthesized.

The inventors have confirmed that a naphthalocyanine compound which has a structure similar to that of a starting material used in Example 1 in the present disclosure and which has an α-side chain containing two carbon atoms can be synthesized. Details are described in Japanese Patent Application No. 2017-090808 (Japanese Unexamined Patent Application Publication No. 2018-188617), which has been filed by the applicant. From this finding, it is conceivable that even if $R_1$ to $R_8$ in Formula (1) are alkyl groups containing two or less carbon atoms, the naphthalocyanine derivative can be similarly synthesized.

In Formula (1), $R_9$ to $R_{12}$ may be the same or different and are independently an aryl group.

The aryl group is, for example, an aromatic hydrocarbon group such as a phenyl group, a naphthyl group, a biphenyl group, a phenanthryl group, an anthryl group, a terphenyl group, a pyrenyl group, a fluorenyl group, or a perylenyl group or a heteroaryl group and may be unsubstituted or substituted.

The aryl group may further have a substituent. That is, a hydrogen atom of the aryl group may be substituted by the substituent. Examples of the substituent include an alkyl group, an alkoxy group, a halogen atom, a hydroxy group, a cyano group, an amino group, a thiol group, a silyl group, an ester group, an aryl group, a heteroaryl group, and other known substituents. Examples of a halogen-substituted aryl group include a fluorophenyl group, a difluorophenyl group, a perfluoroalkyl group, and a fluoronaphthyl group. Examples of a hydroxy-substituted aryl group include a hydroxyphenyl group, a dihydroxyphenyl group, and a hydroxynaphthyl group. Examples of a cyano-substituted aryl group include a cyanophenyl group, a dicyanophenyl group, a cyanonaphthyl group, and a cyanothienyl group. Examples of an amino-substituted aryl group include secondary and tertiary amino groups such as a dimethylaminophenyl group, a diphenylaminophenyl group, a methylphenylaminophenyl group, a methylaminophenyl group, an ethylaminophenyl group, a dimethylaminonaphthyl group, and a diphenylaminonaphthyl group. Examples of a thiol-substituted aryl group include an ethylthiophenyl group and an ethylthionaphthyl group. Examples of a silyl-substituted aryl group include a trimethylsilylphenyl group, a triethylsilylphenyl group, a tripropylsilylphenyl group, a triisopropylsilylphenyl group, a dimethylisopropylsilylphenyl group, and a dimethyl-tert-butylsilylnaphthyl group. Examples of an ester-substituted aryl group include a methoxycarbonylphenyl group, an ethoxycarbonylphenyl group, a propoxycarbonylphenyl group, an isopropoxycarbonylphenyl group, a tert-butoxycarbonylphenyl group, a phenoxycarbonylphenyl group, an acetyloxyphenyl group, and a benzoyloxyphenyl group.

In Formula (1), $R_9$ to $R_{12}$ may be substituted or unsubstituted phenyl groups from the viewpoint of the easiness of synthesis.

In the composition, at least one hydrogen atom in at least one selected from the group consisting of $R_9$, $R_{10}$, $R_{11}$ and $R_{12}$ in Formula (1) may be substituted by an electron-withdrawing group. That is, at least one selected from the group consisting of $R_9$, $R_{10}$, $R_{11}$, and $R_{12}$ in Formula (1) may be an aryl group obtained by substituting an electron-withdrawing group for at least one hydrogen atom of an unsubstituted aryl group. A plurality of hydrogen atoms of the aryl group may be substituted by the same electron-withdrawing groups or different electron-withdrawing groups.

Electron-withdrawing groups are substituents that have higher electron withdrawing ability as compared to a hydrogen atom as described by an inductive effect and a resonance effect. For a substituent by which a hydrogen atom of an aryl group is substituted, examples of an electron-withdrawing group include a nitro group, a cyano group, a fluoro group, a fluorine-containing group, a diazo group, a sulfonyl group, a carbonyl group, an isothiocyanate group, a thiocyanate group, a chloro group, a bromo group, and an iodo group. Among these, the electron-withdrawing group may be the nitro group, the cyano group, the fluoro group, the fluorine-containing group, or the diazo group, which has high electron withdrawing ability, from the viewpoint that the HOMO energy level of the naphthalocyanine derivative can be deepened.

Carbonyl groups are such that one of bonds of a carbon atom of each of the carbonyl groups is bonded to a corresponding one of the aryl groups that are $R_9$ to $R_{12}$. A substituent bonded to the other bond of the carbon atom of each carbonyl group is not particularly limited. Examples of the substituent bonded to the other bond of the carbon atom of the carbonyl group include a hydrogen atom, an alkyl group, an aryl group, an alkoxy group, an amino group, a hydroxy group, an alkenyl group, and a chloro group. Examples of carbonyl groups used as electron-withdrawing groups substituting hydrogen atoms of $R_9$ to $R_{12}$ include an ester group, an aldehyde group, a substituent having a ketone skeleton, an amido group, a carboxy group, a substituent having an enone skeleton, a substituent having an acid chloride skeleton, and a substituent having an acid anhydride skeleton.

In sulfonyl groups, one of bonds of a sulfur atom of each of the sulfonyl groups is bonded to a corresponding one of the aryl groups that are $R_9$ to $R_{12}$. A substituent bonded to the other bond of the sulfur atom of each sulfonyl group is not particularly limited. Examples of the substituent bonded to the other bond of the sulfur atom of the sulfonyl group include an alkyl group, an aryl group, an amino group, and a hydroxy group. Examples of sulfonyl groups used as electron-withdrawing groups substituting hydrogen atoms of $R_9$ to $R_{12}$ include a tosyl group, a mesyl group, and a sulfa group.

In the composition, substituting an electron-withdrawing group for a hydrogen atom of an aryl group or a phenyl group reduces the energy gap and increases the absorption maximum wavelength in the near-infrared region. This allows the composition to have high light absorption characteristics in the near-infrared region on the long wavelength side. Furthermore, in the composition, substituting an electron-withdrawing group for a hydrogen atom of an aryl group or a phenyl group deepens the HOMO energy level. This enables the composition to suppress the dark current when the composition is contained in near-infrared photoelectric conversion elements and the like.

In the composition, at least one hydrogen atom in at least one selected from the group consisting of $R_9$, $R_{10}$, $R_{11}$, and $R_{12}$ in Formula (1) may be substituted by a fluorine atom, that is, a fluoro group, a fluorine-containing group, or a cyano group. That is, at least one selected from the group consisting of $R_9$, $R_{10}$, $R_{11}$, and $R_{12}$ in Formula (1) may be an aryl group obtained by substituting a fluoro group, a fluorine-containing group, or a cyano group for at least one hydrogen atom of an unsubstituted aryl group. A plurality of hydrogen atoms of the aryl group may be substituted by the same substituents or different substituents.

In Formula (1), $R_9$ to $R_{12}$ may be independently a phenyl group and at least one hydrogen atom in at least one selected from the group consisting of $R_9$, $R_{10}$, $R_{11}$, and $R_{12}$ may be substituted by a fluorine atom, a trifluoromethyl group, or a cyano group. That is, in Formula (1), $R_9$ to $R_{12}$ may be independently a phenyl group and at least one selected from the group consisting of $R_9$, $R_{10}$, $R_{11}$, and $R_{12}$ may be a phenyl group obtained by substituting a fluorine atom, a trifluoromethyl group, or a cyano group for at least one hydrogen atom of an unsubstituted phenyl group. A plurality of hydrogen atoms of the phenyl group may be substituted by the same substituents or different substituents.

The fluorine-containing group is, for example, an alkyl group, aryl group, or alkenyl group in which at least one hydrogen atom is substituted by a fluorine atom. Examples of the alkyl group and the aryl group are as described above. Specific examples of the fluorine-containing group include a fluoromethyl group, a difluoromethyl group, a trifluoromethyl group, a fluoroethyl group, a difluoroethyl group, a trifluoroethyl group, a tetrafluoroethyl group, a pentafluoroethyl group, a fluorophenyl group, a difluorophenyl group, a trifluorophenyl group, a trifluoromethylphenyl group, a tetrafluorophenyl group, and a pentafluorophenyl group.

Examples of an aryl group in which at least one hydrogen atom is substituted by a fluorine atom or a fluorine-containing group include a 4-fluorophenyl group, a 3,5-difluorophenyl group, a pentafluorophenyl group, a 4-trifluoromethylphenyl group, and a 3,5-bis(trifluoromethyl)phenyl group.

Examples of an aryl group in which at least one hydrogen atom is substituted by a cyano group include a 4-cyanophenyl group, a 3,5-dicyanophenyl group, and an α-cyanothienyl group.

This allows the composition to have high light absorption characteristics in the near-infrared region because the energy gap is narrower and the absorption maximum wavelength in the near-infrared region is long and enables the composition to suppress the dark current when the composition is contained in photoelectric conversion elements and the like because the HOMO energy level is deep.

In the composition, $R_9$ to $R_{12}$ in Formula (1) may be independently a phenyl group or a phenyl group in which at least one hydrogen atom is substituted by a fluorine atom, a trifluoromethyl group, or a cyano group from the viewpoint of the ease of synthesis. In Formula (1), $R_9$ to $R_{12}$ may be the same unsubstituted phenyl groups, the same phenyl groups substituted by these substituents, different unsubstituted phenyl groups, or different phenyl groups substituted by these substituents.

The naphthalocyanine derivative, which is represented by Formula (1), is further described below in detail.

In this embodiment, in Formula (1), $R_1$ to $R_8$ may be butyl groups and $R_9$ to $R_{12}$ may be independently a substituted or unsubstituted phenyl group. When each of $R_9$ to $R_{12}$ is, for example, a phenyl group, the naphthalocyanine derivative, which is represented by Formula (1), is a compound represented by the following formula:

(2)

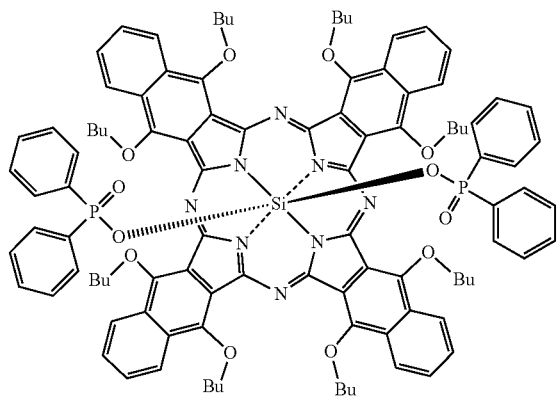

When each of $R_9$ to $R_{12}$ is, for example, a 4-fluorophenyl group, the naphthalocyanine derivative, which is represented by Formula (1), is a compound represented by the following formula:

(3)

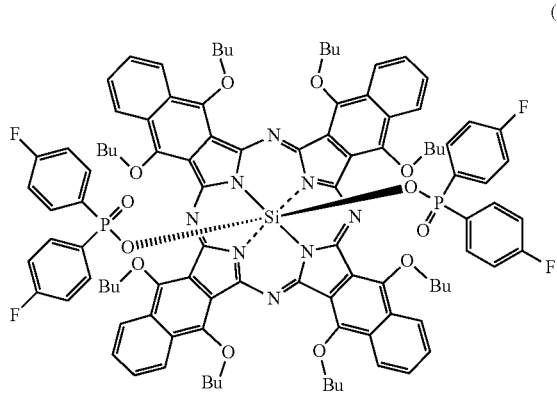

When each of $R_9$ to $R_{12}$ is, for example, a 3,5-difluorophenyl group, the naphthalocyanine derivative, which is represented by Formula (1), is a compound represented by the following formula:

(4)

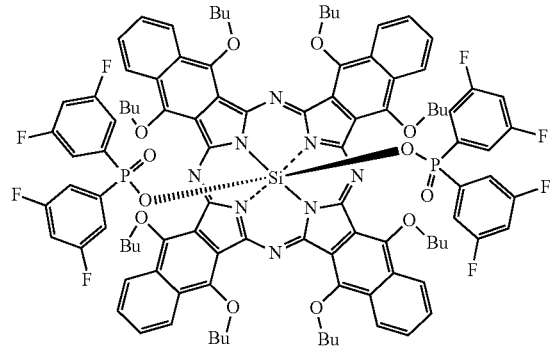

When each of $R_9$ to $R_{12}$ is, for example, a 4-trifluoromethylphenyl group, the naphthalocyanine derivative, which is represented by Formula (1), is a compound represented by the following formula:

(5)

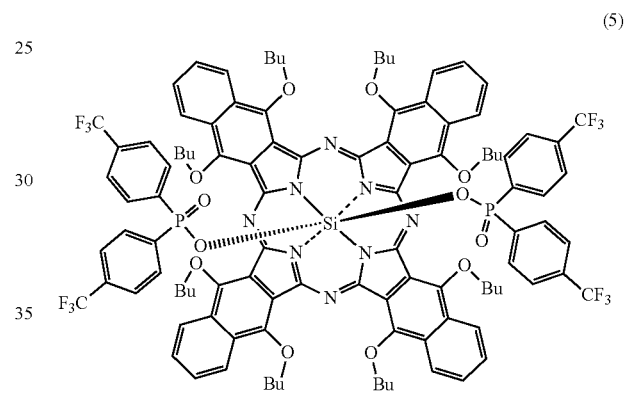

When each of $R_9$ to $R_{12}$ is, for example, a 3,5-bis(trifluoromethyl)phenyl group, the naphthalocyanine derivative, which is represented by Formula (1), is a compound represented by the following formula:

(6)

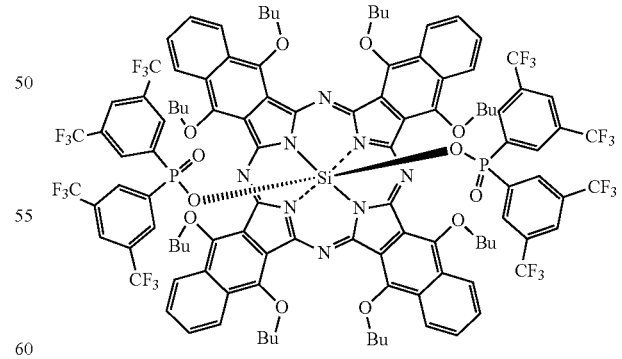

In this embodiment, in Formula (1), $R_1$ to $R_8$ may be propyl groups and $R_9$ to $R_{12}$ may be independently a substituted or unsubstituted phenyl group. When each of $R_9$ to $R_{12}$ is, for example, a 4-cyanophenyl group, the naphthalocyanine derivative, which is represented by Formula (1), is a compound represented by the following formula:

(7)

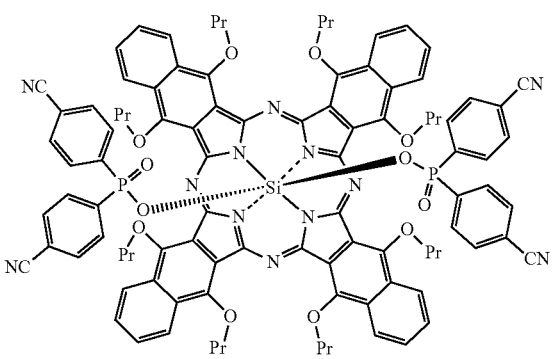

When the naphthalocyanine derivative, which is represented by Formula (1), is any one of the compounds represented by Formulas (2) to (7), the naphthalocyanine derivative is relatively readily synthesized because axial ligands that can be readily prepared can be used.

A method for synthesizing the naphthalocyanine derivative, which is represented by Formula (1), in this embodiment is described below.

A naphthalocyanine ring-forming reaction of the naphthalocyanine derivative, which is represented by Formula (1), can be carried out in accordance with Hirofusa Shirai and Nagao Kobayashi, "Phthalocyanine—Chemistry and Function", IPC, 1997, pp. 1-62 (Non-Patent Document 4).

Examples of a typical method for synthesizing the naphthalocyanine derivative include a Weiler method, phthalonitrile method, lithium method, subphthalocyanine method, and chlorinated phthalocyanine method described in Non-Patent Document 4. In this embodiment, any reaction conditions may be used in the naphthalocyanine ring-forming reaction. In the naphthalocyanine ring-forming reaction, Si, which serves as a central metal in naphthalocyanine, may be added. After a naphthalocyanine derivative having no central metal is synthesized, Si may be introduced. A reaction solvent used may be any solvent and is preferably a high-boiling point solvent. In order to promote the naphthalocyanine ring-forming reaction, acid or base may be used and, in particular, base is preferably used. The optimum reaction conditions vary depending on the structure of a target naphthalocyanine derivative and may be set with reference to detailed reaction conditions described in Non-Patent Document 4.

Raw materials used to synthesize the above naphthalocyanine derivative may be derivatives such as naphthalic anhydride, naphthalimide, naphthalic acid, salts of naphthalic acid, naphthalic diamide, naphthalonitrile, and 1,3-diiminobenzoisoindoline. These raw materials may be synthesized by any known methods.

In this embodiment, after a naphthalocyanine derivative having no central metal is synthesized, Si may be introduced at the center of a naphthalocyanine ring using a reagent containing $HSiCl_3$. A method for synthesizing a naphthalocyanine derivative having a central metal is usually as follows: when the central metal is Si, a reaction for forming a naphthalocyanine ring is carried out in such a manner that Si is introduced at the center thereof using an isoindoline precursor and tetrachlorosilicon. However, it is difficult to synthesize an isoindoline precursor having an alkoxy side chain. Therefore, it is effective to select a method in which after a naphthalocyanine derivative having no central metal is synthesized. Si is introduced at the center of a naphthalocyanine ring.

Near-Infrared Photoelectric Conversion Element

The near-infrared photoelectric conversion element is described below with reference to FIGS. 1 and 2. FIG. 1 is a schematic sectional view of a near-infrared photoelectric conversion element 10A that is an example of the near-infrared photoelectric conversion element.

The near-infrared photoelectric conversion element 10A includes a pair of electrodes, that is, an upper electrode 4 and a lower electrode 2 and also includes a near-infrared photoelectric conversion film 3 which is placed between the upper electrode 4 and the lower electrode 2 and which contains any above-mentioned compositions. In the specification, the upper electrode 4 is an example of a first electrode, the lower electrode 2 is an example of a second electrode, and the near-infrared photoelectric conversion film 3 is an example of a photoelectric conversion film.

The near-infrared photoelectric conversion element 10A is supported with, for example, a support substrate 1.

The support substrate 1 is transparent to near-infrared light and therefore light including near-infrared light enters the photoelectric conversion element 10A through the support substrate 1. The support substrate 1 may be a substrate for use in general photoelectric conversion elements and may be, for example, a glass substrate, a quartz substrate, a semiconductor substrate, a plastic substrate, or the like. The expression "transparent to near-infrared light" means that something is substantially transparent to near-infrared light and the transmittance of light in the near-infrared region may be greater than or equal to, for example, 60%. The transmittance of light in the near-infrared region may be greater than or equal to 80% or may be greater than or equal to 90%.

Components of the photoelectric conversion element 10A are described below.

The near-infrared photoelectric conversion film 3 is prepared using, for example, a composition containing a naphthalocyanine derivative represented by the following formula:

(1)

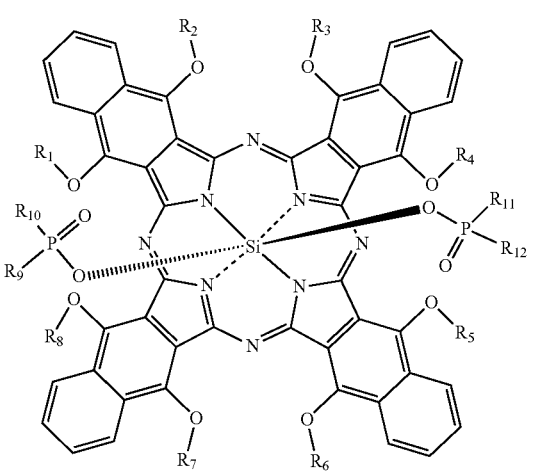

where $R_1$ to $R_8$ are independently an alkyl group and $R_9$ to $R_{12}$ are independently an aryl group.

In this embodiment, the naphthalocyanine derivative, which is represented by Formula (1), may be, for example, any one of compounds represented by the following formulas;

(2)
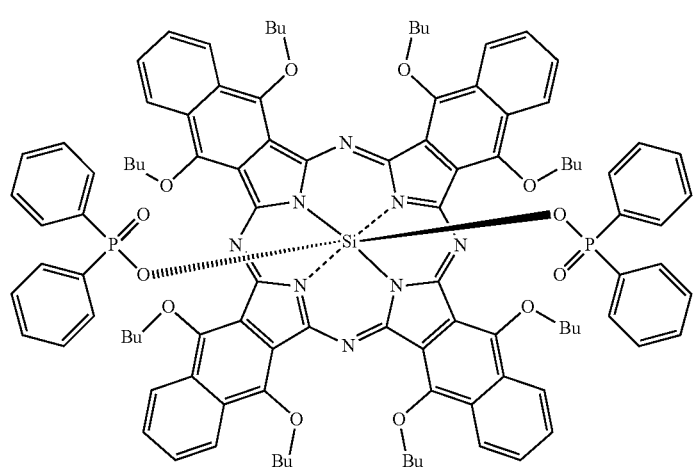
(3)
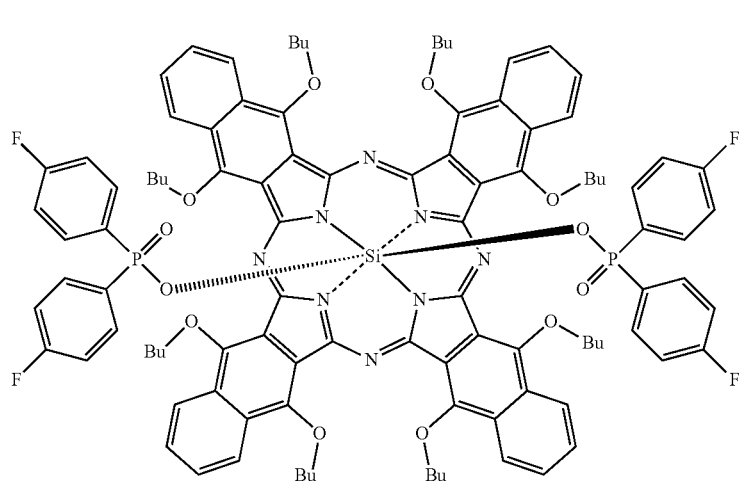
(4)
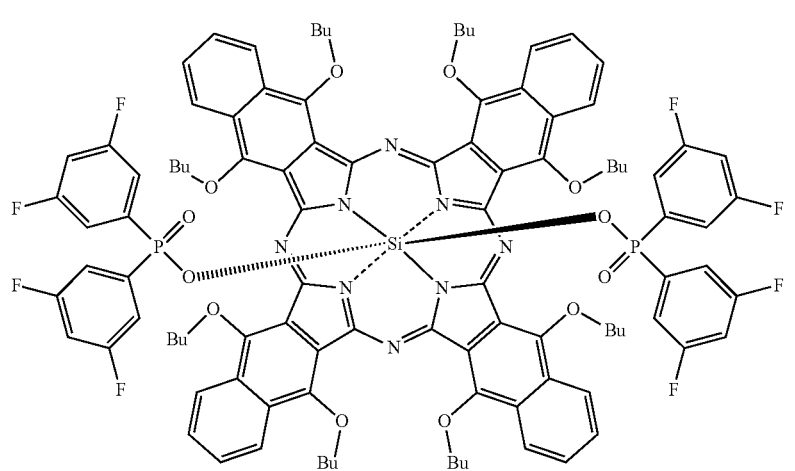

(5)

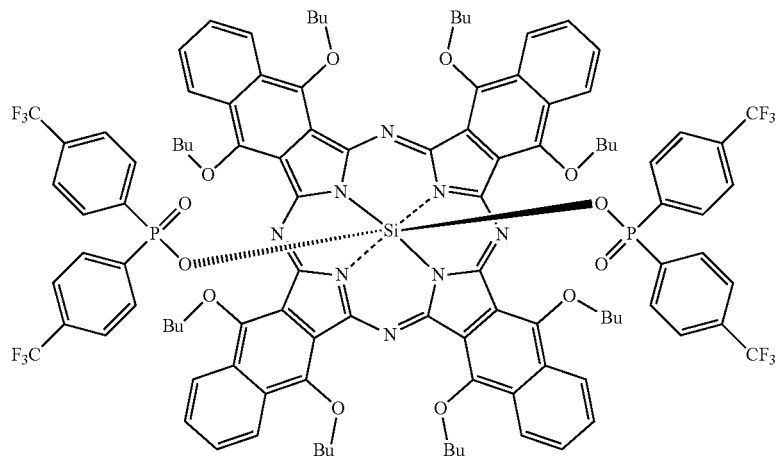

(6)

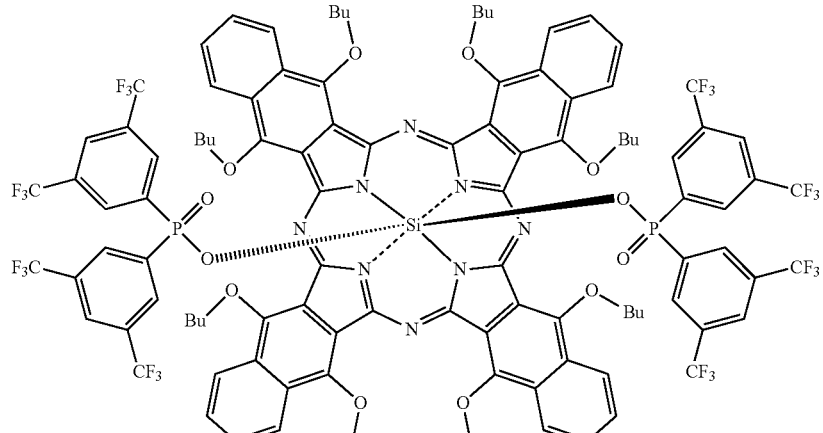

(7)

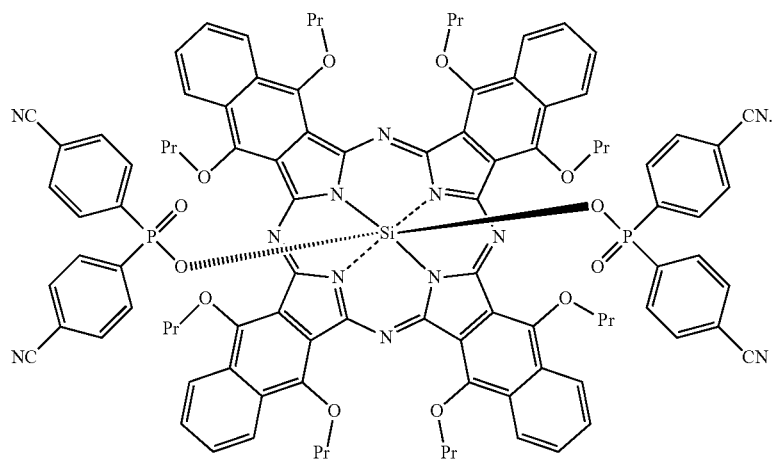

The following method can be used to prepare the photoelectric conversion film 3: for example, a coating method such as spin coating, a vacuum vapor deposition method in which a film material is evaporated by heating under vacuum and is deposited on a substrate, or the like. For spin coating, a film can be formed in air or an $N_2$ atmosphere and may be formed at a rotational speed of 300 rpm to 3,000 rpm. A solvent may be evaporated off after spin coating and baking may be performed for the purpose of stabilizing the film. The baking temperature may be any temperature and is, for example, 60° C. to 250° C.

In a case where preventing the contamination of impurities and forming multiple layers for increased functionality with a higher degree of freedom are taken into account, a vapor deposition method may be used. An evaporation system used may be a commercially available one. The temperature of an evaporation source during vapor deposition may be 100° C. to 500° C. or may be 150° C. to 400° C. The degree of vacuum during vapor deposition may be $1 \times 10^{-6}$ Pa to 1 Pa or may be $1 \times 10^{-6}$ Pa to $1 \times 10^{-4}$ Pa. Furthermore, the following method may be used: a method in which the rate of evaporation is increased by adding fine metal particles or the like to the evaporation source.

The blending ratio between materials for the photoelectric conversion film 3 is expressed on a weight basis in the coating method or on a volume basis in the vapor deposition method. In particular, in the coating method, the blending ratio is determined using the weight of each material used to prepare a solution. In the vapor deposition method, the blending ratio between the materials is determined in such a manner that the thickness of a layer of each deposited material is monitored with a thickness meter during vapor deposition.

For the blending ratio between the above materials, in, for example, the near-infrared photoelectric conversion element 10A and a near-infrared photoelectric conversion element 10B (described below with reference to FIG. 2), the concentration of the above composition in the near-infrared photoelectric conversion film 3 may be greater than or equal to 5% by weight to less than or equal to 50% by weight. This allows the near-infrared photoelectric conversion elements 10A and 10B to have increased sensitivity in the near-infrared region.

In this embodiment, the absorption maximum wavelength in the absorption spectrum of the near-infrared photoelectric conversion film 3 may be greater than or equal to 908 nm. This allows the near-infrared photoelectric conversion elements 10A and 10B to have high light absorption characteristics over a wide range of the near-infrared region.

At least one of the upper electrode 4 or the lower electrode 2 is a transparent electrode made of a conducting material transparent to near-infrared light. A bias voltage is applied to each of the lower electrode 2 and the photoelectric conversion film 3 through a wiring line (not shown). For example, the polarity of the bias voltage is determined such that, among charges generated in the photoelectric conversion film 3, electrons move to the upper electrode 4 and holes move to the lower electrode 2. Alternatively, the polarity of the bias voltage may be set such that, among charges generated in the photoelectric conversion film 3, holes move to the upper electrode 4 and electrons move to the lower electrode 2.

The bias voltage may be applied such that the value obtained by dividing the applied voltage by the distance between the lower electrode 2 and the upper electrode 4, that is, the intensity of the electric field generated in the photoelectric conversion element 10A is within a range of $1.0 \times 10^3$ V/cm to $1.0 \times 10^7$ V/cm or within a range of $1.0 \times 10^4$ V/cm to $1.0 \times 10^7$ V/cm. Adjusting the magnitude of the bias voltage as described above allows charges to efficiently move to the upper electrode 4, thereby enabling signals to be taken outside depending on the charges.

The lower electrode 2 and the upper electrode 4 may be made of a transparent conducting oxide (TCO) which has high transmittance for light in the near-infrared region and low resistance. A metal thin film made of gold (Au) or the like can be used as a transparent electrode and has an extremely increased resistance in some cases in order to obtain a transmittance of greater than or equal to 90% for light in the near-infrared region as compared to a transparent electrode that is prepared so as to have a transmittance of 60% to 80%. Therefore, using the TCO rather than metal materials such as Au enables transparent electrodes which are highly transparent to near-infrared light and which have low resistance to be obtained. The TCO is not particularly limited. Examples of the TCO include indium tin oxide (ITO), indium zinc oxide (IZO), aluminum-doped zinc oxide (AZO), fluorine-doped tin oxide (FTO), $SnO_2$, $TiO_2$, and $ZnO_2$. The lower electrode 2 and the upper electrode 4 may be prepared in such a manner that the TCO and a metal material such as Au are appropriately used alone or in combination depending on desired transmittance.

Material for the lower electrode 2 and the upper electrode 4 is not limited to the above-mentioned conducting material transparent to near-infrared light and may be another material.

Various methods are used to prepare the lower electrode 2 and the upper electrode 4 depending on material used. In the case of using, for example, ITO, the following method may be used: an electron beam method, a sputtering method, a resistive heating evaporation method, a chemical reaction method such as a sol-gel method, a coating method using a dispersion of indium tin oxide, or the like. In this case, after an ITO film is formed, the ITO film may be subjected to a UV-ozone treatment, a plasma treatment, or the like.

According to the photoelectric conversion element 10A, photoelectric conversion is induced in the photoelectric conversion film 3 by near-infrared light entering the photoelectric conversion film 3 through the support substrate 1 and the lower electrode 2. This allows holes and electrons of generated hole-electron pairs to be collected by the lower electrode 2 and the upper electrode 4, respectively. Thus, near-infrared light entering the photoelectric conversion element 10A can be detected by measuring, for example, the potential of the lower electrode 2.

The photoelectric conversion element 10A may further include an electron-blocking layer 5 and hole-blocking layer 6 described below. The injection of electrons into the photoelectric conversion film 3 from the lower electrode 2 and the injection of holes into the photoelectric conversion film 3 from the upper electrode 4 can be suppressed by sandwiching the photoelectric conversion film 3 between the electron-blocking layer 5 and the hole-blocking layer 6. This enables the dark current to be reduced. Incidentally, details of the electron-blocking layer 5 and the hole-blocking layer 6 are described below.

Next, another example of the photoelectric conversion element is described with reference to FIGS. 2 and 3. FIG. 2 is a schematic sectional view of the near-infrared photoelectric conversion element 10B, which is another example of the photoelectric conversion element. FIG. 3 illustrates an example of an energy band diagram of the near-infrared photoelectric conversion element 10B. In the near-infrared photoelectric conversion element 10B, which is illustrated in FIG. 2, the same components as those of the photoelectric conversion element 10A, which is illustrated in FIG. 1, are given the same reference numerals.

Figure 2:
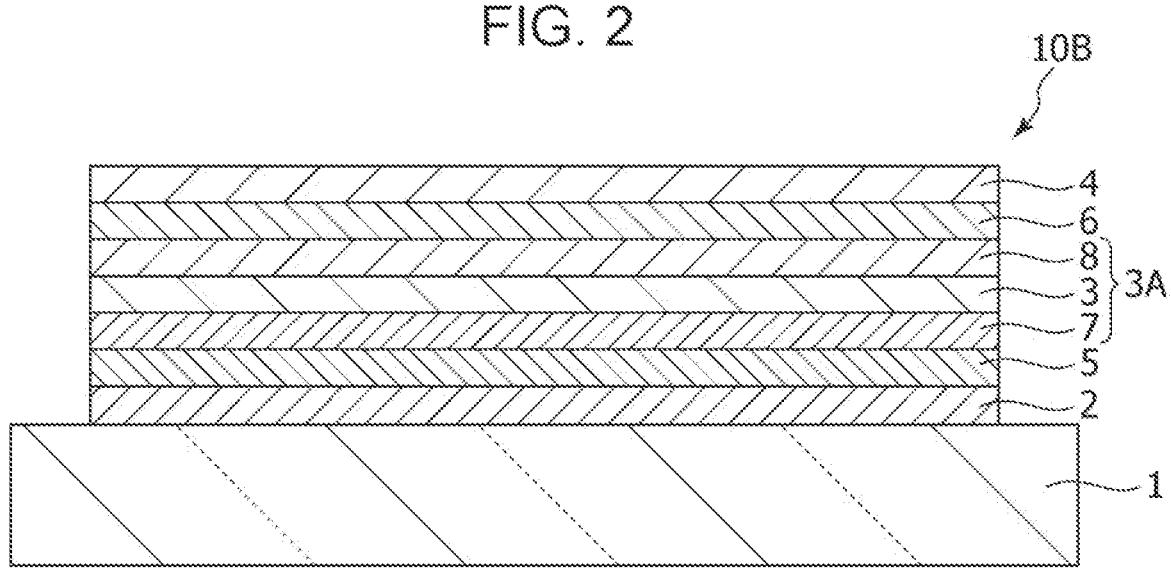
FIG. 2 is a schematic sectional view of another example of the near-infrared photoelectric conversion element.
Figure 3:
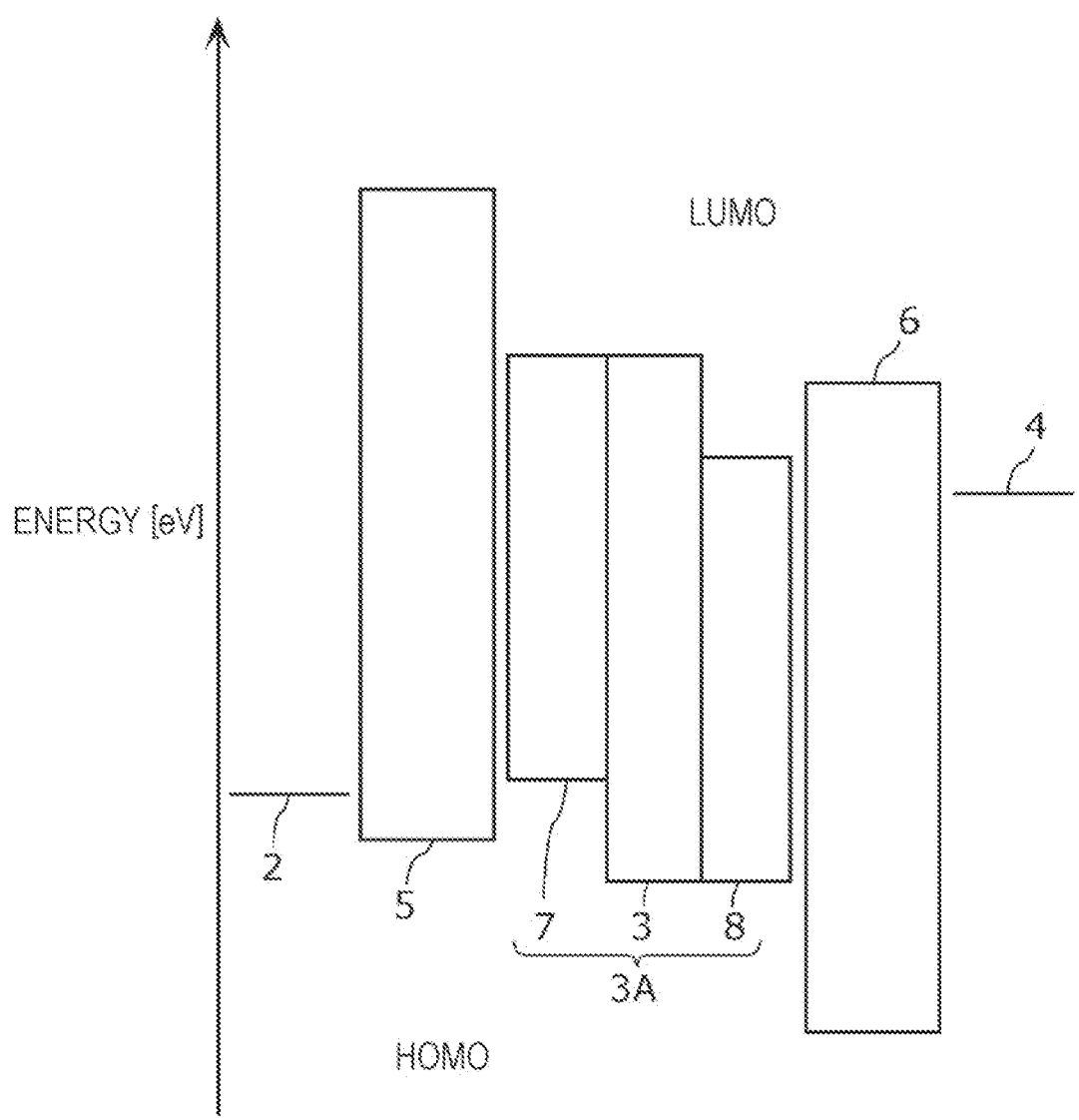
FIG. 3 is an example of an energy band diagram of the near-infrared photoelectric conversion element illustrated in FIG. 2.

As illustrated in FIG. 2, the near-infrared photoelectric conversion element 10B includes at least a lower electrode 2, an upper electrode 4, and a photoelectric conversion layer 3A placed between the lower electrode 2 and the upper electrode 4. The photoelectric conversion layer 3A includes, for example, a near-infrared photoelectric conversion film 3, a p-type semiconductor layer 7 functioning as a hole transport layer, and an n-type semiconductor layer 8 functioning as an electron transport layer. The near-infrared photoelectric conversion film 3 is placed between the p-type semiconductor layer 7 and the n-type semiconductor layer 8. The near-infrared photoelectric conversion element 10B further includes an electron-blocking layer 5 placed between the lower electrode 2 and the photoelectric conversion layer 3A and a hole-blocking layer 6 placed between the upper electrode 4 and the photoelectric conversion layer 3A. The near-infrared photoelectric conversion film 3 is as described above in the description of the near-infrared photoelectric conversion element 10A, which is illustrated in FIG. 1, and therefore is not described in detail herein.

The photoelectric conversion layer 3A includes the near-infrared photoelectric conversion film 3, the p-type semiconductor layer 7 functioning, and the n-type semiconductor layer 8. Herein, at least one of a p-type semiconductor contained in the p-type semiconductor layer 7 or an n-type semiconductor contained in the n-type semiconductor layer 8 may be an organic semiconductor below.

The photoelectric conversion layer 3A may contain the above-mentioned composition and at least one of an organic p-type semiconductor or an organic n-type semiconductor.

The photoelectric conversion layer 3A may include a bulk heterojunction structure layer containing a mixture of the p-type semiconductor and n-type semiconductor. When the photoelectric conversion layer 3A includes the bulk heterojunction structure layer, the disadvantage that the carrier diffusion length in the photoelectric conversion layer 3A is short can be compensated for and the photoelectric conversion efficiency can be enhanced.

The photoelectric conversion layer 3A may further include a bulk heterojunction structure layer placed between the p-type semiconductor layer 7 and the n-type semiconductor layer 8. Sandwiching the bulk heterojunction structure layer between the p-type semiconductor layer 7 and the n-type semiconductor layer 8 allows the rectification of holes and electrons to be higher than that in the bulk heterojunction structure layer and reduces the loss due to the recombination of separated holes and electrons, thereby enabling higher photoelectric conversion efficiency to be obtained. The bulk heterojunction structure layer is as described in Japanese Patent No. 5553727, in which a bulk hetero-type active layer is described in detail.

In the bulk heterojunction structure layer, the contact of the p-type semiconductor with the n-type semiconductor generates charges even in a dark state in some cases. Therefore, reducing the contact of the p-type semiconductor with the n-type semiconductor enables the dark current to be reduced. When the bulk heterojunction structure layer contains a large amount of the n-type semiconductor, such as a fullerene derivative, from the viewpoint of charge mobility, element resistance can be reduced. In this case, the volume ratio and weight ratio of the n-type semiconductor to the p-type semiconductor in the bulk heterojunction structure layer may be greater than or equal to four. However, the reduction in proportion of the p-type semiconductor in the bulk heterojunction structure layer reduces the sensitivity in the near-infrared region. Therefore, the volume ratio of the n-type semiconductor to the p-type semiconductor in the bulk heterojunction structure layer need not be too large from the viewpoint of sensitivity. The volume ratio of the n-type semiconductor to p-type semiconductor in the bulk heterojunction structure layer may be less than or equal to, for example, 20. When the volume ratio of the n-type semiconductor to p-type semiconductor in the bulk heterojunction structure layer is greater than or equal to four and less than or equal to 20, both the reduction of the dark current and the sensitivity in the near-infrared region can be ensured (see, for example, Japanese Unexamined Patent Application Publication No. 2016-225456).

The organic p-type semiconductor is a donor organic semiconductor, is mainly typified by a hole-transporting organic compound, and refers to an organic compound having the property of donating an electron. In particular, the organic p-type semiconductor refers to one of two organic compounds that has lower ionization potential when the two organic compounds are in contact with each other. Thus, the donor organic semiconductor used may be any organic compound having electron-donating properties. For example, the following compounds can be used: triarylamine compounds; benzidine compounds; pyrazoline compounds; styrylamine compounds; hydrazone compounds; triphenylmethane compounds; carbazole compounds; polysilane compounds; thiophene compounds; phthalocyanine compounds; cyanine compounds; merocyanine compounds; oxonol compounds; polyamine compounds; indole compounds; pyrrole compounds; pyrazole compounds; polyarylene compounds; condensed aromatic compounds such as naphthalene derivatives, anthracene derivatives, phenanthrene derivatives, tetracene derivatives, pyrene derivatives, perylene derivatives, and fluoranthene derivatives; and metal complexes containing a nitrogen-containing heterocyclic compound as a ligand. The donor organic semiconductor used is not limited to these compounds and may be an organic compound with an ionization potential lower than that of an organic compound used as an acceptor organic semiconductor as described above.

The organic n-type semiconductor is an acceptor organic semiconductor, is mainly typified by an electron-transporting organic compound, and refers to an organic compound having the property of accepting an electron. In particular, the organic n-type semiconductor refers to one of two organic compounds that has higher electron affinity when the two organic compounds are in contact with each other. Thus, the acceptor organic compound used may be any organic compound having electron-accepting properties. For example, the following compounds are cited: fullerenes; fullerene derivatives; condensed aromatic compounds such as naphthalene derivatives, anthracene derivatives, phenanthrene derivatives, tetracene derivatives, pyrene derivatives, perylene derivatives, and fluoranthene derivatives; nitrogen-, oxygen-, or sulfur-containing five- to seven-membered heterocyclic compounds such as pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyrrolidine, pyrrolopyridine, thiadiazolopyridine, dibenzazepine, and tribenzazepine; polyarylene compounds; fluorene compounds; cyclopentadiene compounds; silyl compounds; and metal complexes containing a nitrogen-containing heterocyclic compound as a ligand. The acceptor organic semiconductor used is not limited to these compounds and may be an organic compound with an electron affinity higher than that of an organic compound used as a donor organic semiconductor as described above.

The electron-blocking layer 5 is placed to reduce the dark current due to the injection of electrons from the lower electrode 2 and suppresses the injection of electrons into the photoelectric conversion layer 3A from the lower electrode 2. The electron-blocking layer 5 may contain the above-mentioned p-type semiconductor or hole-transporting organic compound. As illustrated in FIG. 3, the electron-blocking layer 5 has a HOMO energy level lower than that of the p-type semiconductor layer 7 of the photoelectric conversion layer 3A and a LUMO energy level higher than that of the p-type semiconductor layer 7 of the photoelectric conversion layer 3A. In other words, the photoelectric conversion layer 3A has a HOMO energy level higher than that of the electron-blocking layer 5 and a LUMO energy level lower than that of the electron-blocking layer 5 in the vicinity of the interface between the photoelectric conversion layer 3A and the electron-blocking layer 5.

The hole-blocking layer 6 is placed to reduce the dark current due to the injection of holes from the upper electrode 4 and suppresses the injection of holes into the photoelectric conversion layer 3A from the upper electrode 4. The hole-blocking layer 6 may be made of, for example, an organic substance such as copper phthalocyanine, 3,4,9,10-perylenetetracarboxylic dianhydride (PTCDA), an acetylacetonate complex, bathocuproine (BCP), or tris(8-quinolinolato) aluminum (Alq); an organic-metal compound; or an inorganic substance such as MgAg or MgO. The hole-blocking layer 6 may have high transmittance for near-infrared light, may contain a material having no absorption in the visible region, or may have a small thickness so as not to prevent the light absorption of the photoelectric conversion film 3. The thickness of the hole-blocking layer 6 depends on the configuration of the photoelectric conversion layer 3A, the thickness of the upper electrode 4, or the like and may be greater than or equal to, for example, 2 nm and less than or equal to 50 nm. The hole-blocking layer 6 may contain the above-mentioned n-type semiconductor or electron-transporting organic compound.

In the case of using the electron-blocking layer 5, material for the lower electrode 2 is selected from the above-mentioned materials in consideration of adhesion to the electron-blocking layer 5, electron affinity, ionization potential, stability, and the like. This applies to the upper electrode 4.

As illustrated in FIG. 3, when the work function of the upper electrode 4 is relatively large (for example, 4.8 eV), a barrier to the movement of holes to the photoelectric conversion film 3 during the application of a bias voltage is low. Therefore, the holes are likely to be injected into the photoelectric conversion layer 3A from the upper electrode 4 and, as a result, it is conceivable that the dark current is large. In the near-infrared photoelectric conversion element 108, the hole-blocking layer 6 is placed to suppress the dark current.

Imaging Device

Figure 4:
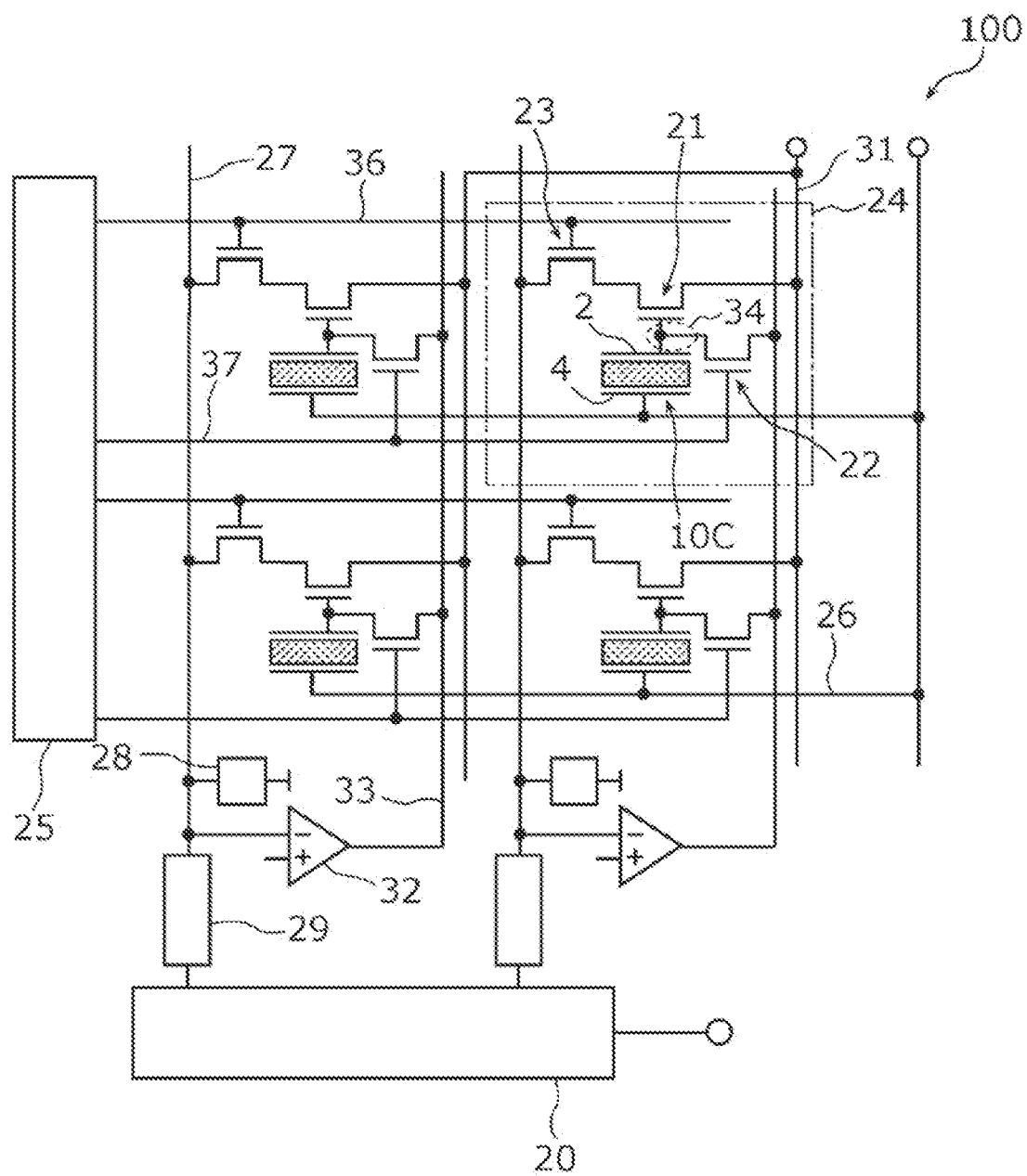
FIG. 4 is a diagram illustrating an example of the circuit configuration of an imaging device according to an embodiment of the present disclosure.
Figure 5:
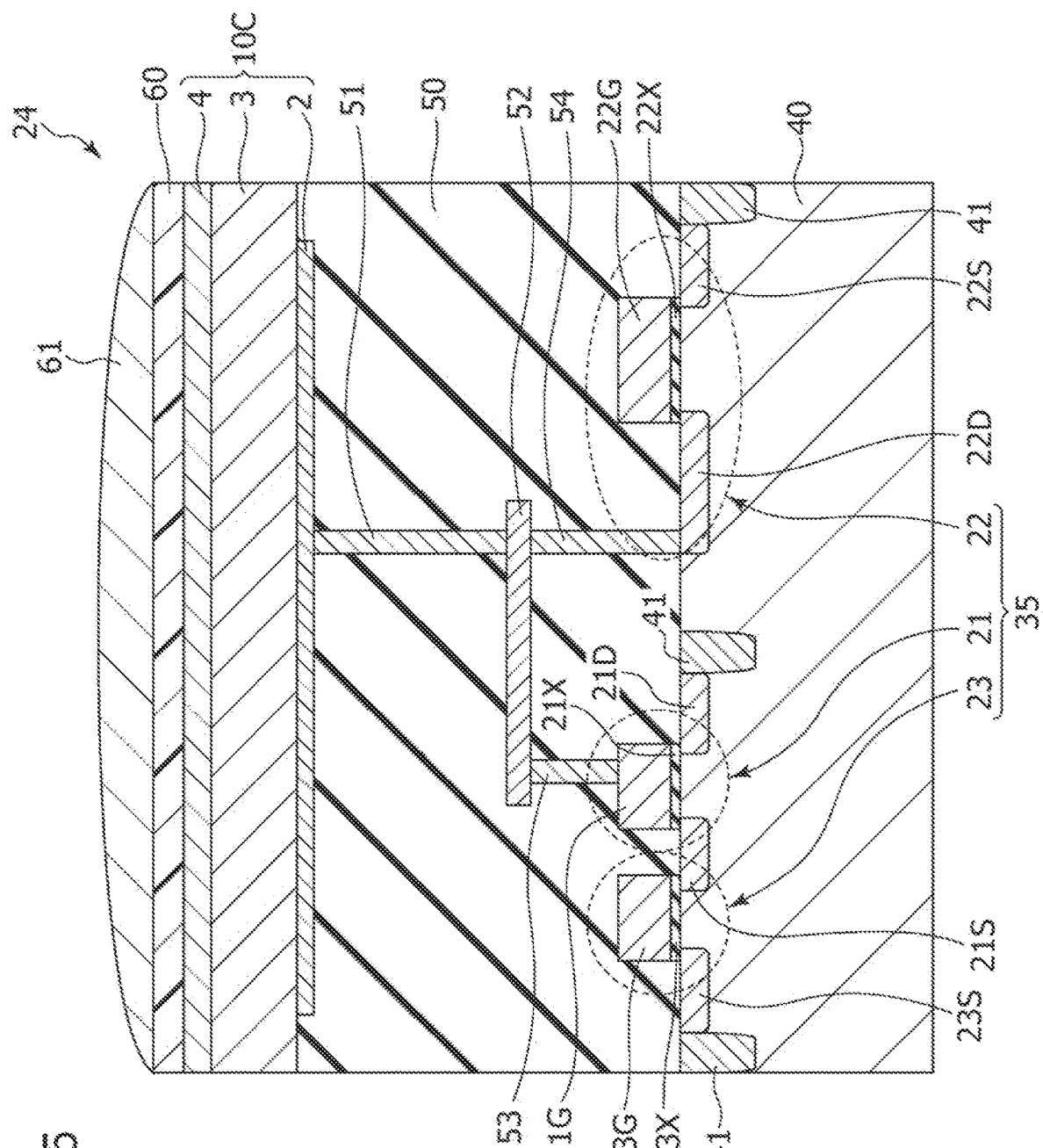
FIG. 5 is a schematic sectional view of an example of the device structure of pixels in the imaging device.

An imaging device 100 according to an embodiment of the present disclosure is described below with reference to FIGS. 4 and 5. FIG. 4 is a diagram illustrating an example of the circuit configuration of the imaging device 100. FIG. 5 is a schematic sectional view of an example of the device structure of pixels 24 in the imaging device 100.

As illustrated in FIGS. 4 and 5, the imaging device 100 includes a semiconductor substrate 40 which is a substrate and the pixels 24. Each of the pixels 24 includes a charge detection circuit 35 attached to the semiconductor substrate 40, a photoelectric converter 10C placed above the semiconductor substrate 40, and a charge storage node 34 electrically connected to the charge detection circuit 35 and the photoelectric converter 10C. The photoelectric converter 10C of each pixel 24 includes the above-mentioned photoelectric conversion element 10A or 10B. The charge storage node 34 stores charges obtained in the photoelectric converter 10C. The charge detection circuit 35 detects the charges stored in the charge storage node 34. The charge detection circuit 35, which is attached to the semiconductor substrate 40, may be placed on the semiconductor substrate 40 or may be directly placed in the semiconductor substrate 40.

As illustrated in FIG. 4, the imaging device 100 includes the pixels 24 and peripheral circuits such as a vertical scanning circuit 25 and a horizontal signal read-out circuit 20. The imaging device 100 is an organic image sensor implemented in the form of a one-chip integrated circuit and includes a pixel array including the two-dimensionally arranged pixels 24.

The pixels 24 are arranged two-dimensionally, that is, in row and column directions, on the semiconductor substrate 40 to form a photosensitive region (a so-called pixel region). FIG. 4 illustrates an example in which the pixels 24 are arranged in a matrix with two rows and two columns. In FIG. 4, a circuit (for example, a pixel electrode control circuit) for individually setting the sensitivity of the pixels 24 is not illustrated for convenience of illustration. The imaging device 100 may be a line sensor. In this case, the pixels 24 may be one-dimensionally arranged. The terms "row direction" and "column direction" as used herein refer to the direction in which a row extends and the direction in which a column extends, respectively. That is, in the plane of FIG. 4, a vertical direction is a column direction and a horizontal direction is a row direction.

As illustrated in FIG. 4, each pixel 24 includes the photoelectric converter 10C and the charge storage node 34, which is electrically connected to the charge detection circuit 35. The charge detection circuit 35 (see FIG. 5) includes an amplification transistor 21, a reset transistor 22, and an address transistor 23.

The photoelectric converter 10C includes a lower electrode 2 placed as a pixel electrode and an upper electrode 4 placed as a counter electrode. The above-mentioned photoelectric conversion element 10A (see FIG. 1) or 10B (see FIG. 2) may be used in the photoelectric converter 10C. A predetermined bias voltage is applied to the upper electrode 4 through a counter electrode signal line 26.

The lower electrode 2 is connected to a gate electrode of the amplification transistor 21. Signal charges collected by the lower electrode 2 are stored in the charge storage node 34. The charge storage node 34 is located between the lower electrode 2 and the gate electrode of the amplification transistor 21. In this embodiment, signal charges are holes. Signal charges may be electrons.

The signal charges stored in the charge storage node 34 are applied to the gate electrode of the amplification transistor 21 in the form of a voltage corresponding to the amount of the signal charges. The amplification transistor 21 amplifies this voltage, which is selectively read out as a signal voltage by the address transistor 23. The reset transistor 22 includes source/drain electrodes connected to the lower electrode 2 and resets the signal charges stored in the charge storage node 34. In other words, the reset transistor 22 resets the potential of the gate electrode of the amplification transistor 21 and the potential of the lower electrode 2.

In order to selectively perform the above-mentioned operations in the pixels 24, the imaging device 100 includes power supply lines 31, vertical signal lines 27, address signal lines 36, and reset signal lines 37 and these lines are connected to the pixels 24. In particular, the power supply lines 31 are connected to source/drain electrodes of the amplification transistor 21 and the vertical signal lines 27 are connected to source/drain electrodes of the address transistor 23. Each address signal line 36 is connected to a gate electrode of the address transistor 23. Each reset signal line 37 is connected to a gate electrode of the reset transistor 22.

The peripheral circuits include the vertical scanning circuit 25, the horizontal signal read-out circuit 20, a plurality of column signal-processing circuits 29, a plurality of load circuits 28, and a plurality of differential amplifiers 32. The vertical scanning circuit 25 is also referred to as a row scanning circuit. The horizontal signal read-out circuit 20 is also referred to as a column scanning circuit. The column signal-processing circuits 29 are also referred to as row signal storage circuits. The differential amplifiers 32 are also referred to as feed-back amplifiers.

The vertical scanning circuit 25 is connected to the address signal lines 36 and the reset signal lines 37, selects the pixels 24 placed in each row on a row basis, reads out the signal voltage, and resets the potential of the lower electrode 2. The power supply lines 31 function as source follower power supplies and supply a predetermined power supply voltage to each pixel 24. The horizontal signal read-out circuit 20 is electrically connected to the column signal-processing circuits 29. The column signal-processing circuits 29 are electrically connected to the pixels 24 placed in each column through the vertical signal lines 27 corresponding to the column. Each of the load circuits 28 is electrically connected to a corresponding one of the vertical signal lines 27. The load circuits 28 and the amplification transistors 21 form source follower circuits.

The differential amplifiers 32 are placed so as to correspond to each column. A negative-side input terminal of each of the differential amplifiers 32 is connected to a corresponding one of the vertical signal lines 27. Output terminals of the differential amplifiers 32 are connected to the pixels 24 through feed-back lines 33 corresponding to the column.

The vertical scanning circuit 25 applies row selection signals controlling the turning on and off of the address transistors 23 to the gate electrodes of the address transistors 23 through the address signal lines 36. This allows a row that is intended to be read out to be scanned and selected. Signal voltages are read out from the pixels 24 in the selected row to the vertical signal lines 27. Furthermore, the vertical scanning circuit 25 applies reset signals controlling the turning on and off of the reset transistors 22 to the gate electrodes of the reset transistors 22 through the reset signal lines 37. This allows a row of the pixels 24 that are intended to be reset to be selected. The vertical signal lines 27 transmit the signal voltages read out from the pixels 24 selected by the vertical scanning circuit 25 to the column signal-processing circuits 29.

The column signal-processing circuits 29 perform noise reduction signal processing typified by correlated double sampling, analog-digital conversion (AD conversion), and the like.

The horizontal signal read-out circuit 20 sequentially reads out signals from the column signal-processing circuits 29 to a horizontal common signal line (not shown).

The differential amplifiers 32 are connected to the drain electrodes of the reset transistors 22 through the feed-back lines 33. Thus, when the address transistors 23 and the reset transistors 22 are in the conduction state, negative terminals of the differential amplifiers 32 receive outputs from the address transistors 23. The differential amplifiers 32 perform a feed-back operation such that the gate potential of each amplification transistor 21 is equal to a predetermined feed-back voltage. In this operation, the output voltage of each differential amplifier 32 is equal to 0 V or a positive voltage close to 0 V. The term "feed-back voltage" refers to the output voltage of the differential amplifier 32.

As illustrated in FIG. 5, each pixel 24 includes the semiconductor substrate 40, the charge detection circuit 35, the photoelectric converter 10C, and the charge storage node 34 (see FIG. 4).

The semiconductor substrate 40 may be an insulating substrate provided with a semiconductor layer placed on a surface on the side where a photosensitive region (a so-called pixel region) is formed and is, for example, a p-type silicon substrate. The semiconductor substrate 40 includes impurity regions (herein, n-type regions) 21D, 213, 22D, 22S, and 233 and an isolation region 41 for electrically separating the pixels 24. The isolation region 41 is placed between the impurity region 21D and the impurity region 22D. This suppresses the leakage of the signal charges stored in the charge storage node 34. The isolation region 41 is formed by, for example, the implantation of acceptor ions under predetermined conditions.

The impurity regions 21D, 21S, 22D, 223, and 23S are typically diffusion layers formed in the semiconductor substrate 40. As illustrated in FIG. 5, the amplification transistor 21 includes the impurity regions 21S and 21D and a gate electrode 21G. The impurity region 21S and the impurity region 21D function as, for example, a source region and drain region, respectively, of the amplification transistor 21. A channel region of the amplification transistor 21 is formed between the impurity regions 21S and 21D.

Likewise, the address transistor 23 includes the impurity regions 23S and 21S and a gate electrode 23G connected to one of the address signal lines 36. In this example, the amplification transistor 21 and the address transistor 23 share the impurity region 21S and therefore are electrically connected to each other. The impurity region 23S functions as, for example, a source region of the address transistor 23. The impurity region 23S has a connection to one of the vertical signal lines 27 as illustrated in FIG. 4.

The reset transistor 22 includes the impurity regions 22D and 22S and a gate electrode 22G connected to one of the reset signal lines 37. The impurity region 22S functions as, for example, a source region of the reset transistor 22. The impurity region 22S has a connection to one of the reset signal lines 37 as illustrated in FIG. 4.

An interlayer insulating layer 50 is placed on the semiconductor substrate 40 so as to cover the amplification transistor 21, the address transistor 23, and the reset transistor 22.

Wiring layers (not shown) may be placed in the interlayer insulating layer 50. The wiring layers are formed typically from a metal such as copper and may partly include, for example, wiring lines such as the above-mentioned vertical signal lines 27. The number of insulating layers in the interlayer insulating layer 50 and the number of the wiring layers placed in the interlayer insulating layer 50 can be arbitrarily set.

The following components are placed in the interlayer insulating layer 50: a contact plug 54 connected to the impurity region 22D of the reset transistor 22, a contact plug 53 connected to the gate electrode 21G of the amplification transistor 21, a contact plug 51 connected to the lower electrode 2, and a wiring line 52 connecting the contact plugs 51, 54, and 53 together. This electrically connects the impurity region 22D, which functions as a drain electrode of the reset transistor 22, to the gate electrode 21G of the amplification transistor 21.

The charge detection circuit 35 detects signal charges captured by the lower electrode 2 and outputs a signal voltage. The charge detection circuit 35 includes the amplification transistor 21, the reset transistor 22, and the address transistor 23 and is attached to the semiconductor substrate 40.

The amplification transistor 21 includes the impurity regions 21D and 21S, a gate insulating layer 21X placed on the semiconductor substrate 40, and the gate electrode 21G. The impurity region 21D and the impurity region 21S are placed in the semiconductor substrate 40 and function as a drain electrode and a source electrode, respectively. The gate electrode 21G is placed on the gate insulating layer 21X.

The reset transistor 22 includes the impurity regions 22D and 22S, a gate insulating layer 22X placed on the semiconductor substrate 40, and the gate electrode 22G. The impurity region 22D and the impurity region 22S are placed in the semiconductor substrate 40 and function as a drain electrode and a source electrode, respectively. The gate electrode 22G is placed on the gate insulating layer 22X.

The address transistor 23 includes the impurity regions 21S and 23S, a gate insulating layer 23X placed on the semiconductor substrate 40, and the gate electrode 23G. The impurity region 21S and the impurity region 23S are placed in the semiconductor substrate 40 and function as a drain electrode and a source electrode, respectively. The gate electrode 23G is placed on the gate insulating layer 23X. The impurity region 21S is shared by the amplification transistor 21 and the address transistor 23, whereby the amplification transistor 21 and the address transistor 23 are connected in series.

The above-mentioned photoelectric converter 10C is placed on the interlayer insulating layer 50. In other words, in this embodiment, the pixels 24, which form the pixel array, are placed on the semiconductor substrate 40. The pixels 24 are two-dimensionally arranged on the semiconductor substrate 40 to form the photosensitive region (a so-called pixel region). The distance between the two neighboring pixels 24 (that is, the pixel pitch) may be, for example, about 2 μm.

The photoelectric converter 10C has the same structure as that of the above-mentioned photoelectric conversion element 10A or 10B.

The photoelectric converter 10C is overlaid with a color filter 60. The color filter 60 is overlaid with a micro-lens 61. The color filter 60 is, for example, an on-chip color filter formed by patterning and is made of a photosensitive resin containing a dye or pigment dispersed therein or the like. The micro-lens 61 is placed in the form of, for example, an on-chip micro-lens and is made of an ultraviolet photosensitive material or the like.

The imaging device 100 can be manufactured by a general semiconductor manufacturing process. In particular, when the semiconductor substrate 40 used is a silicon substrate, various silicon semiconductor processes can be used to manufacture the imaging device 100.

In light of the above, according to the present disclosure, a near-infrared photoelectric conversion element and imaging device capable of exhibiting high photoelectric conversion efficiency can be achieved using a composition which has high light absorption characteristics in the near-infrared region and which can reduce the dark current.

EXAMPLES

The present disclosure is further described below in detail with reference to examples. The present disclosure is not in any way limited to the examples.

A composition containing a compound obtained in Example 1, Example 2, Example 3, Example 4, Example 5, Example 6, or Comparative Example 1 was used to form a near-infrared photoelectric conversion film in Example 7, Example 8, Example 9, Example 10, Example 11, Example 12, or Comparative Example 2, respectively. The near-infrared photoelectric conversion film obtained in Example 7, Example 8, Example 9, Example 10, Example 11, Example 12, or Comparative Example 2 was used to prepare a near-infrared photoelectric conversion element in Example 13, Example 14, Example 15, Example 16, Example 17, Example 18, or Comparative Example 3, respectively.

Hereinafter, a propyl group ($C_3H_7$) is represented by Pr, a butyl group ($C_4H_9$) is represented by Bu, a hexyl group ($C_6H_{13}$) is represented by Hex, and a naphthalocyanine skeleton ($C_{48}H_{26}N_8$) is represented by Nc in some cases.

Naphthalocyanine Derivative

A phthalocyanine derivative contained in a composition according to the present disclosure is further described below in detail with reference to Examples 1 to 6 and Comparative Example 1,

Example 1

Synthesis of $(OBu)_8NcSi(OPOPh_2)_2$

A compound, $(OBu)_8NcSi(OPOPh_2)_2$, represented by the following formula was synthesized in accordance with Steps (1) and (2) below:

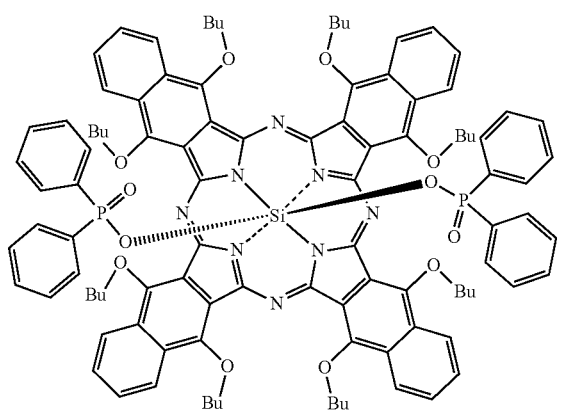

(2)

Step (1): Synthesis of $(OBu)_6NcSi(OH)_2$ (Compound (A-2))

Compound (A-2) was synthesized with reference to Mohamed Aoudia et al., "Synthesis of a series of octabutoxy- and octabutoxybenzophthalocyanines and photophysical properties of two members of the series", Journal of the American Chemical Society, American Chemical Society, 1997, vol. 119, no, 26, pp. 6029-6039 (Non-Patent Document 3).

Step (2): Synthesis of (OBu)₆NcSi(OPOPh₂)₂ (Compound (A-3))

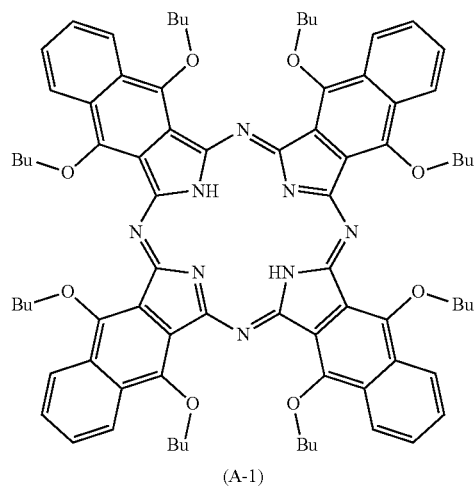

(A-1)

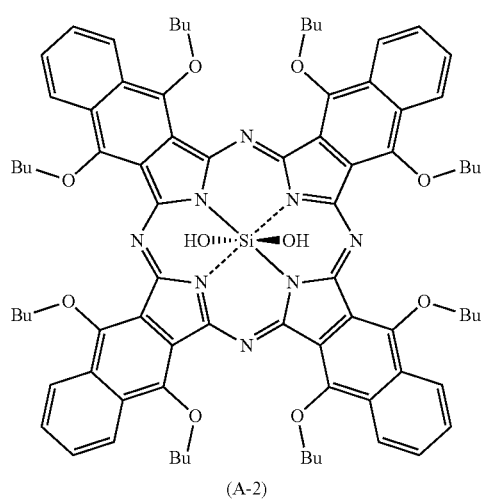

(A-2)

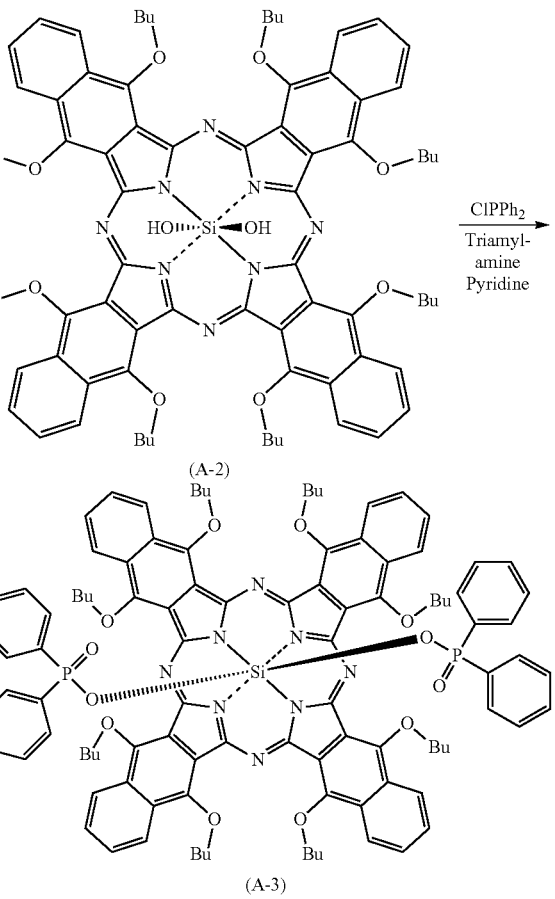

(A-3)

To a 1,000 mL reaction vessel filled with argon, 0.95 g of (OBu)₈H₂Nc (Compound (A-1)), 92 mL of tributylamine, and 550 mL of dehydrated toluene were added, and 3.7 mL of HSiCl₃ was further added, followed by heating and stirring at 80° C. for 24 h. Subsequently, a reaction solution was cooled to room temperature and 3.7 mL of HSiCl₃ was further added thereto, followed by heating and stirring at 80° C. for 24 h. Subsequently, the reaction solution was cooled to room temperature and 1.9 mL of HSiCl₃ was added thereto, followed by heating and stirring at 80° C. for 24 h.

The reaction solution was cooled to room temperature and 360 mL of distilled water was added to the reaction solution, followed by stirring for 1 h. To the reaction solution, 180 mL of triethylamine was added, followed by extraction with 100 mL of toluene four times. An extracted organic layer was washed with distilled water and was concentrated, whereby 154 g of a crude product was obtained. The obtained crude product was purified with a neutral alumina column, whereby a brown solid target compound, that is, (OBu)₈NcSi(OH)₂ (Compound (A-2)) was obtained. The amount of the obtained target compound was 0.53 g and the yield thereof was 50%.

To a 200 mL reaction vessel filled with argon, 0.13 g of (OBu)₈NcSi(OH)₂ (Compound (A-2)) synthesized in Step (1), 1.3 g of chlorodiphenylphosphine, and 1.3 g of triamylamine were added. These compounds were dissolved in 10 mL of pyridine, followed by heating at 110° C. for 5 h under reflux. After a reaction solution was cooled to room temperature, 10 mL of water was added to the reaction solution, followed by stirring for 30 minutes. Furthermore, 20 mL of water was added to the reaction solution, whereby a solid component was precipitated. The precipitated solid component was filtered out. The filtered-out solid component was purified by silica gel column chromatography (a developing solvent was a mixture of toluene and ethyl acetate mixed at a ratio of 1:1) and an obtained purified substance was reprecipitated with methanol. The obtained precipitate was vacuum-dried at 100° C. for 3 h, whereby a target compound, that is, (OBu)₈NcSi(OPOPh₂)₂ (Compound (A-3)) was obtained. The amount of the obtained target compound was 83 mg and the yield thereof was 50%.

The obtained target compound was identified by proton nuclear magnetic resonance spectroscopy ($^1$HNMR) and matrix-assisted laser desorption/ionization time-of-flight mass spectrometry (MALDI-TOF-MS). Results were as illustrated below.

$^1$HNMR (400 MHz, $C_6D_6$): δ (ppm)=9.16 (8H), 7.62 (8H), 6.13 (12H), 6.00 (8H), 5.29 (16H), 2.26 (16H), 1.64 (16H), 1.00 (24H)

MALDI-TOF-MS measured value: m/z=1,751.17 (M⁺)

The chemical formula for the target compound is $C_{104}H_{108}N_8O_{12}P_2Si$ and the exact mass thereof is 1,756.73.

From the above results, it could be confirmed that the target compound was obtained by the above synthesis procedure.

The obtained target compound was dissolved in tetrahydrofuran and was measured for absorption spectrum. Results were as illustrated in FIG. 6. As illustrated in FIG. 6, the wavelength of an absorption peak in the near-infrared region was 908 nm. Thus, it was clear that the compound obtained in Example 1 was a material having an absorption maximum wavelength in the near-infrared region.

Example 2

A compound, $(OBu)_8NcSi(OPO-(4-F-Ph)_2)_2$, represented by the following formula was synthesized in accordance with Steps (1) and (3) below:

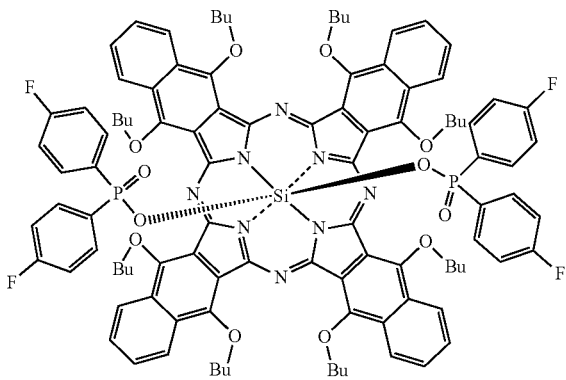

(3)

Step (1) to synthesize $(OBu)_8NcSi(OH)_2$ (Compound (A-2)) was performed in the same manner as that used in Example 1.

Step (3): Synthesis of $(OBu)_8NcSi(OPO-(4-F-Ph)_2)_2$ (Compound (A-4))

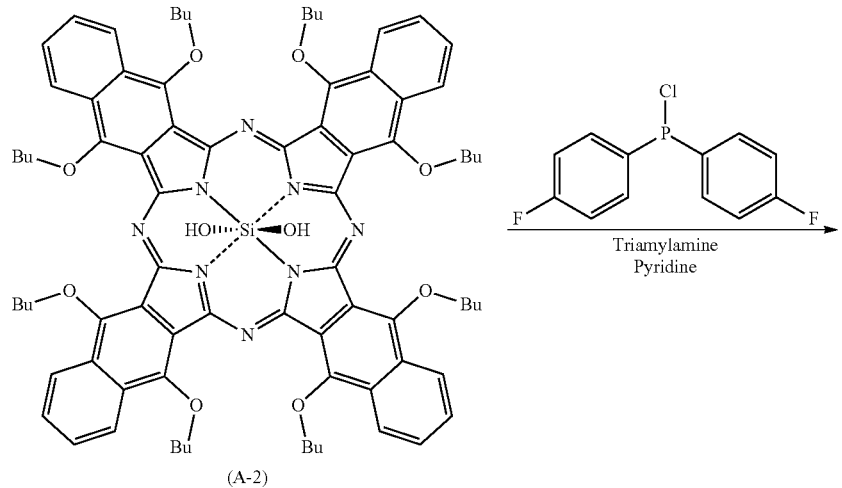

(A-2)

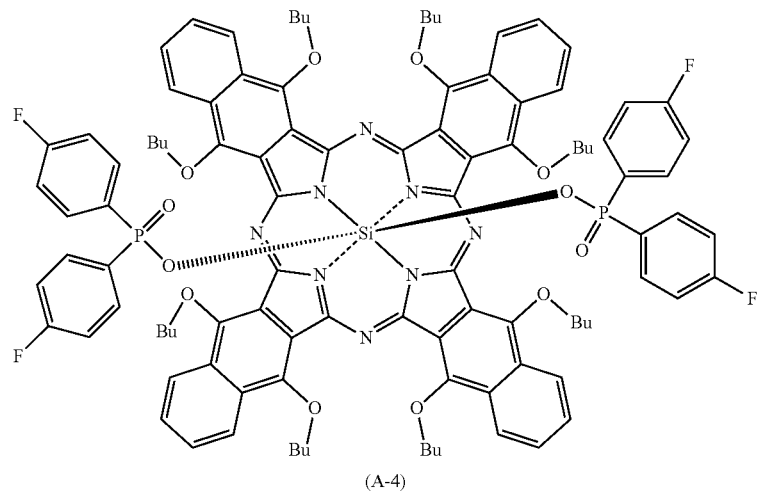

(A-4)

To a 200 mL reaction vessel filled with argon, 0.45 g of (OBu)$_8$NcSi(OH)$_2$ (Compound (A-2)) synthesized in Step (1), 2.7 g of Cl—P(4-F-Ph)$_2$, and 4.5 g of triamylamine were added. These compounds were dissolved in 18 mL of pyridine, followed by heating at 110° C. for 3 h under reflux. After a reaction solution was cooled to room temperature; 10 mL of water was added to the reaction solution, followed by stirring for 30 minutes. Furthermore, 20 mL of water was added to the reaction solution, whereby a solid component was precipitated. The precipitated solid component was filtered out. The filtered-out solid component was purified by silica gel column chromatography (a developing solvent was a mixture of toluene and ethyl acetate mixed at a ratio of 1:1) and an obtained purified substance was reprecipitated with heptane. The obtained precipitate was vacuum-dried at 100° C. for 3 h, whereby a target compound, that is, (OBu)$_8$NcSi(OPO-(4-F-Ph)$_2$)$_2$ (Compound (A-4)) was obtained. The amount of the obtained target compound was 108 mg and the yield thereof was 18%.

The obtained target compound was identified by $^1$HNMR and MALDI-TOF-MS. Results were as illustrated below.

$^1$HNMR (400 MHz, C$_6$D$_6$): δ (ppm)=9.13 (8H), 7.61 (8H) 5.82 (16H), 5.27 (16H), 2.27 (16H), 1.64 (16H), 0.98 (24H)

MALDI-TOF-MS measured value: m/z=1,823.09 (M$^+$)

The chemical formula for the target compound is C$_{104}$H$_{104}$F$_4$N$_8$O$_{12}$P$_2$Si and the exact mass thereof is 1,822.70.

From the above results, it could be confirmed that the target compound was obtained by the above synthesis procedure.

The obtained target compound was dissolved in tetrahydrofuran and was measured for absorption spectrum. Results were as illustrated in FIG. 6. As illustrated in FIG. 6, the wavelength of an absorption peak in the near-infrared region was 915 nm. Thus, it was clear that the compound obtained in Example 2 was a material having an absorption maximum wavelength in the near-infrared region.

Example 3

(OBu)$_8$NcSi(OPO-(3,5-diF-Ph)$_2$)$_2$

A compound. (OBu)$_8$NcSi(OPO-(3,5-diF-Ph)$_2$)$_2$, represented by the following formula was synthesized in accordance with Steps (1) and (4) to (6) below:

(4)

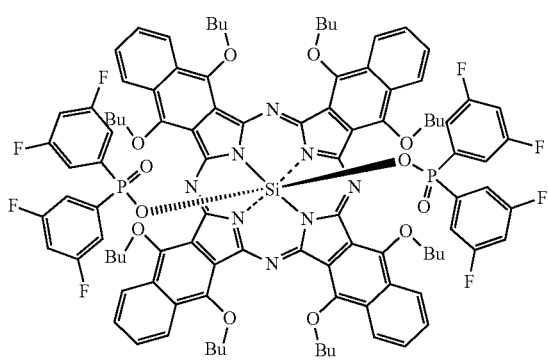

Step (1) to synthesize (OBu)$_8$NcSi(OH)$_2$ (Compound (A-2)) was performed in the same manner as that used in Example 1.

Step (4): Synthesis of HOPO(3,5-diF-Ph)$_2$ (Compound (A-6))

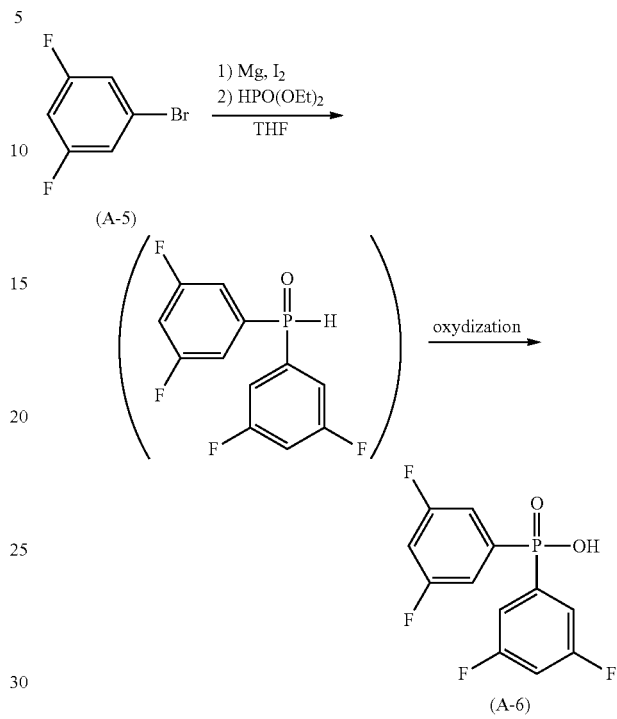

Into a 200 mL reaction vessel filled with argon, 40 mL of tetrahydrofuran (THF) (dehydrated) was poured, 0.85 g of metallic magnesium was subsequently charged, and 7 mg of iodine was further added, followed by mixing. Next, a solution obtained by mixing 3.7 mL of 1-bromo-3,5-difluorobenzene (Compound (A-5)) with 16.3 mL of diethyl ether was added dropwise to the reaction vessel over 25 minutes. After the completion of dropwise addition, a reaction solution was stirred at room temperature for 2 h. Thereafter, the reaction vessel was cooled to −5° C. and a solution obtained by mixing 1.9 mL of diethyl phosphite with THF (dehydrated) was added dropwise to the reaction vessel over 25 minutes. The reaction solution as is was stirred for 14 h.

Thereafter, about 100 mL of a 0.3 M aqueous solution of HCl was added to the reaction solution. Subsequently, about 100 mL of ethyl acetate was added to the resulting reaction solution, followed by liquid separation using a separatory funnel. Reaction products were extracted from an aqueous layer with ethyl acetate. An extracted organic layer was dehydrated with MgSO$_4$ and was concentrated in such a manner that a solvent was distilled off from the organic layer.

Thereafter, the concentrate was dissolved in diethyl ether. After the solution was bubbled with air at room temperature for 4 h, the solution was concentrated. The concentrated solution was stored in a cool, dark place, whereby a solid was precipitated. The precipitated solid was filtered out, whereby a target compound, that is, Compound (A-6) was obtained. The amount of the obtained target compound was 512 mg and the yield thereof was 12%.

The obtained target compound was identified by $^1$HNMR and $^{19}$FNMR. Results were as illustrated below.

$^1$HNMR (400 MHz, CDCl$_3$): δ (ppm)=7.45 (6H)

$^{19}$FNMR (376 MHz, DMSO): δ (ppm)=108.3 (4F)

Step (5): Synthesis of Cl—PO(3,5-diF-Ph)₂ (Compound (A-7))

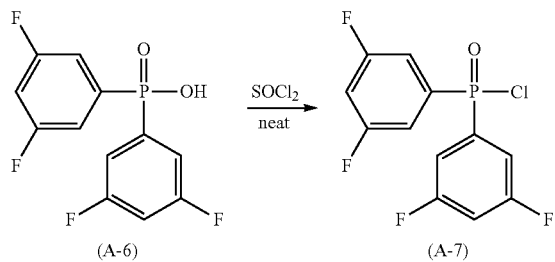

Into a 10 mL reaction vessel filled with argon, 0.15 g of HOPO(3,5-diF-Ph)₂ (Compound (A-6)) synthesized in Step (4) and 3 mL of thionyl chloride were put, followed by heating the reaction vessel at 110° C. for 5 h under reflux. Thereafter, a reaction solution was cooled and was concentrated. Furthermore, dehydrated toluene was added to the reaction solution, followed by repeating azeotropic distillation five times, whereby a transparent liquid target compound, that is, Compound (A-7) was obtained. The amount of the obtained target compound was 139 mg and the yield thereof was 82%.

The obtained compound was identified by ¹HNMR, ¹⁹FNMR, and ³¹PNMR. Results were as illustrated below.

¹HNMR (400 MHz, CDCl₃): δ (ppm)=7.46 (6H)
¹⁹FNMR (376 MHz, DMSO): δ (ppm)=108.3 (4F)
³¹PNMR (162 MHz, DMSO): δ (ppm)=17.8 (1P)

Step (6): Synthesis of (OBu)₃NcSi(OPO-(3,5-diF-Ph)₂)₂ (Compound (A-8))

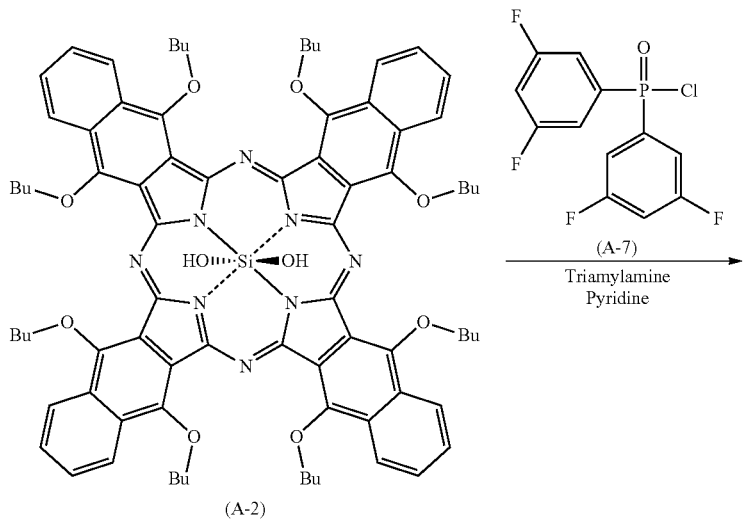

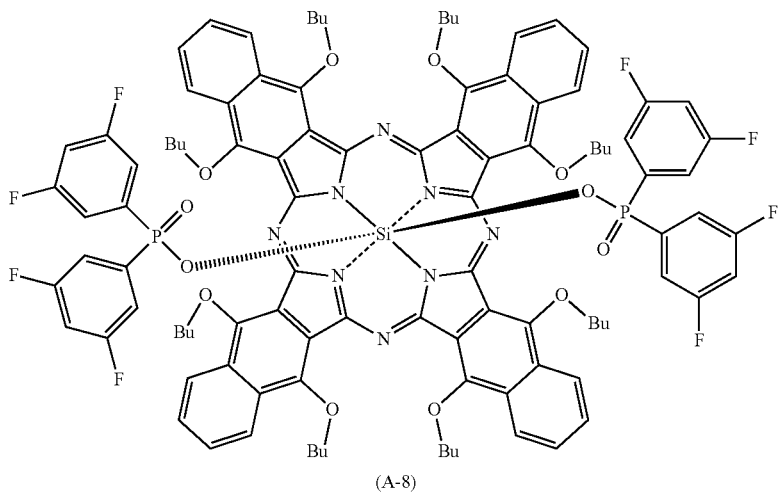

To a 200 mL reaction vessel filled with argon, 0.50 g of (OBONcSi(OH)$_2$ (Compound (A-2)) synthesized in Step (1), 1.0 g of Cl—PO(3,5-diF-Ph)$_2$ (Compound (A-7)) synthesized in Step (5), and 4.5 g of triamylamine were added. These compounds were dissolved in 20 mL of pyridine, followed by heating at 110° C. for 5 h under reflux. After a reaction solution was cooled to room temperature, 10 mL of water was added to the reaction solution, followed by stirring for 30 minutes. Furthermore, 20 mL of water was added to the reaction solution, whereby a solid component was precipitated. The precipitated solid component was filtered out. The filtered-out solid component was purified by silica gel column chromatography (a developing solvent was toluene only) and an obtained purified substance was reprecipitated with heptane. The obtained precipitate was vacuum-dried at 100° C. for 3 h, whereby a target compound, that is, (OBu)$_8$NcSi(OPO-(3,5-diF-Ph)$_2$)$_2$ (Compound (A-8)) was obtained. The amount of the obtained target compound was 161 mg and the yield thereof was 23%.

The obtained target compound was identified by $^1$HNMR and MALDI-TOF-MS. Results were as illustrated below.

$^1$HNMR (400 MHz, C$_6$D$_6$): δ (ppm)=9.13 (8H), 7.60 (8H), 5.48 (8H), 5.42 (4H), 5.36 (16H), 2.31 (16H), 1.69 (16H), 1.03 (24H)

MALDI-TOF-MS measured value: m/z=1,895.00 (M$^+$)

The chemical formula for the target compound is C$_{104}$H$_{100}$F$_8$N$_8$O$_{12}$P$_2$Si and the exact mass thereof is 1,894.66.

From the above results, it could be confirmed that the target compound was obtained by the above synthesis procedure.

The obtained target compound was dissolved in tetrahydrofuran and was measured for absorption spectrum. Results were as illustrated in FIG. 6. As illustrated in FIG. 6, the wavelength of an absorption peak in the near-infrared region was 925 nm. Thus, it was clear that the compound obtained in Example 3 was a material having an absorption maximum wavelength in the near-infrared region.

Example 4

(OBu)$_8$NcSi(OPO-(4-CF$_3$-Ph)$_2$)$_2$

A compound, (OBu)$_8$NcSi(OPO-(4-CF$_3$-Ph)$_2$)$_2$, represented by the following formula was synthesized in accordance with Steps (1) and (7) below:

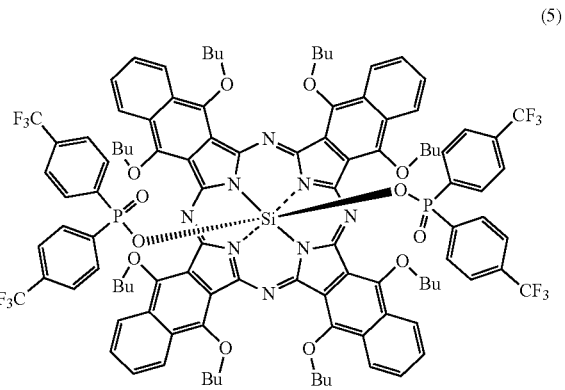

(5)

Step (1) to synthesize (OBu)$_8$NcSi(OH)$_2$ (Compound (A-2)) was performed in the same manner as that used in Example 1.

Step (7): Synthesis of (OBu)$_8$NcSi(OPO-(4-CF$_3$-Ph)$_2$)$_2$ (Compound (A-9))

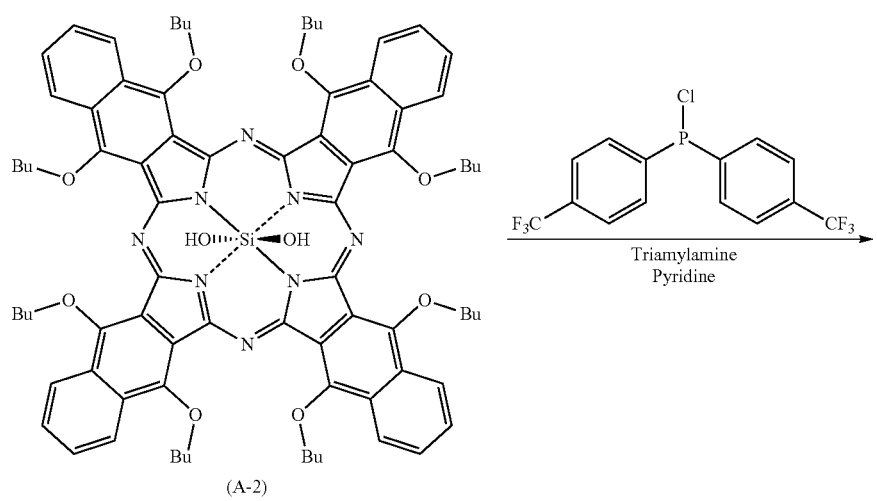

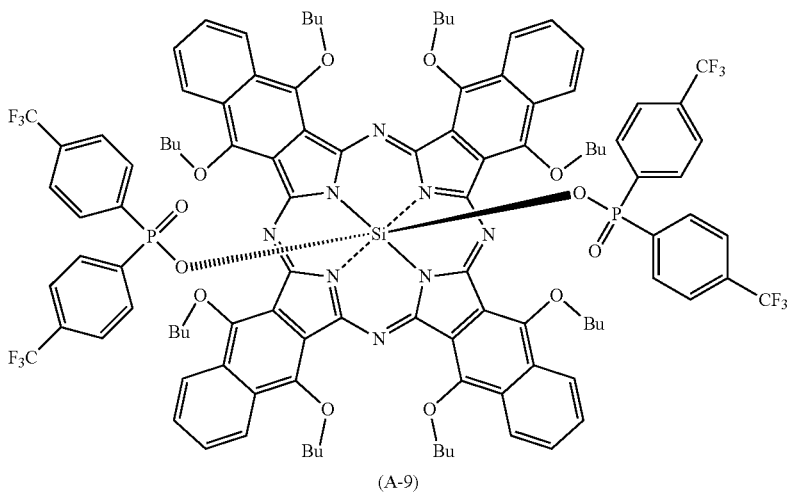

(A-9)

To a 200 mL reaction vessel filled with argon, 0.45 g of $(OBu)_8NcSi(OH)_2$ (Compound (A-2)) synthesized in Step (1), 2.0 g of Cl—P(4-$CF_3$-Ph)$_2$, and 4.5 g of triamylamine were added. These compounds were dissolved in 18 mL of pyridine, followed by heating at 110° C. for 3 h under reflux. After a reaction solution was cooled to room temperature, 10 mL of water was added to the reaction solution, followed by stirring for 30 minutes. Furthermore, 20 mL of water was added to the reaction solution, whereby a solid component was precipitated. The precipitated solid component was filtered out. The filtered-out solid component was purified by silica gel column chromatography (a developing solvent was a mixture of toluene and ethyl acetate mixed at a ratio of 1:1) and an obtained purified substance was reprecipitated with heptane. The obtained precipitate was vacuum-dried at 100° C. for 3 h, whereby a target compound, that is, $(OBu)_8NcSi(OPO-(4-CF_3-Ph)_2)_2$ (Compound (A-9)) was obtained. The amount of the obtained target compound was 209 mg and the yield thereof was 31%.

The obtained target compound was identified by $^1$HNMR and MALDI-TOF-MS. Results were as illustrated below.

$^1$HNMR (400 MHz, $C_6D_6$): δ (ppm)=9.10 (8H), 7.61 (8H), 6.52 (8H), 6.04 (8H), 5.31 (16H), 2.30 (16H), 1.64 (16H), 1.01 (24H)

MALDI-TOF-MS measured value: m/z=2,023.14 (M$^+$)

The chemical formula for the target compound is $C_{108}H_{104}F_{12}N_8O_{12}P_2Si$ and the exact mass thereof is 2,022.68.

From the above results, it could be confirmed that the target compound was obtained by the above synthesis procedure.

The obtained target compound was dissolved in tetrahydrofuran and was measured for absorption spectrum. Results were as illustrated in FIG. 6. As illustrated in FIG. 6, the wavelength of an absorption peak in the near-infrared region was 921 nm. Thus, it was clear that the compound obtained in Example 4 was a material having an absorption maximum wavelength in the near-infrared region.

Example 5

$(OBu)_8NcSi(OPO-(3,5-bisCF_3-Ph)_2)_2$

A compound, $(OBu)_8NcSi(OPO-(3,5-bisCF_3-Ph)_2)_2$, represented by the following formula was synthesized in accordance with Steps (1) and (8) below:

(6)

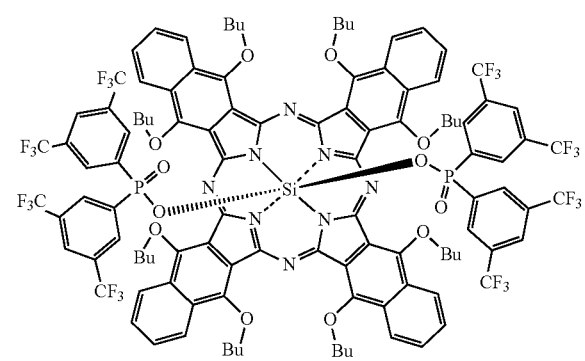

Step (1) to synthesize $(OBu)_8NcSi(OH)_2$ (Compound (A-2)) was performed in the same manner as that used in Example 1.

Step (8): Synthesis of (OBu)$_8$NcSi(OPO-(3,5-bisCF$_3$-Ph)$_2$)$_2$ (Compound (A-10))

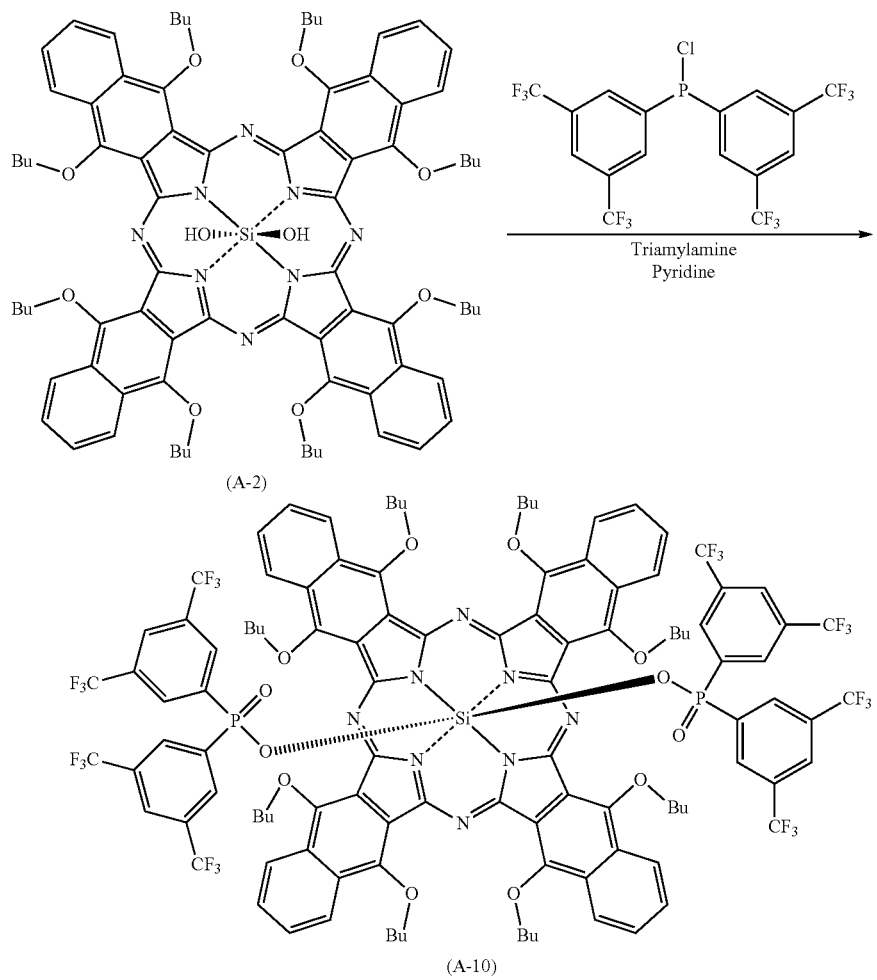

To a 200 mL reaction vessel filled with argon, 0.45 g of (OBu)$_8$NcSi(OH)$_2$ (Compound (A-2)) synthesized in Step (1), 2.0 g of Cl—P(3,5-bisCF$_3$-Ph)$_2$, and 4.5 g of triamylamine were added. These compounds were dissolved in 18 mL of pyridine, followed by heating at 110° C. for 3 h under reflux. After a reaction solution was cooled to room temperature, 10 mL of water was added to the reaction solution, followed by stirring for 30 minutes. Furthermore, 20 mL of water was added to the reaction solution, whereby a solid component was precipitated. The precipitated solid component was filtered out. The filtered-out solid component was purified by silica gel column chromatography (a developing solvent was toluene only) and an obtained purified substance was reprecipitated with heptane. The obtained precipitate was vacuum-dried at 100° C. for 3 h, whereby a target compound, that is, (OBu)$_8$NcSi(OPO-(3,5-bisCF$_3$-Ph)$_2$)$_2$ (Compound (A-10)) was obtained. The amount of the obtained target compound was 587 mg and the yield thereof was 78%.

The obtained target compound was identified by $^1$HNMR and MALDI-TOF-MS. Results were as illustrated below.

$^1$HNMR (400 MHz, C$_6$D$_6$): δ (ppm)=9.10 (8H), 7.56 (8H), 6.83 (4H), 5.98 (8H), 5.14 (16H), 2.25 (16H), 1.61 (16H), 0.96 (24H)

MALDI-TOF-MS measured value: m/z=2,295.15 (M$^+$)

The chemical formula for the target compound is C$_{112}$H$_{100}$F$_{24}$N$_8$O$_{12}$P$_2$Si and the exact mass thereof is 2,294.63.

From the above results, it could be confirmed that the target compound was obtained by the above synthesis procedure.

The obtained target compound was dissolved in tetrahydrofuran and was measured for absorption spectrum. Results were as illustrated in FIG. 6. As illustrated in FIG. 6, the wavelength of an absorption peak in the near-infrared region was 936 nm. Thus, it was clear that the compound obtained in Example 5 was a material having an absorption maximum wavelength in the near-infrared region.

Example 6

Synthesis of (OPr)$_8$NcSi(OPO-(4-CN-Ph)$_2$)$_2$

A compound, (OPr)$_8$NcSi(OPO-(4-CN-Ph)$_2$)$_2$, represented by the following formula was synthesized in accordance with Steps (9) and (10) below.

(7)

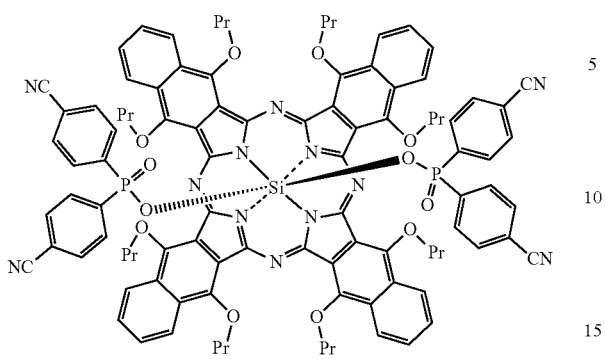

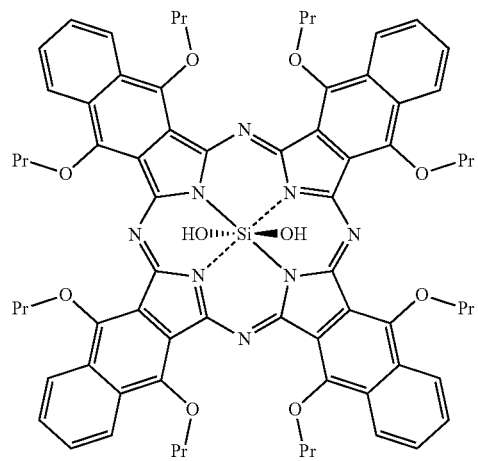

(A-12)

Step (9): Synthesis of (OPr)₈NcSi(OH)₂ (Compound (A-12))

Compound (A-12) was synthesized with reference to Non-Patent Document 3.

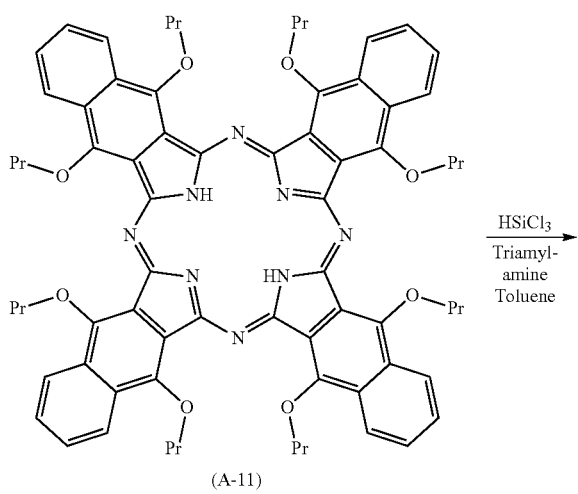

(A-11)

To a 50 mL reaction vessel filled with argon, 50 mg of (OPr)₈H₂Nc (Compound (A-11)), 5 mL of triamylamine and 25 mL of dehydrated toluene were added and 0.5 mL of HSiCl₃ was further added, followed by heating at 90° C. for 24 h under reflux.

A reaction solution was cooled to room temperature and 20 mL of distilled water was added to the reaction solution, followed by stirring for 1 h. The reaction solution was extracted with 60 mL of toluene four times. An extracted organic layer was washed with distilled water and was then concentrated, whereby 48 mg of a crude product was obtained. The obtained crude product was purified with a neutral alumina column, whereby a brown solid target compound, that is, (OPr)₆NcSi(OH)₂ (Compound (A-12)) was obtained. The amount of the obtained target compound was 25 mg and the yield thereof was 49%.

Step (10): Synthesis of (OPr)₃NcSi(OPO-(4-CN-Ph)₂)₂ (Compound (A-13))

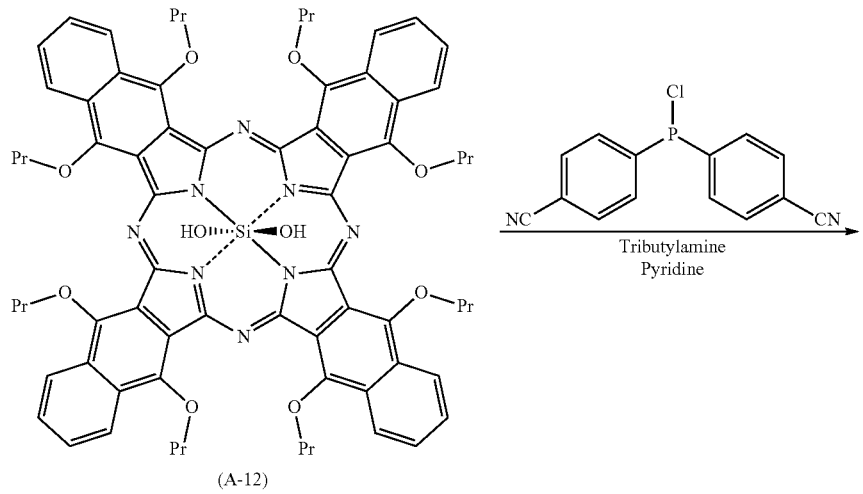

(A-12)

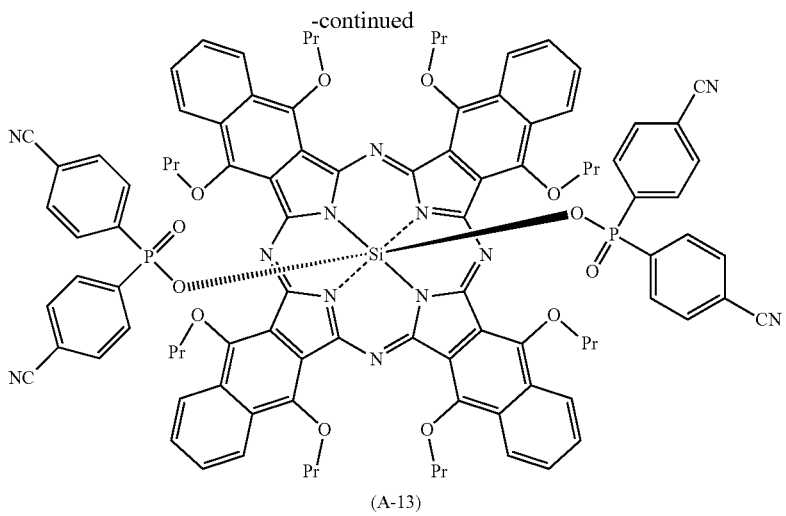

(A-13)

To a 50 mL reaction vessel filled with argon, 0.33 g of (OPr)$_8$NcSi(OH)$_2$ (Compound (A-12)) synthesized in Step (9) and 0.91 g of bis(4-cyanophenyl)chlorophosphine were added. These compounds were dissolved in 20 mL of pyridine and 3.3 mL of tributylamine was further added, followed by heating at 110° C. for 11 h under reflux. After a reaction solution was cooled to room temperature, the reaction solution was concentrated. The concentrate was dissolved in toluene, followed by removing insoluble matter by filtration. After the filtrate was concentrated and was solidified, the solid was purified by silica gel column chromatography (a developing solvent was toluene only). The developing solvent containing a purified substance dissolved therein was concentrated and was solidified, whereby a solid component was obtained. The obtained solid component was vacuum-dried at 60° C. for 3 h, whereby a target compound, that is, (OPr)$_8$NcSi(OPO-(4-CN-Ph)$_2$)$_2$ (Compound (A-13)) was obtained. The amount of the obtained target compound was 0.137 g and the yield thereof was 29%.

The obtained target compound was identified by $^1$HNMR and MALDI-TOF-MS. Results were as illustrated below.

$^1$HNMR (400 MHz, CDCl$_3$); δ (ppm)=9.00 (8H), 7.99 (8H), 6.74 (8H), 5.82 (8H), 5.09 (16H), 2.31 (16H), 1.25 (24H)

MALDI-TOF-MS measured value: m/z=1,738.16 (M$^+$)

The chemical formula for the target compound is C$_{100}$H$_{88}$N$_{12}$O$_{12}$P$_2$Si and the exact mass thereof is 1,738.59.

From the above results, it could be confirmed that the target compound was obtained by the above synthesis procedure.

Comparative Example 1

Synthesis of Sn(OSiHex$_3$)$_2$Nc

A compound, Sn(OSiHex$_3$)$_2$Nc, represented by the following formula was synthesized in accordance with Steps (11) to (13) below:

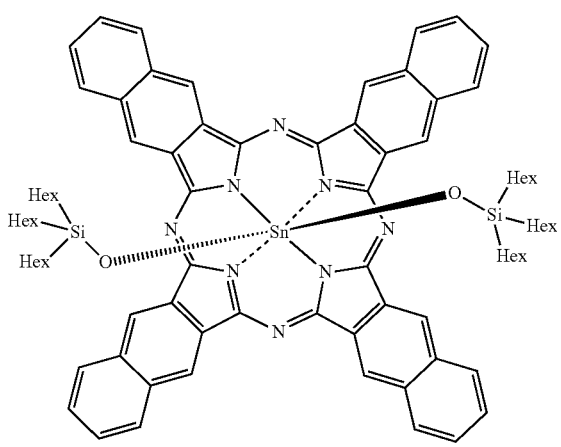

(8)

Step (11): Synthesis of (C$_6$H$_{13}$)$_3$SiOH (Compound (A-15))

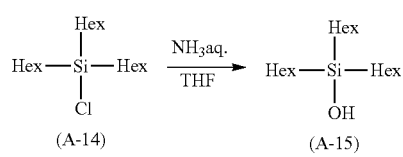

Into a three-necked flask, 15 g of SiCl(C$_6$H$_{13}$)$_3$ (Compound (A-14)) and 75 mL of THF were put. The three-necked flask was put into a cooling bath filled with water and ice and was cooled to 10° C. or lower. Into a dropping funnel, 75 mL of ammonia water was poured. All the ammonia water was added dropwise to the three-necked flask over ten minutes, followed by stirring at room temperature for 2 h.

Subsequently, 150 mL of ethyl acetate and 150 mL of city water were added to the three-necked flask, followed by stirring for ten minutes and then liquid separation using a separatory funnel, whereby an organic layer was separated.

To a separated aqueous layer, 150 mL of ethyl acetate was added, followed by extracting reaction products in the aqueous layer with ethyl acetate. The extraction with ethyl acetate was carried out twice. To the organic layer obtained by separation and extraction, 150 mL of a saturated aqueous solution of ammonium chloride was added, followed by separatory washing three times. To the organic layer, 150 mL of city water was added, followed by separatory washing once. Subsequently, 150 mL of a saturated saline solution was added to the organic layer, followed by separatory washing. After the organic layer obtained by washing was dried with magnesium sulfate, the magnesium sulfate was filtered off. An obtained filtrate was concentrated under reduced pressure and obtained residue was vacuum-dried at 60° C., whereby a target compound, that is, $(C_6H_{13})_3SiOH$ (Compound (A-15)) was obtained. The amount of the obtained target compound was 13.8 g and the yield thereof was 97%.

Step (12): Synthesis of $Sn(OH)_2N$ (Compound (A-17))

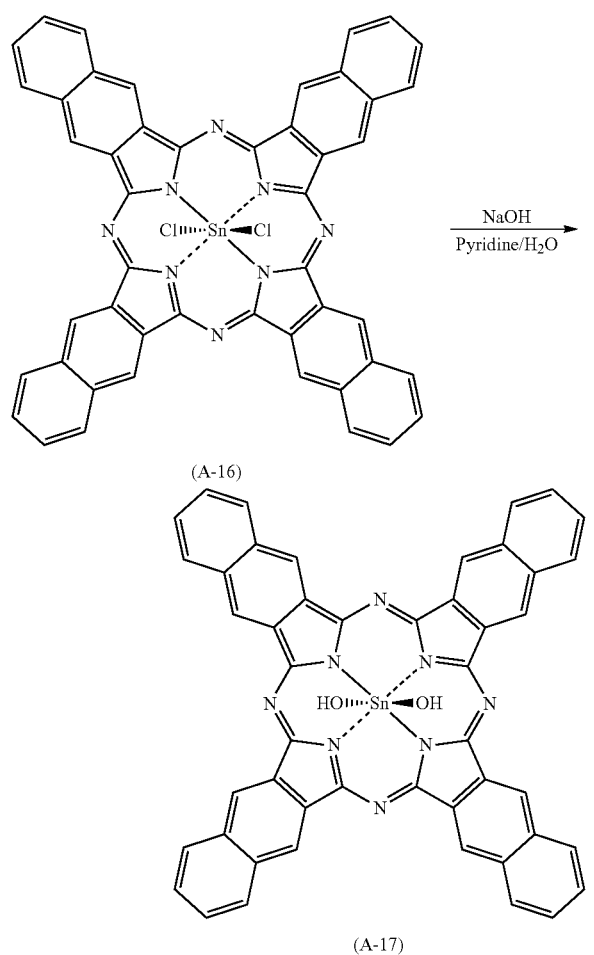

To a three-necked flask, 6.2 g of $SnCl_2Nc$ (Compound (A-16)), 1.1 g of sodium hydroxide, 45 mL of pyridine, and 90 mL of distilled water were added in that order, followed by heating at 100° C. for 25 h under reflux. After heating, a reaction solution was cooled to room temperature, whereby a crude product was precipitated. The precipitated crude product was filtered out. The filtered-out crude product was suspended and washed with 300 mL of distilled water. After a solid obtained by suspension and washing was filtered out, the filtered-out solid was vacuum-dried at 40° C. for 5 h, whereby a target compound, that is, $Sn(OH)_2Nc$ (Compound (A-17)) was obtained. The amount of the obtained target compound was 7.5 g and the yield thereof was 86%.

Step (13): Synthesis of $Sn(OSiHex_3)_2Nc$ (Compound (A-18))

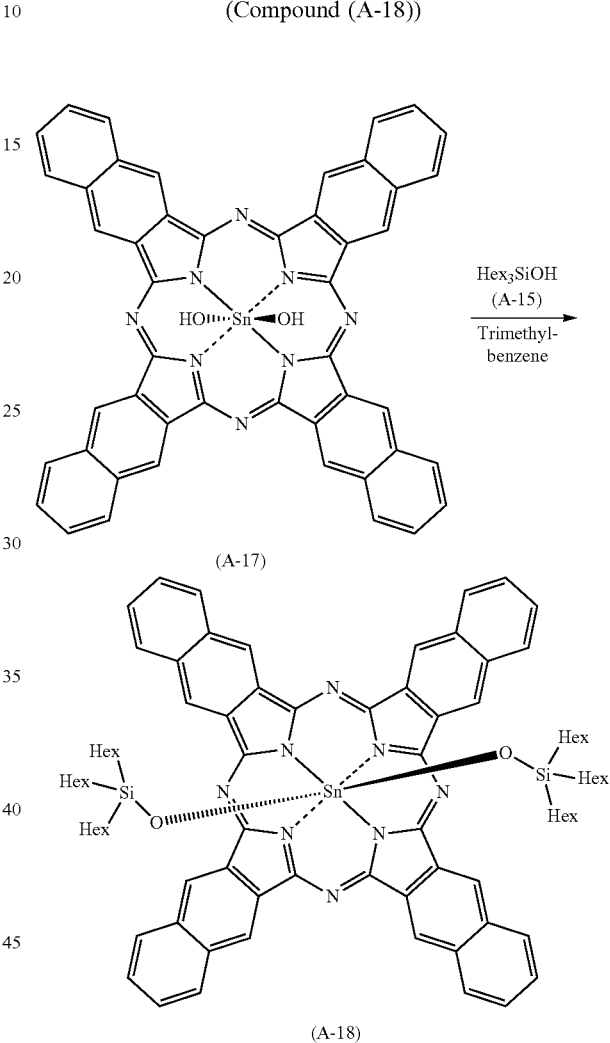

A 500 mL three-necked flask equipped with a ribbon heater and a cooling tube was installed. Into the three-necked flask, 5.1 g of $Sn(OH)_2Nc$ (Compound (A-17)) synthesized in Step (12), 13.8 g of $(C_6H_{13})_3SiOH$ (Compound (A-15)) synthesized in Step (11), and 450 mL of 1,2,4-trimethylbenzene were put, followed by heating and stirring at 200° C. for 3 h. After a reaction solution was cooled to room temperature, the reaction solution was cooled at 0° C. for about 3 h, whereby a crude product was precipitated. The precipitated crude product was filtered out. The filtered-out crude product was suspended and washed with 100 mL of ethanol twice. After the ethanol used for washing was washed with 50 mL of acetone and a target substance in the ethanol was reprecipitated, the precipitated target substance was filtered out. A solid of the obtained target substance was vacuum-dried at 120° C. for 3 h, whereby a target compound, that is, $Sn(OSiHex_3)_2Nc$ (Compound (A-18)) was obtained. The amount of the obtained target compound was 6.9 g and the yield thereof was 82%.

The obtained target compound was identified by $^1$HNMR and MALDI-TOF-MS. Results were as illustrated below.

$^1$HNMR (400 MHz, $C_6D_6$): δ (ppm)=10.2 (8H), 8.27 (8H), 7.47 (8H), 0.68 (12H), 0.5 to 0.2 (42H), −0.42 (12H), −1.42 (12H)

MALDI-TOF-MS measured value: m/z=1,428.69 ($M^+$)

The chemical formula for the target compound is $C_{84}H_{102}N_6O_2Si_2Sn$ and the exact mass thereof is 1,430.7.

From the above results, it could be confirmed that the target compound was obtained by the above synthesis procedure.

The obtained target compound was dissolved in chlorobenzene and was measured for absorption spectrum. Results were as illustrated in FIG. 6. As illustrated in FIG. 6, the wavelength of an absorption peak in the near-infrared region was 794 nm. Thus, it was clear that the compound obtained in Comparative Example 1 was a material having an absorption maximum wavelength in the near-infrared region.

Near-Infrared Photoelectric Conversion Film

A near-infrared photoelectric conversion film according to the present disclosure is further described below in detail with reference to Examples 7 to 12 and Comparative Example 2.

Example 7

A support substrate, made of quartz glass, having a thickness of 0.7 mm was used. The support substrate was coated with a chloroform mixed solution containing $(OBu)_8NcSi(OPOPh_2)_2$ (Compound (A-3)) obtained in Example 1 and a [6,6]-phenyl-C61-butyric acid methyl ester (PCBM) derivative mixed at a weight ratio of 1:9 by a spin coating method, whereby a near-infrared photoelectric conversion film having a thickness of 216 nm and an ionization potential of 4.95 eV was obtained.

Method for Measuring Absorption Spectrum

The obtained near-infrared photoelectric conversion film was measured for absorption spectrum using a spectrophotometer, U4100, available from Hitachi High-Technologies Corporation. The wavelength used to measure the absorption spectrum was from 400 nm to 1,200 nm. Results were as illustrated in FIG. 7A.

Figure 7A:
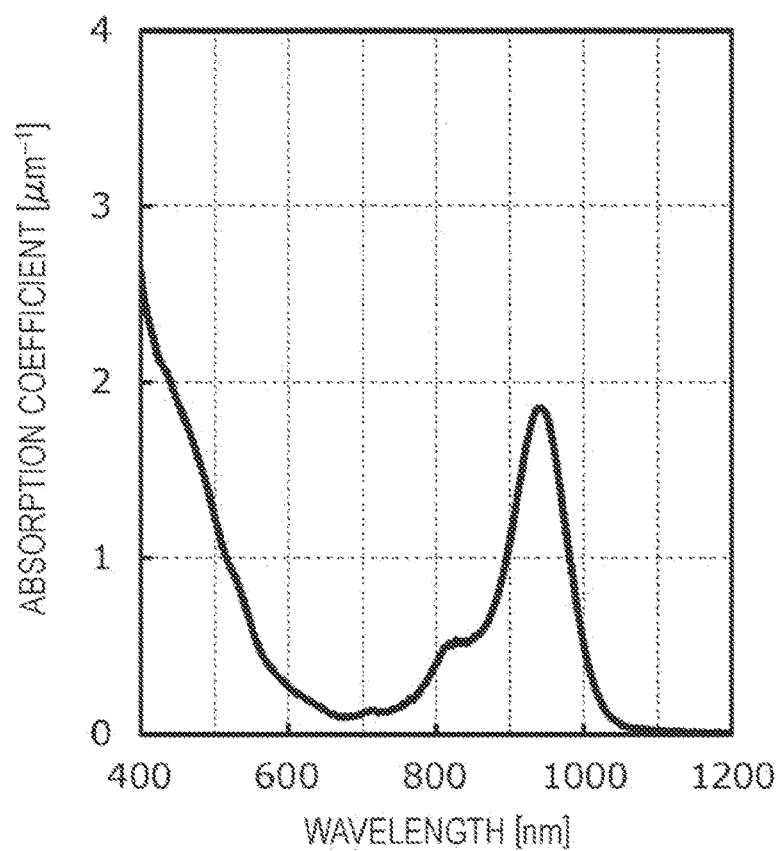
FIG. 7A is a graph illustrating the absorption spectrum of a near-infrared photoelectric conversion film obtained in Example 7.

As illustrated in FIG. 7A, the near-infrared photoelectric conversion film obtained in Example 7 had an absorption peak at about 942 nm.

Method for Measuring Ionization Potential

Figure 7B:
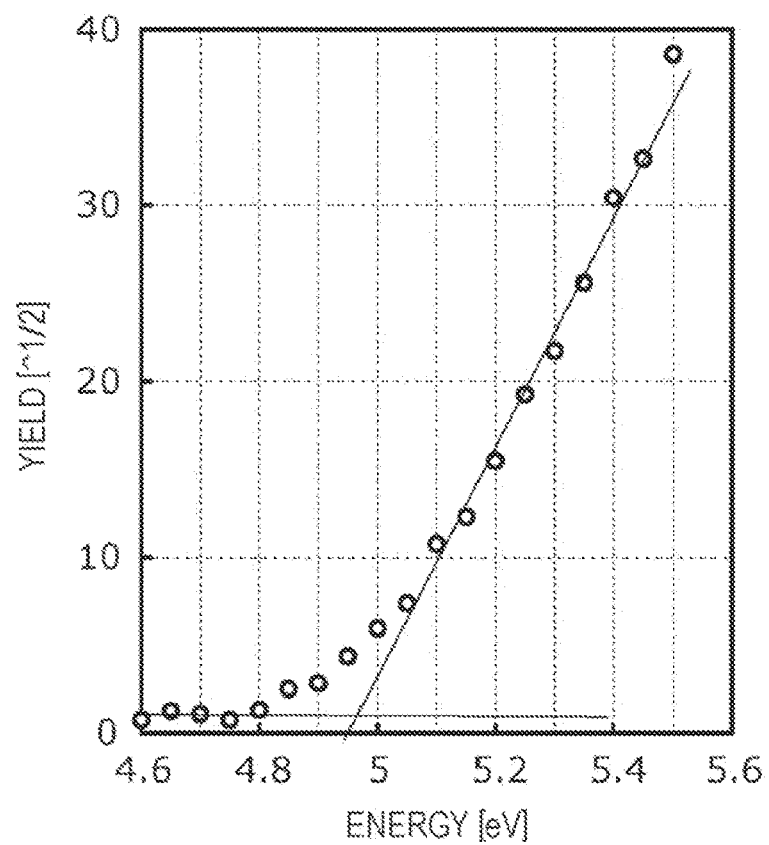
FIG. 7B is a graph illustrating results of the photoelectron spectroscopic measurement of the near-infrared photoelectric conversion film obtained in Example 7.

The near-infrared photoelectric conversion film obtained in Example 7 was measured for ionization potential. The ionization potential thereof was measured in such a manner that the compound obtained in Example 1 was formed into a film on an ITO substrate and the film was measured in air using a photoelectron spectrometer, AC-3, available from Riken Keiki Co., Ltd. Results were as illustrated in FIG. 7B.

The ionization potential is measured in terms of the number of photoelectrons detected by changing the energy of applied ultraviolet rays. Therefore, the energy position that photoelectrons begin to be detected can be taken as the ionization potential. In FIG. 7B, an intersection of two straight lines is the energy position that photoelectrons begin to be detected.

Example 8

Figure 8A:
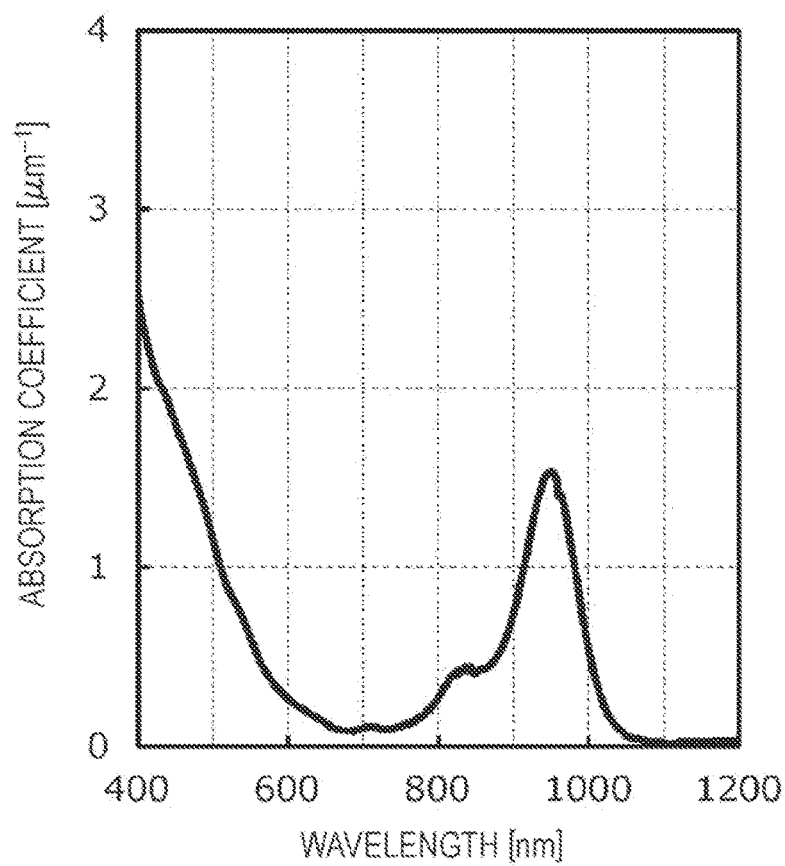
FIG. 8A is a graph illustrating the absorption spectrum of a near-infrared photoelectric conversion film obtained in Example 8.
Figure 8B:
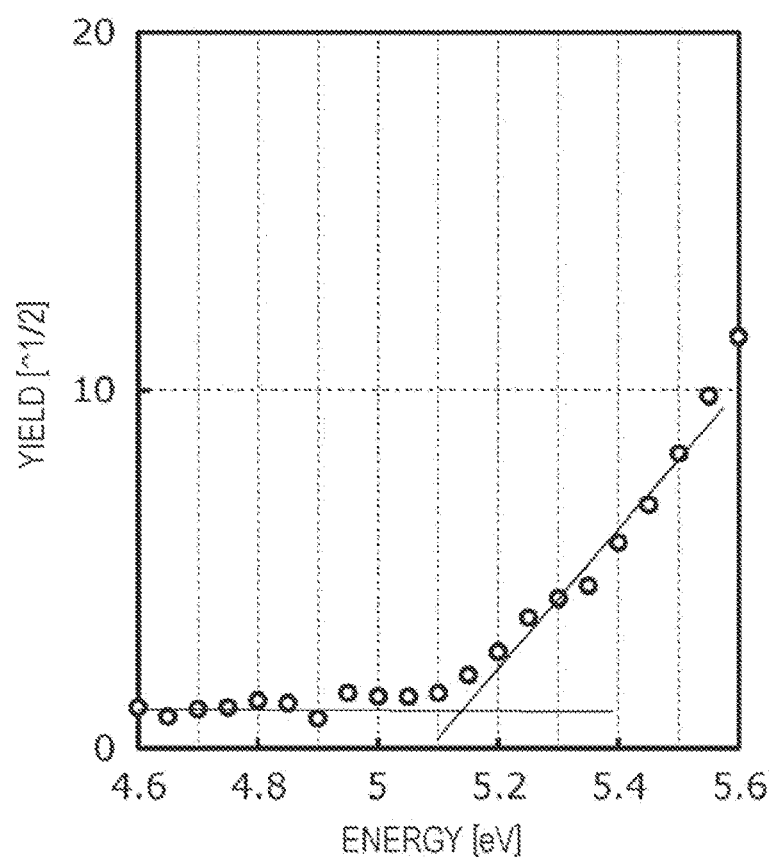
FIG. 8B is a graph illustrating results of the photoelectron spectroscopic measurement of the near-infrared photoelectric conversion film obtained in Example 8.

A support substrate, made of quartz glass, having a thickness of 0.7 mm was used. The support substrate was coated with a chloroform mixed solution containing $(OBu)_8NcSi(OPO-(4-F-Ph)_2)_2$ (Compound (A-4)) obtained in Example 2 and a [6,6]-phenyl-C61-butyric acid methyl ester (PCBM) derivative mixed at a weight ratio of 1:9 by a spin coating method, whereby a near-infrared photoelectric conversion film having a thickness of 220 nm and an ionization potential of 5.12 eV was obtained. The obtained near-infrared photoelectric conversion film was measured for absorption spectrum by the same method as that used in Example 7. Results were as illustrated in FIG. 8A. The near-infrared photoelectric conversion film was measured for ionization potential by substantially the same method as that used in Example 7 except that the compound obtained in Example 2 was used. Results were as illustrated in FIG. 8B.

As illustrated in FIG. 8A, the near-infrared photoelectric conversion film obtained in Example 8 had an absorption peak at about 952 nm.

Example 9

Figure 9A:
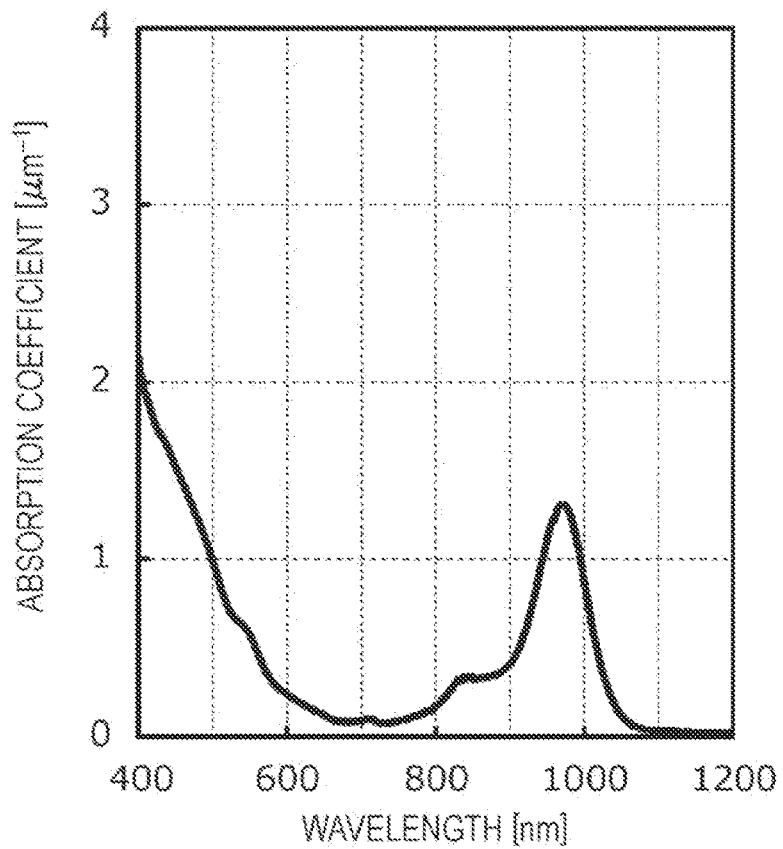
FIG. 9A is a graph illustrating the absorption spectrum of a near-infrared photoelectric conversion film obtained in Example 9.
Figure 9B:
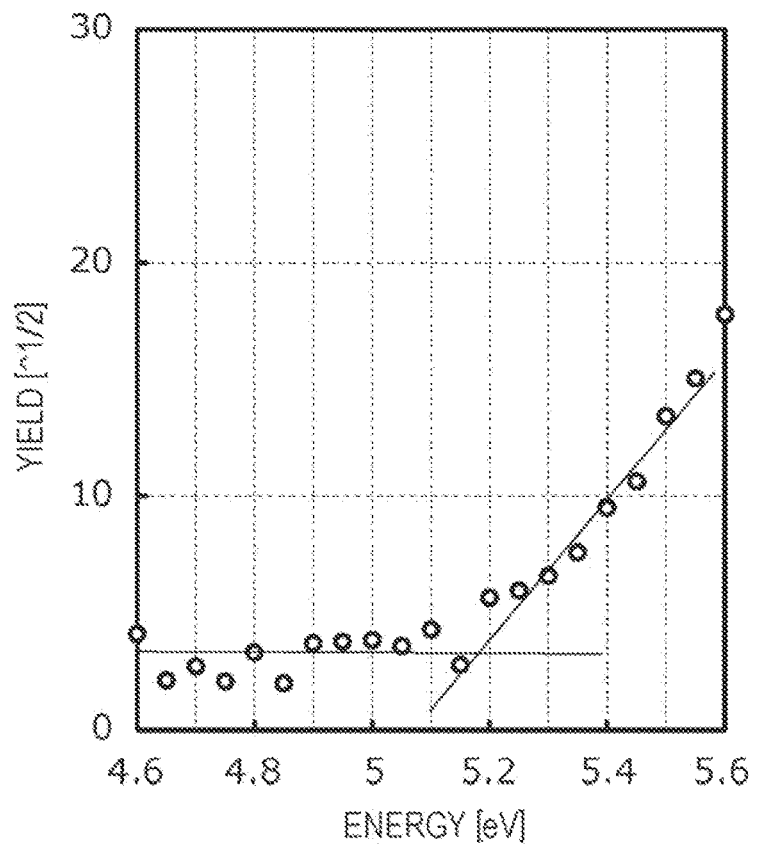
FIG. 9B is a graph illustrating results of the photoelectron spectroscopic measurement of the near-infrared photoelectric conversion film obtained in Example 9.

A support substrate, made of quartz glass, having a thickness of 0.7 mm was used. The support substrate was coated with a chloroform mixed solution containing $(OBu)_8NcSi(OPO-(3,5-diF-Ph)_2)_2$ (Compound (A-8)) obtained in Example 3 and a [6,6]-phenyl-C61-butyric acid methyl ester (PCBM) derivative mixed at a weight ratio of 1:9 by a spin coating method, whereby a near-infrared photoelectric conversion film having a thickness of 279 nm and an ionization potential of 5.17 eV was obtained. The obtained near-infrared photoelectric conversion film was measured for absorption spectrum by the same method as that used in Example 7. Results were as illustrated in FIG. 9A. The near-infrared photoelectric conversion film was measured for ionization potential by substantially the same method as that used in Example 7 except that the compound obtained in Example 3 was used. Results were as illustrated in FIG. 9B.

As illustrated in FIG. 9A, the near-infrared photoelectric conversion film obtained in Example 9 had an absorption peak at about 970 nm.

Example 10

Figure 10A:
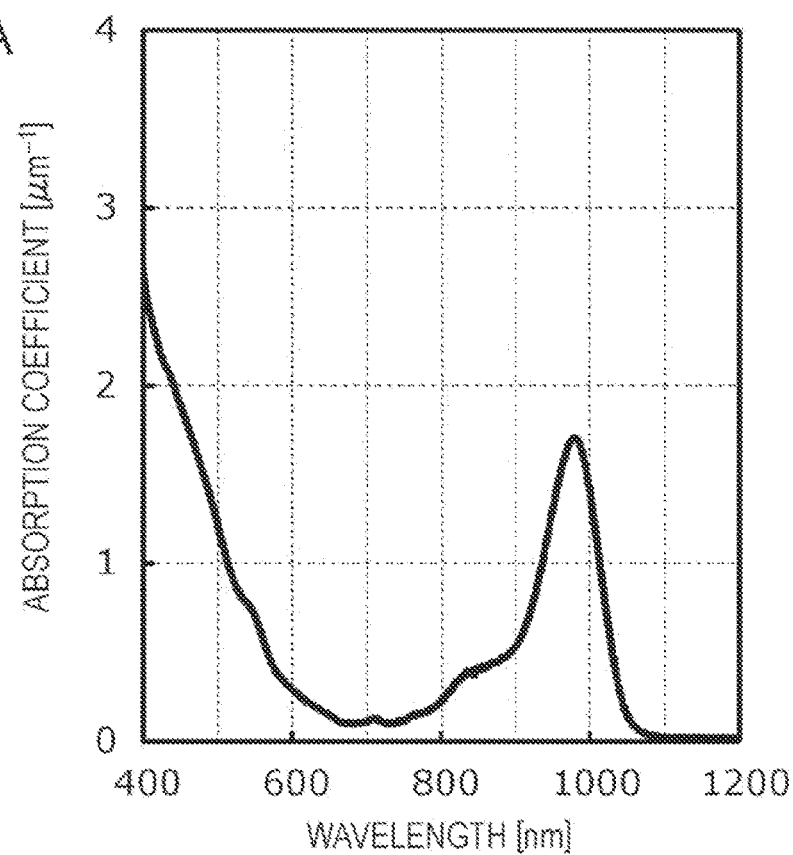
FIG. 10A is a graph illustrating the absorption spectrum of a near-infrared photoelectric conversion film obtained in Example 10.
Figure 10B:
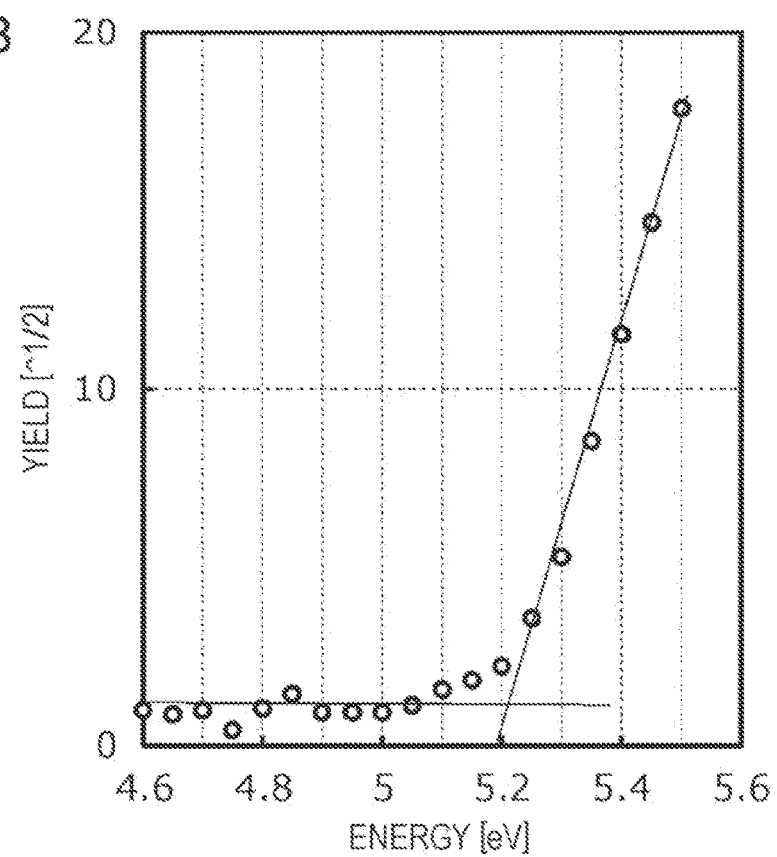
FIG. 10B is a graph illustrating results of the photoelectron spectroscopic measurement of the near-infrared photoelectric conversion film obtained in Example 10.

A support substrate, made of quartz glass, having a thickness of 0.7 mm was used. The support substrate was coated with a chloroform mixed solution containing $(OBu)_8NcSi(OPO-(4-CF_3-Ph)_2)_2$ (Compound (A-9)) obtained in Example 4 and a [6,6]-phenyl-C61-butyric acid methyl ester (PCBM) derivative mixed at a weight ratio of 1:9 by a spin coating method, whereby a near-infrared photoelectric conversion film having a thickness of 225 nm and an ionization potential of 5.20 eV was obtained. The obtained near-infrared photoelectric conversion film was measured for absorption spectrum by the same method as that used in Example 7. Results were as illustrated in FIG. 10A. The near-infrared photoelectric conversion film was measured for ionization potential by substantially the same method as that used in Example 7 except that the compound obtained in Example 4 was used. Results were as illustrated in FIG. 10B.

As illustrated in FIG. 10A, the near-infrared photoelectric conversion film obtained in Example 10 had an absorption peak at about 978 nm.

Example 11

Figure 11A:
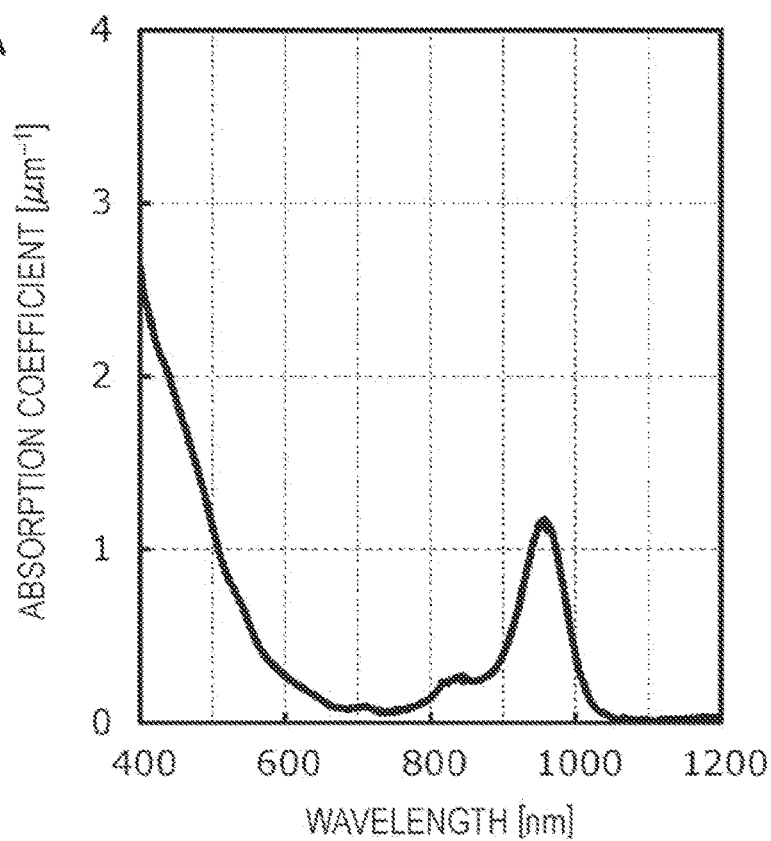
FIG. 11A is a graph illustrating the absorption spectrum of a near-infrared photoelectric conversion film obtained in Example 11.
Figure 11B:
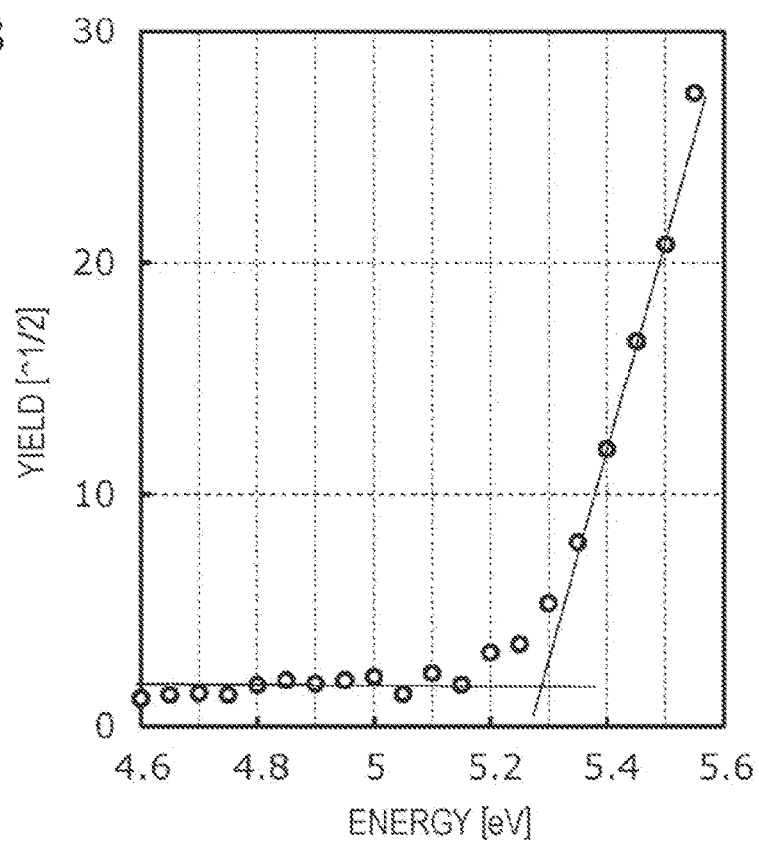
FIG. 11B is a graph illustrating results of the photoelectron spectroscopic measurement of the near-infrared photoelectric conversion film obtained in Example 11.

A support substrate, made of quartz glass, having a thickness of 0.7 mm was used. The support substrate was coated with a chloroform mixed solution containing $(OBu)_8$ $NcSi(OPO-(3,5-bisCF_3-Ph)_2)_2$ (Compound (A-10)) obtained in Example 5 and a [6,6]-phenyl-C61-butyric acid methyl ester (PCBM) derivative mixed at a weight ratio of 1:9 by a spin coating method, whereby a near-infrared photoelectric conversion film having a thickness of 216 nm and an ionization potential of 5.29 eV was obtained. The obtained near-infrared photoelectric conversion film was measured for absorption spectrum by the same method as that used in Example 7. Results were as illustrated in FIG. 11A. The near-infrared photoelectric conversion film was measured for ionization potential by substantially the same method as that used in Example 7 except that the compound obtained in Example 5 was used. Results were as illustrated in FIG. 11B.

As illustrated in FIG. 11A, the near-infrared photoelectric conversion film obtained in Example 11 had an absorption peak at about 956 nm.

Example 12

Figure 12A:
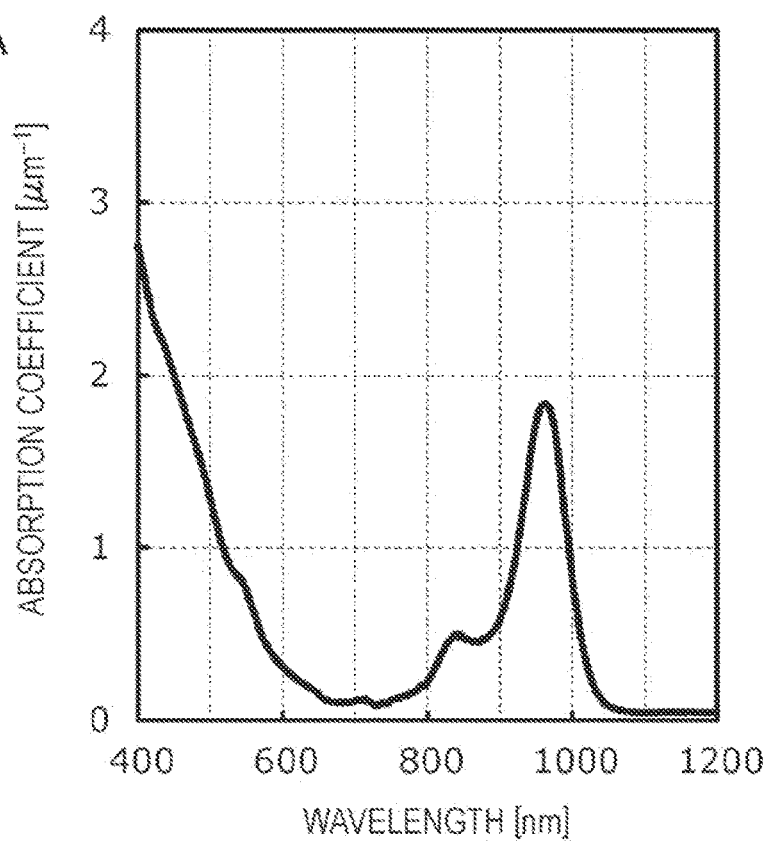
FIG. 12A is a graph illustrating the absorption spectrum of a near-infrared photoelectric conversion film obtained in Example 12.
Figure 12B:
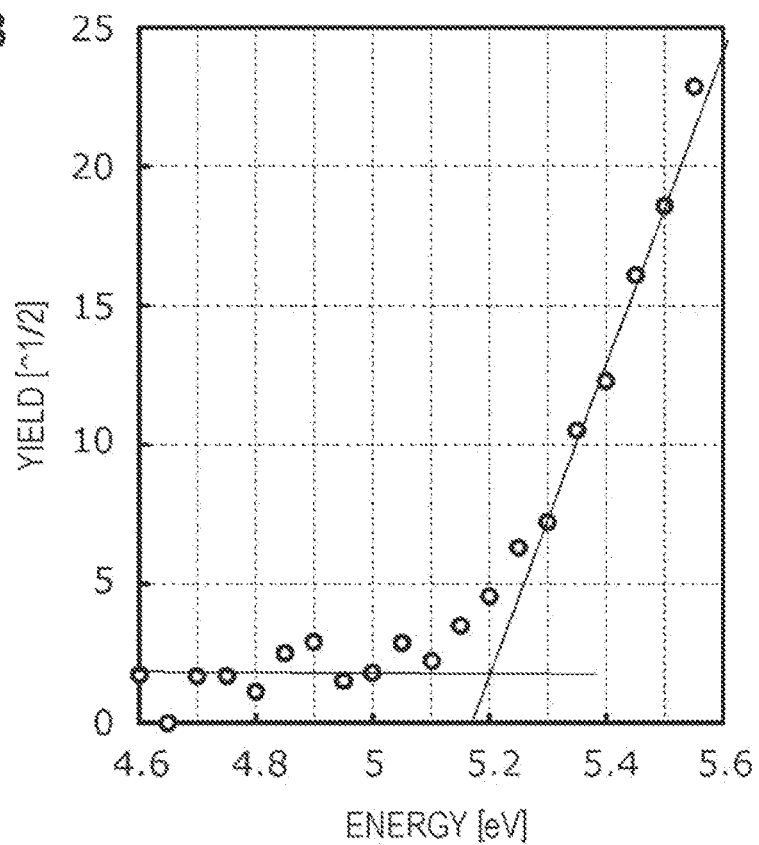
FIG. 12B is a graph illustrating results of the photoelectron spectroscopic measurement of the near-infrared photoelectric conversion film obtained in Example 12.

A support substrate, made of quartz glass, having a thickness of 0.7 mm was used. The support substrate was coated with a chloroform mixed solution containing $(OPr)_8$ $NcSi(OPO-(4-CN-Ph)_2)_2$ (Compound (A-13)) obtained in Example 6 and a [6,6]-phenyl-C61-butyric acid methyl ester (PCBM) derivative mixed at a weight ratio of 1:9 by a spin coating method, whereby a near-infrared photoelectric conversion film having a thickness of 214 nm and an ionization potential of 5.20 eV was obtained. The obtained near-infrared photoelectric conversion film was measured for absorption spectrum by the same method as that used in Example. Results were as illustrated in FIG. 12A. The near-infrared photoelectric conversion film was measured for ionization potential by substantially the same method as that used in Example 7 except that the compound obtained in Example 6 was used. Results were as illustrated in FIG. 12B.

As illustrated in FIG. 12A, the near-infrared photoelectric conversion film obtained in Example 12 had an absorption peak at about 962 nm.

Comparative Example 2

A support substrate, made of quartz glass, having a thickness of 0.7 mm was used. On the support substrate, $Sn(OSiHex_3)_2Nc$ (Compound (A-18)) obtained in Comparative Example 1 and fullerene (that is, C60) were vapor-deposited at a volume ratio of 1:9, whereby a near-infrared photoelectric conversion film having a thickness of 400 nm was obtained. The obtained near-infrared photoelectric conversion film was measured for absorption spectrum by the same method as that used in Example 7. Results were as illustrated in FIG. 13.

Figure 13:
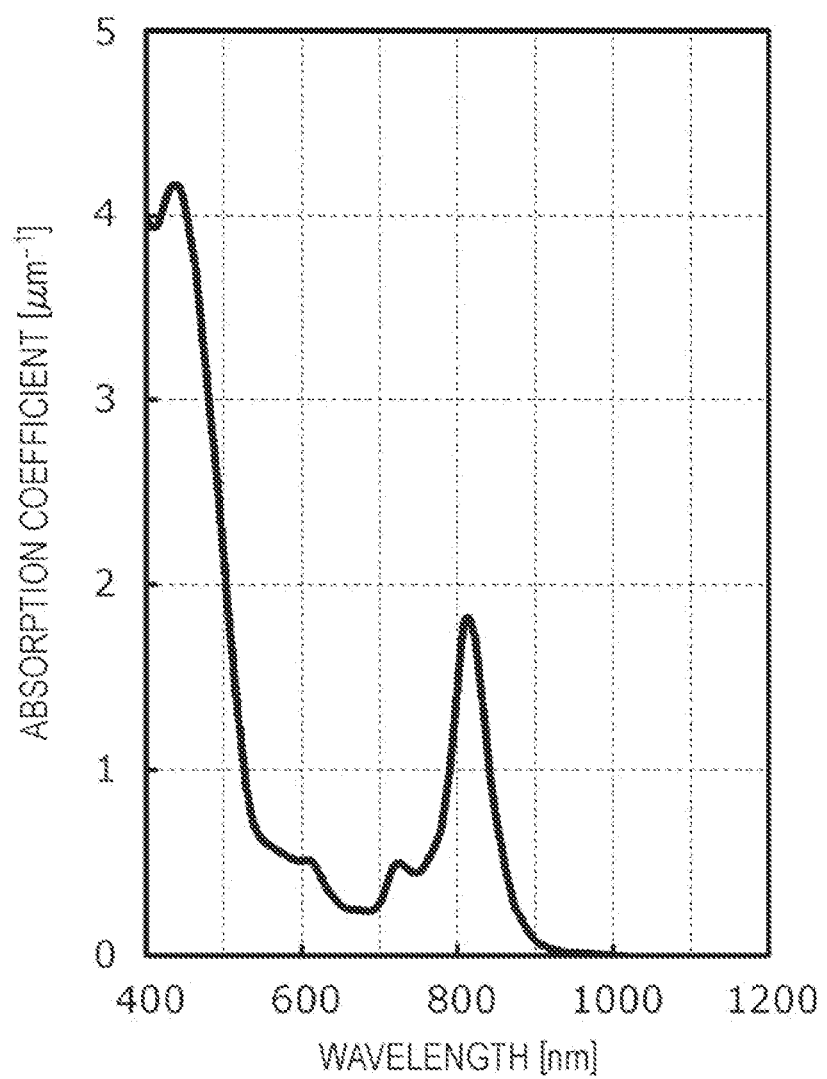
FIG. 13 is a graph illustrating the absorption spectrum of a near-infrared photoelectric conversion film obtained in Comparative Example 2.

As illustrated in FIG. 13, the near-infrared photoelectric conversion film obtained in Comparative Example 2 had an absorption peak at about 816 nm.

Near-Infrared Photoelectric Conversion Element

A near-infrared photoelectric conversion element according to the present disclosure is further described below in detail with reference to Examples 13 to 19 and Comparative Example 3.

Example 13

A substrate used was a glass substrate, provided with an ITO electrode with a thickness of 150 nm, having a thickness of 0.7 mm. The ITO electrode was used as a lower electrode. The ITO electrode was coated with a chloroform mixed solution containing $(OBu)_8NcSi(OPOPh_2)_2$ (Compound (A-3)) obtained in Example 1 and a PCBM derivative mixed at a weight ratio of 1:9 by a spin coating method, whereby a near-infrared photoelectric conversion film, that is, a mixed film was formed so as to have a thickness of 216 nm. Furthermore, an Al electrode serving as an upper electrode was formed on the near-infrared photoelectric conversion film so as to have a thickness of 80 nm, whereby a near-infrared photoelectric conversion element was obtained. The Al electrode was formed in a vacuum of less than or equal to $5.0\times10^{-4}$ Pa at a deposition rate of 1 Å/s.

Method for Measuring Spectral Sensitivity

The obtained near-infrared photoelectric conversion element was measured for spectral sensitivity using a long wavelength-sensitive spectral sensitivity measurement system, CEP-25RR, available from Bunkoukeiki Co., Ltd. In particular, the near-infrared photoelectric conversion element was introduced into a measurement jig capable of being hermetically sealed in a glove box under a nitrogen atmosphere and was measured for spectral sensitivity. Results were as illustrated in FIG. 14.

Figure 14:
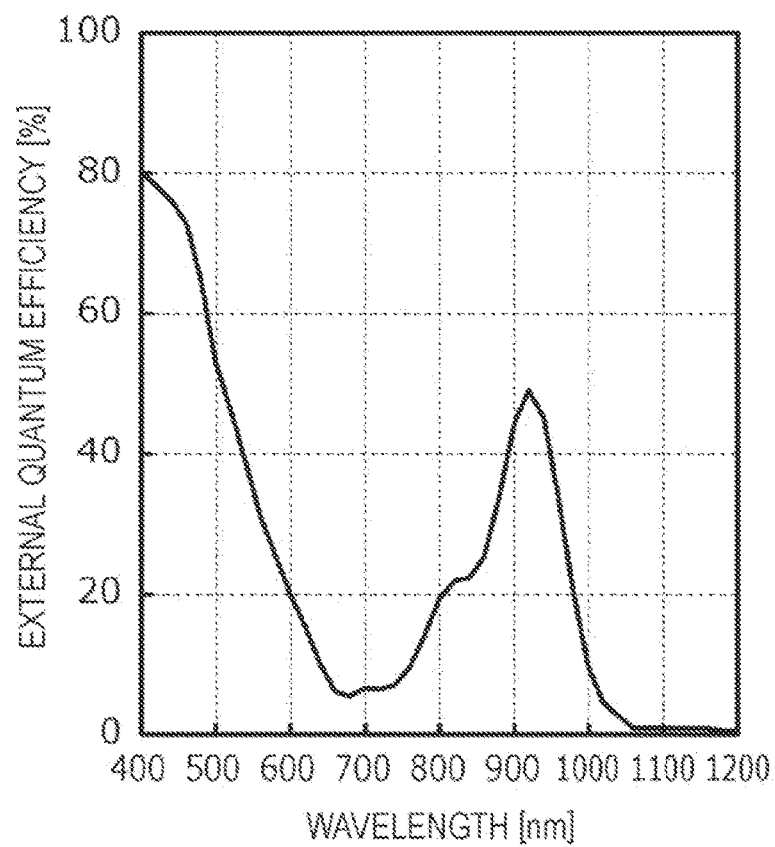
FIG. 14 is a graph illustrating measurement results of spectral sensitivity characteristics of a near-infrared photoelectric conversion element obtained in Example 13.

As illustrated in FIG. 14, the external quantum efficiency of the near-infrared photoelectric conversion element obtained in Example 13 in the near-infrared region was highest, about 49%, at a wavelength of about 920 nm.

Example 14

A near-infrared photoelectric conversion element including a near-infrared photoelectric conversion film with a thickness of 220 nm was obtained in substantially the same manner as that used in Example 13 except that $(OBu)_8NcSi$ $(OPO-(4-F-Ph)_2)_2$ (Compound (A-4)) obtained in Example 2 was used as material for a photoelectric conversion layer instead of the compound obtained in Example 1. The spectral sensitivity of the obtained near-infrared photoelectric conversion element was measured in the same manner as that used in Example 13. Results were as illustrated in FIG. 15.

Figure 15:
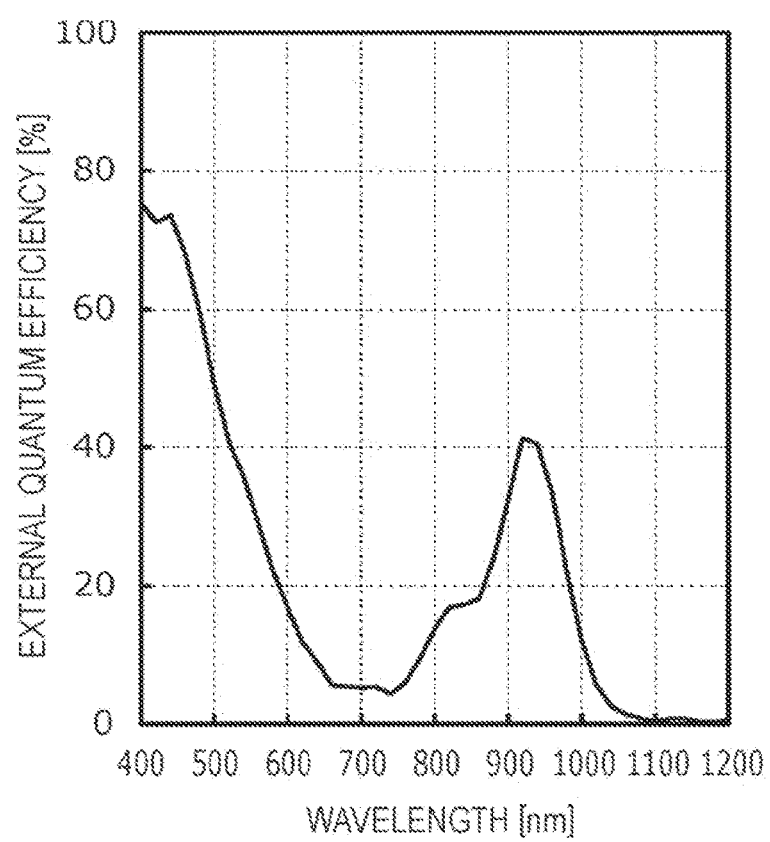
FIG. 15 is a graph illustrating measurement results of spectral sensitivity characteristics of a near-infrared photoelectric conversion element obtained in Example 14.

As illustrated in FIG. 15, the external quantum efficiency of the near-infrared photoelectric conversion element obtained in Example 14 in the near-infrared region was highest, about 41%, at a wavelength of about 920 nm.

Example 15

A near-infrared photoelectric conversion element including a near-infrared photoelectric conversion film with a thickness of 279 nm was obtained in substantially the same manner as that used in Example 13 except that $(OBu)_3NcSi$ $(OPO-(3,5-diF-Ph)_2)_2$ (Compound (A-8)) obtained in Example 3 was used as material for a photoelectric conversion layer instead of the compound obtained in Example 1. The spectral sensitivity of the obtained near-infrared photoelectric conversion element was measured in the same manner as that used in Example 13. Results were as illustrated in FIG. 16.

Figure 16:
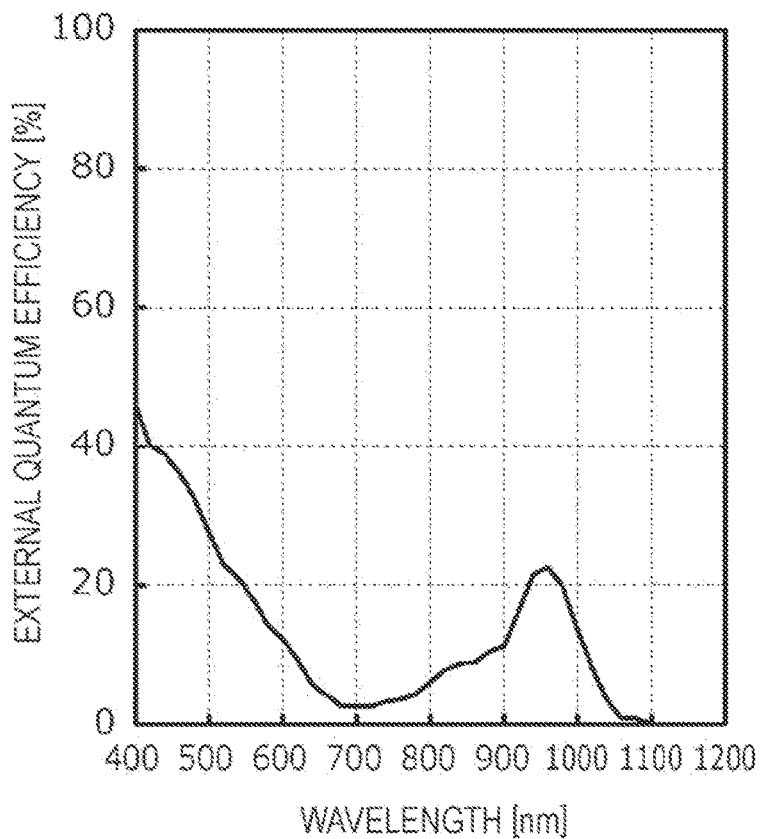
FIG. 16 is a graph illustrating measurement results of spectral sensitivity characteristics of a near-infrared photoelectric conversion element obtained in Example 15.

As illustrated in FIG. 16, the external quantum efficiency of the near-infrared photoelectric conversion element obtained in Example 15 in the near-infrared region was highest, about 23%, at a wavelength of about 960 nm.

Example 16

Figure 17:
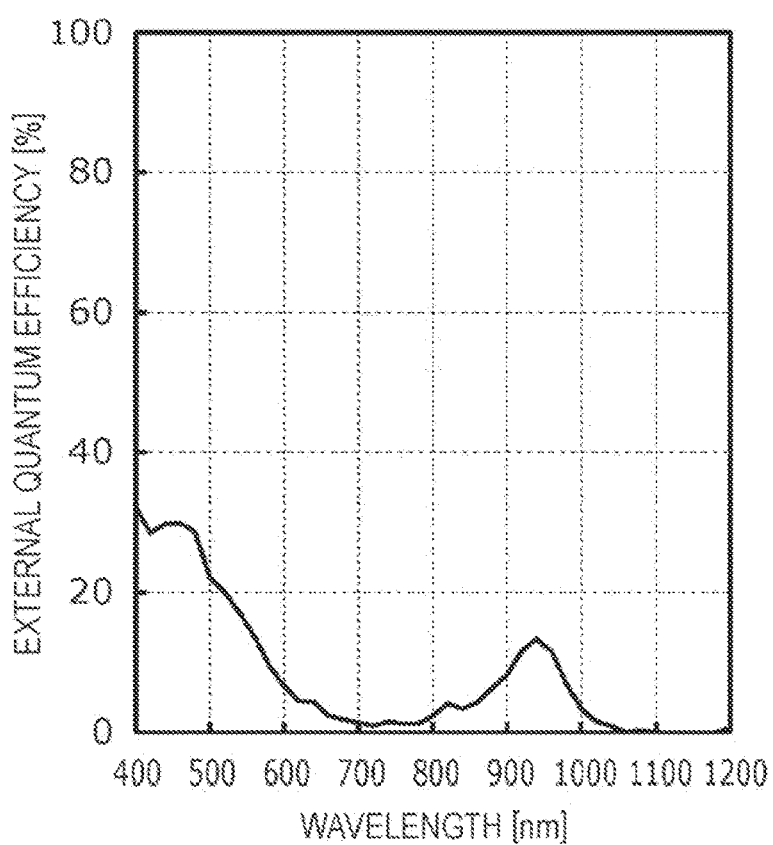
FIG. 17 is a graph illustrating measurement results of spectral sensitivity characteristics of a near-infrared photoelectric conversion element obtained in Example 16.

A near-infrared photoelectric conversion element including a near-infrared photoelectric conversion film with a thickness of 225 nm was obtained in substantially the same manner as that used in Example 13 except that (OBu)$_8$NcSi (OPO-(4-CF$_3$-Ph)$_2$)$_2$ (Compound (A-9)) obtained in Example 4 was used as material for a photoelectric conversion layer instead of the compound obtained in Example 1. The spectral sensitivity of the obtained near-infrared photoelectric conversion element was measured in the same manner as that used in Example 13. Results were as illustrated in FIG. 17, As illustrated in FIG. 17, the external quantum efficiency of the near-infrared photoelectric conversion element obtained in Example 16 in the near-infrared region was highest, about 12%, at a wavelength of about 960 nm.

Example 17

A near-infrared photoelectric conversion element including a near-infrared photoelectric conversion film with a thickness of 216 nm was obtained in substantially the same manner as that used in Example 13 except that (OBu)$_6$NcSi (OPO-(3,5-bisCF$_3$-Ph)$_2$)$_2$ (Compound (A-10)) obtained in Example 5 was used as material for a photoelectric conversion layer instead of the compound obtained in Example 1. The spectral sensitivity of the obtained near-infrared photoelectric conversion element was measured in the same manner as that used in Example 13. Results were as illustrated in FIG. 18.

Figure 18:
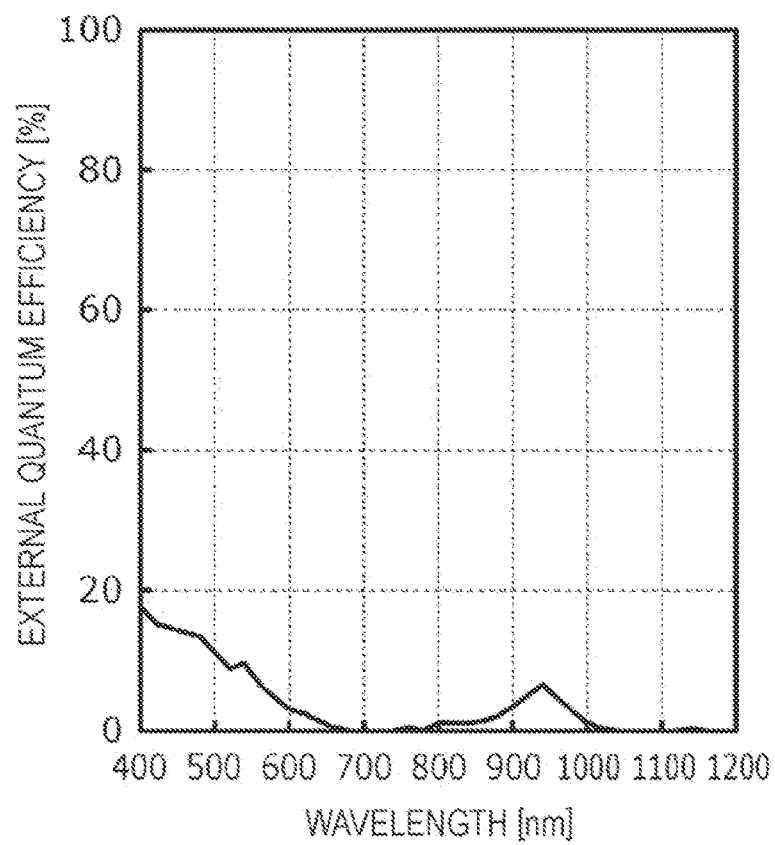
FIG. 18 is a graph illustrating measurement results of spectral sensitivity characteristics of a near-infrared photoelectric conversion element obtained in Example 17.

As illustrated in FIG. 18, the external quantum efficiency of the near-infrared photoelectric conversion element obtained in Example 17 in the near-infrared region was highest, about 7%, at a wavelength of about 940 nm.

Example 18

A near-infrared photoelectric conversion element including a near-infrared photoelectric conversion film with a thickness of 214 nm was obtained in substantially the same manner as that used in Example 13 except that (OPr)$_8$NcSi (OPO-(4-CN-Ph)$_2$)$_2$ (Compound (A-13)) obtained in Example 6 was used as material for a photoelectric conversion layer instead of the compound obtained in Example 1. The spectral sensitivity of the obtained near-infrared photoelectric conversion element was measured in the same manner as that used in Example 13. Results were as illustrated in FIG. 19.

Figure 19:
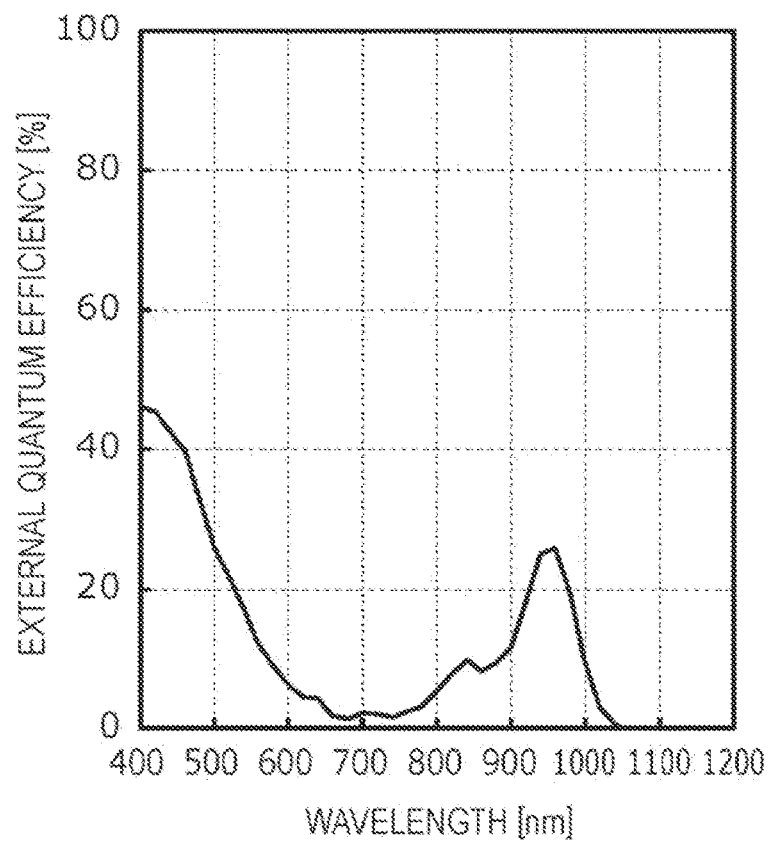
FIG. 19 is a graph illustrating measurement results of spectral sensitivity characteristics of a near-infrared photoelectric conversion element obtained in Example 18.

As illustrated in FIG. 19, the external quantum efficiency of the near-infrared photoelectric conversion element obtained in Example 18 in the near-infrared region was highest, about 26%, at a wavelength of about 960 nm.

Example 19

Near-infrared photoelectric conversion elements including a near-infrared photoelectric conversion film with a thickness of 223 nm, 224 nm, or 272 nm were obtained in substantially the same manner as that used in Example 13 except that (OBu)$_8$NcSi(OPO-(4-F-Ph)$_2$)$_2$ (Compound (A-4)) obtained in Example 2 and a [6,6]-phenyl-C61-butyric acid methyl ester (PCBM) derivative were used as material for a photoelectric conversion layer instead of the compound obtained in Example 1 and a chloroform mixed solution containing (OBu)$_8$NcSi(OPO-(4-F-Ph)$_2$)$_2$ and the PCBM derivative mixed at a weight ratio of 3:7, 5:5, or 9:1, respectively, rather than a weight ratio of 1:9 was applied by a spin coating method.

The obtained near-infrared photoelectric conversion elements were measured for spectral sensitivity in the same manner as that used in Example 13. Results of Examples 14 and 19 were as illustrated in Table 1, As illustrated in Table 1, the near-infrared photoelectric conversion elements obtained in Examples 14 and 19 had an external quantum efficiency of about 41%, 40%, 22%, or 3% at a wavelength of 920 nm.

This illustrated that a near-infrared photoelectric conversion film with a naphthalocyanine derivative concentration of less than or equal to 50% by weight exhibited sufficient photoelectric conversion characteristics.

TABLE 1

| Weight percentage in photoelectric conversion film | | Photoelectric conversion efficiency at 920 nm |
|---|---|---|
| Naphthalocyanine derivative Compound (A-4) | PCBM | |
| 10% by weight | 90% by weight | 41% |
| 30% by weight | 70% by weight | 40% |
| 50% by weight | 50% by weight | 22% |
| 90% by weight | 10% by weight | 3% |

Comparative Example 3

A near-infrared photoelectric conversion element including a near-infrared photoelectric conversion film with a thickness of 400 nm was obtained in substantially the same manner as that used in Example 13 except that Sn(OSi-Hex$_3$)$_2$ Nc (Compound (A-18)) obtained in Comparative Example 1 was used instead of the compound obtained in Example 1 and a fullerene compound was used instead of PCBM as material for a photoelectric conversion layer. The spectral sensitivity of the obtained near-infrared photoelectric conversion element was measured in the same manner as that used in Example 13. Results were as illustrated in FIG. 20.

Figure 20:
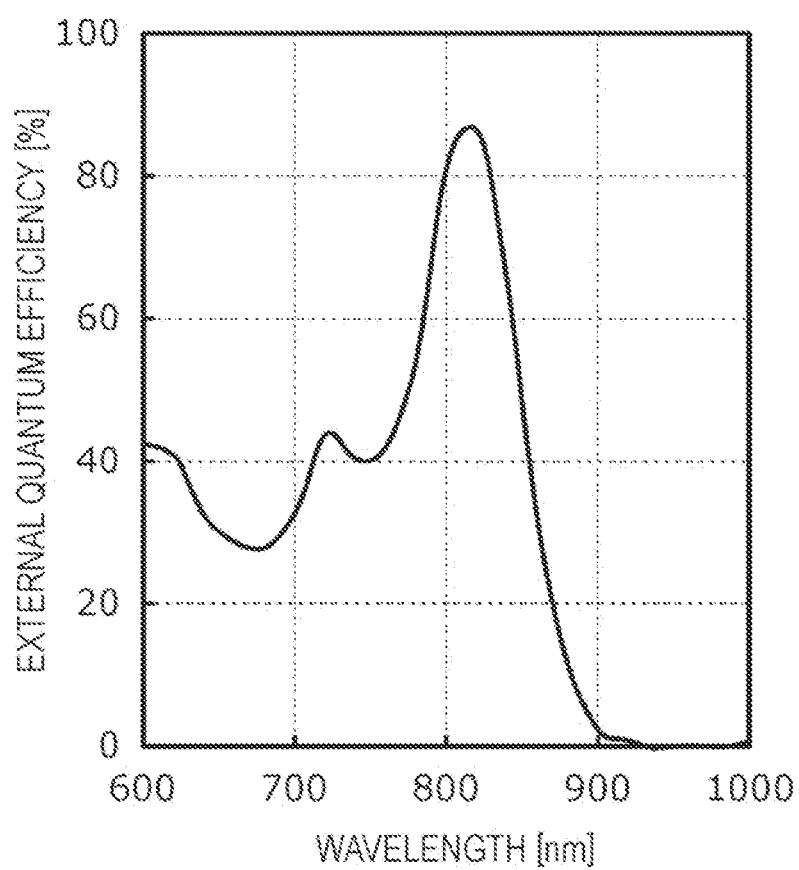
FIG. 20 is a graph illustrating measurement results of spectral sensitivity characteristics of a near-infrared photoelectric conversion element obtained in Comparative Example 3.

As illustrated in FIG. 20, the external quantum efficiency of the near-infrared photoelectric conversion element obtained in Comparative Example 3 was highest, about 84%, at a wavelength of about 820 nm. However, the external quantum efficiency thereof was low, less than 5%, at a wavelength of greater than or equal to 900 nm.

SUMMARY

As illustrated in FIG. 6, the naphthalocyanine derivative obtained in Example 1, 2, 3, 4, or 5 had an absorption peak at about 908 nm, 915 nm, 925 nm, 921 nm, or 936 nm, respectively, and the naphthalocyanine derivative obtained in Comparative Example 1 had an absorption peak at about 794 nm.

From results of the chemical structures and absorption spectra of these naphthalocyanine derivatives, it was clear that the presence or absence of a side chain at an α-position of a naphthalocyanine skeleton and the difference in structure between axial ligands caused differences between absorption characteristics of near-infrared photoelectric conversion films. It could be confirmed that a naphthalocyanine derivative having an alkoxy group at an α-position of a naphthalocyanine skeleton and axial ligands having phosphinate derivatives independently having an aryl group as a plurality of substituents bonded to a phosphorus atom had sensitivity to near-infrared light with a long wavelength as described in Examples 1 to 5.

As illustrated in FIGS. 7A to 12A, the near-infrared photoelectric conversion film obtained in Example 7, 8, 9, 10, 11, or 12 had an absorption peak at about 942 nm, 952 nm, 970 nm, 978 nm, 956 nm, or 962 nm, respectively, and an absorption coefficient of 1.8 µm$^{-1}$, 1.5 µm$^{-1}$, 1.3 µm$^{-1}$, 1.7 µm$^{-1}$, 1.2 µm$^{-1}$, or 1.8 µm$^{-1}$, respectively, at the absorption peak. As illustrated in FIG. 13, the near-infrared photoelectric conversion film containing the naphthalocyanine derivative obtained in Comparative Example 1, that is, the near-infrared photoelectric conversion film obtained in Comparative Example 2 had an absorption peak at about 816 nm and an absorption coefficient of 1.8 µm$^{-1}$ at the absorption peak.

From these results, it could be confirmed that using a composition containing a naphthalocyanine derivative having an alkoxy group at an α-position of a naphthalocyanine skeleton and axial ligands having phosphinate derivatives independently having an aryl group as a plurality of substituents bonded to a phosphorus atom as described in Examples 7 to 12 allowed a near-infrared photoelectric conversion film containing the composition to have sensitivity to near-infrared light with a longer wavelength as compared to the near-infrared photoelectric conversion film obtained in Comparative Example 2.

As illustrated in FIG. 7B, 8B, 9B, 10B, 11B, or 12B, the near-infrared photoelectric conversion film obtained in Example 7, 8, 9, 10, 11, or 12 had an ionization potential of 4.95 eV, 5.12 eV, 5.17 eV, 5.20 eV, 5.29 or 5.20 eV, respectively. Thus, it could be confirmed that a near-infrared photoelectric conversion film with an ionization potential of greater than or equal to 4.95 eV was obtained using a composition containing the naphthalocyanine derivative obtained in one of Examples 1 to 6. It was clear that increasing the number of fluorine atoms introduced into an axial ligand reduced the ionization potential of a near-infrared photoelectric conversion film (that is, increased the value of ionization potential). Furthermore, it was clear that introducing a cyano group into an axial ligand as a substituent reduced the ionization potential of a near-infrared photoelectric conversion film (that is, increased the value of ionization potential).

As illustrated in FIG. 14, the external quantum efficiency of the near-infrared photoelectric conversion element obtained in Example 13 in the near-infrared region was highest, about 49%, at a wavelength of about 920 nm.

As illustrated in FIG. 15, the external quantum efficiency of the near-infrared photoelectric conversion element obtained in Example 14 in the near-infrared region was highest, about 41%, at a wavelength of about 920 nm.

As illustrated in FIG. 16, the external quantum efficiency of the near-infrared photoelectric conversion element obtained in Example 15 in the near-infrared region was highest, about 23%, at a wavelength of about 960 nm.

As illustrated in FIG. 17, the external quantum efficiency of the near-infrared photoelectric conversion element obtained in Example 16 in the near-infrared region was highest, about 12%, at a wavelength of about 960 nm.

As illustrated in FIG. 18, the external quantum efficiency of the near-infrared photoelectric conversion element obtained in Example 17 in the near-infrared region was highest, about 7%, at a wavelength of about 940 nm.

As illustrated in FIG. 19, the external quantum efficiency of the near-infrared photoelectric conversion element obtained in Example 18 in the near-infrared region was highest, about 26%, at a wavelength of about 960 nm.

As illustrated in FIG. 20, the external quantum efficiency of the near-infrared photoelectric conversion element obtained in Comparative Example 3 was highest, about 84%, at a wavelength of about 820 nm. However, the external quantum efficiency thereof was low, less than 5%, at a wavelength of greater than or equal to 900 nm.

From results of the chemical structures and external quantum efficiencies of these materials, it was clear that the peak of external quantum efficiency was obtained at a relatively long wavelength of greater than or equal to 920 nm using a naphthalocyanine derivative, as obtained in one of Example 1 to 6, having Si as a central metal, an alkoxy group at an α-position of a naphthalocyanine skeleton, and axial ligands having phosphinate derivatives independently having an aryl group as a plurality of substituents bonded to a phosphorus atom as material for a near-infrared photoelectric conversion film.

As described above, the near-infrared photoelectric conversion films obtained in Examples 7 to 12 and Comparative Example 2 and the near-infrared photoelectric conversion elements obtained in Examples 13 to 19 and Comparative Example 3 were evaluated for near-infrared light absorption characteristics and photoelectric conversion efficiency. As a result, it could be confirmed that sensitivity to near-infrared light with a longer wavelength and high external quantum efficiency could be achieved using a composition containing a naphthalocyanine derivative, represented by Formula (1), having Si as a central metal, a propoxy or butoxy group in an α-side chain of a naphthalocyanine skeleton, and axial ligands having phosphinate derivatives independently having an aryl group as a plurality of substituents bonded to a phosphorus atom.

A composition, photoelectric conversion element, and imaging device according to the present disclosure have been described above with reference to embodiments and examples. The present disclosure is not limited to the embodiments or the examples. The scope of the present disclosure includes forms obtained by applying various modifications conceived by those skilled in the art without departing from the spirit of the present disclosure to the embodiments or the examples and other forms configured by combining constituent elements in some of the embodiments or the examples.

A composition and photoelectric conversion element according to the present disclosure may be used in a solar cell such that charges generated by light are extracted in the form of energy.

A composition according to the present disclosure may be used in films, sheets, glasses, building materials, and the like in the form of a near-infrared light-blocking material or may be used in combination with ink, resin, glass, or the like in the form of an infrared absorber.

A composition, photoelectric conversion element, and imaging device according to the present disclosure are applicable to image sensors and the like and are suitable for, for example, an image sensor having high light absorption characteristics in the near-infrared region.

What is claimed is:
1. A photoelectric conversion element comprising:
a first electrode;
a second electrode; and
a photoelectric conversion film which is placed between the first electrode and the second electrode and which contains a composition containing a naphthalocyanine derivative represented by the following formula and at least one of an organic p-type semiconductor or an organic n-type semiconductor mixed with the composition:

(1)

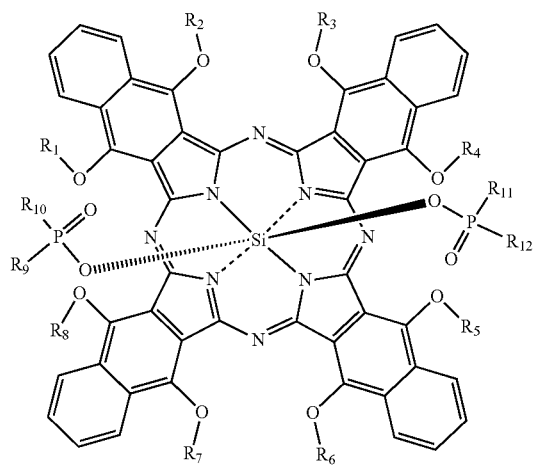

where $R_1$ to $R_8$ are independently an alkyl group, $R_9$ to $R_{12}$ are independently a naphthyl group, a biphenyl group, a phenanthryl group, an anthryl group, a terphenyl group, a pyrenyl group, a fluorenyl group, a perylenyl group, or a heteroaryl group, and at least one hydrogen atom in at least one selected from the group consisting of $R_9$, $R_{10}$, $R_{11}$, and $R_{12}$ is substituted by a nitro group, a cyano group, a fluoro group, a fluorine-containing group, a diazo group, a sulfonyl group, a carbonyl group, an isothiocyanate group, a thiocyanate group, a chloro group, a bromo group, or an iodo group.

2. The photoelectric conversion element according to claim 1, wherein $R_1$ to $R_8$ in Formula (1) are independently an alkyl group containing four or less carbon atoms.

3. The photoelectric conversion element according to claim 1, wherein at least one hydrogen atom in at least one selected from the group consisting of $R_9$, $R_{10}$, $R_{11}$, and $R_{12}$ in Formula (1) is substituted by a fluorine atom, a fluorine-containing group, or a cyano group.

4. The photoelectric conversion element according to claim 1, wherein
at least one hydrogen atom in at least one selected from the group consisting of $R_9$, $R_{10}$, $R_{11}$, and $R_{12}$ in Formula (1) is substituted by a fluorine atom, a trifluoromethyl group, or a cyano group.

5. The photoelectric conversion element according to claim 1, wherein a concentration of the composition in the photoelectric conversion film is greater than or equal to 5% by weight and less than or equal to 50% by weight.

6. The photoelectric conversion element according to claim 1, wherein an absorption maximum wavelength in an absorption spectrum of the photoelectric conversion film is longer than or equal to 908 nm.

7. An imaging device comprising:
a substrate; and
a pixel including a charge detection circuit attached to the substrate, a photoelectric converter placed above the substrate, and a charge storage node electrically connected to the charge detection circuit and the photoelectric converter, wherein the photoelectric converter includes the photoelectric conversion element according to claim 1.

8. A photoelectric conversion element comprising:
a first electrode;
a second electrode; and
a photoelectric conversion film which is placed between the first electrode and the second electrode and which contains a composition containing a naphthalocyanine derivative represented by the following formula and at least one of an organic p-type semiconductor or an organic n-type semiconductor mixed with the composition:

(1)

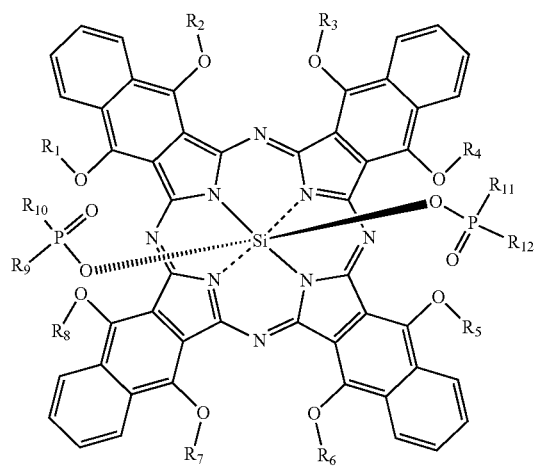

where $R_1$ to $R_8$ are independently an alkyl group, $R_9$ to $R_{12}$ are independently a phenyl group in which at least one hydrogen atom is substituted by a diazo group, a sulfonyl group, a carbonyl group, an isothiocyanate group, a thiocyanate group, a chloro group, an iodo group, a fluoromethyl group, a difluoromethyl group, a trifluoromethyl group, a fluoroethyl group, a difluoroethyl group, a trifluoroethyl group, a tetrafluoroethyl group, or a pentafluoroethyl group, or $R_9$ to $R_{12}$ are independently a fluorophenyl group or a difluorophenyl group.

9. The photoelectric conversion element according to claim 1, wherein the photoelectric conversion film has a bulk heterojunction structure.

10. The photoelectric conversion element according to claim 8, wherein $R_1$ to $R_8$ in Formula (1) are independently an alkyl group containing four or less carbon atoms.

11. The photoelectric conversion element according to claim 8, wherein
at least one hydrogen atom in at least one selected from the group consisting of $R_9$, $R_{10}$, $R_{11}$, and $R_{12}$ in Formula (1) is substituted by a trifluoromethyl group.

12. The photoelectric conversion element according to claim 8, wherein the naphthalocyanine derivative is any one of compounds represented by the following formulas:

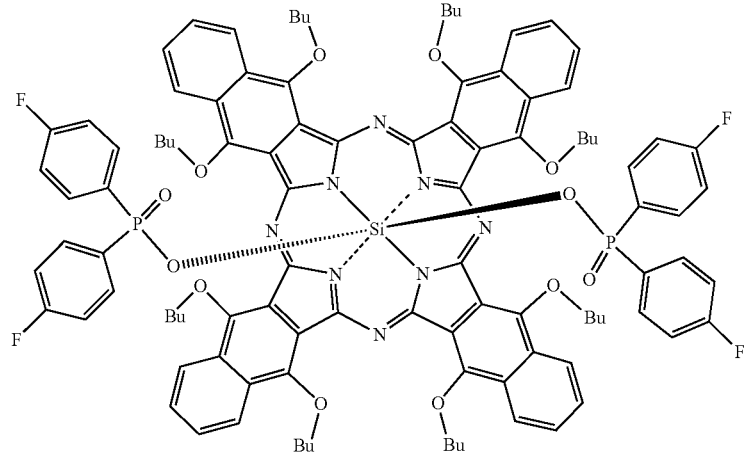
(3)
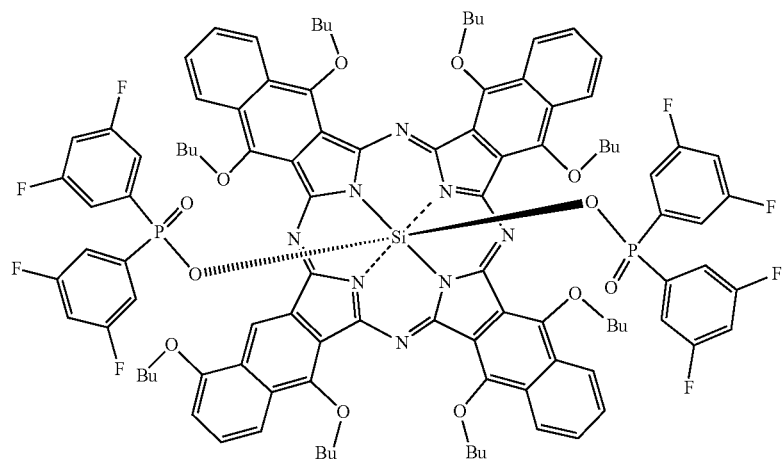
(4)

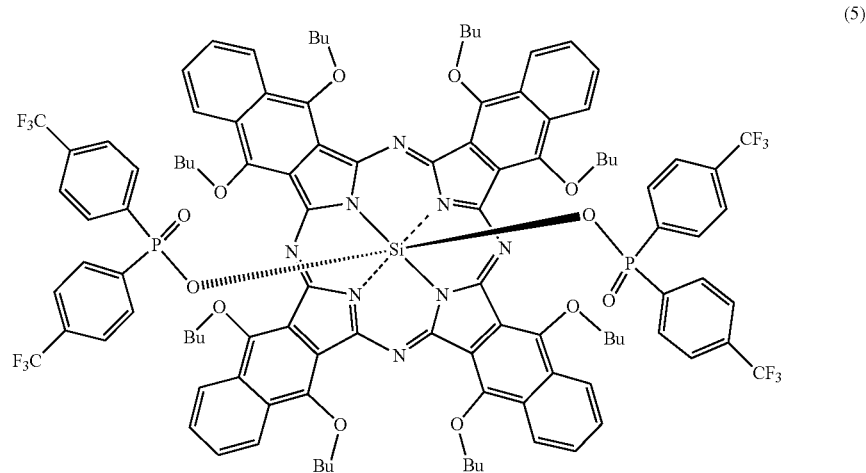
(5)
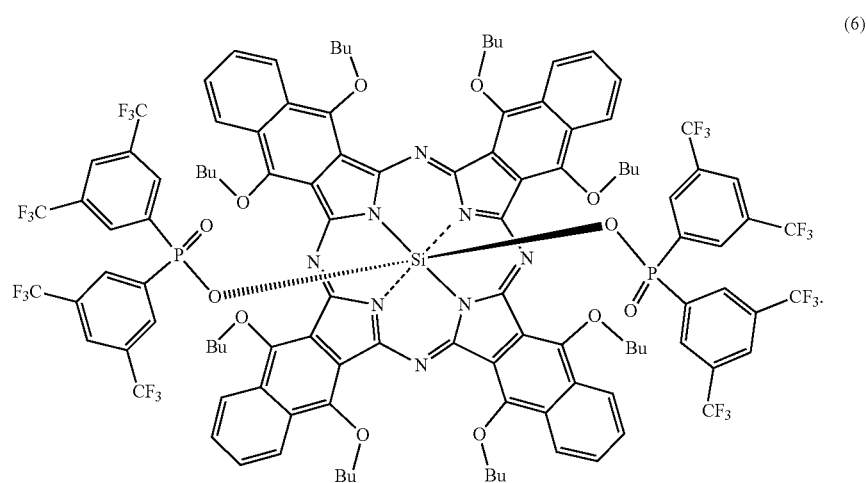
(6)

13. The photoelectric conversion element according to claim 8, wherein a concentration of the composition in the photoelectric conversion film is greater than or equal to 5% by weight and less than or equal to 50% by weight.

14. The photoelectric conversion element according to claim 8, wherein an absorption maximum wavelength in an absorption spectrum of the photoelectric conversion film is longer than or equal to 908 nm.

15. An imaging device comprising:
a substrate; and
a pixel including a charge detection circuit attached to the substrate, a photoelectric converter placed above the substrate, and a charge storage node electrically connected to the charge detection circuit and the photoelectric converter,
wherein the photoelectric converter includes the photoelectric conversion element according to claim 8.

16. The photoelectric conversion element according to claim 8, wherein the photoelectric conversion film has a bulk heterojunction structure.

* * * * *